US012540350B2

(12) United States Patent
Previte et al.

(10) Patent No.: US 12,540,350 B2
(45) Date of Patent: Feb. 3, 2026

(54) SPATIALLY RESOLVED SURFACE CAPTURE OF NUCLEIC ACIDS

(71) Applicant: Element Biosciences, Inc., San Diego, CA (US)

(72) Inventors: Michael Previte, San Diego, CA (US); Shawn Levy, San Diego, CA (US)

(73) Assignee: Element Biosciences, Inc., San Diego, CA (US)

( * ) Notice: Subject to any disclaimer, the term of this patent is extended or adjusted under 35 U.S.C. 154(b) by 0 days.

(21) Appl. No.: 18/450,200

(22) Filed: Aug. 15, 2023

(65) Prior Publication Data

US 2024/0052398 A1 Feb. 15, 2024

Related U.S. Application Data

(60) Provisional application No. 63/398,183, filed on Aug. 15, 2022.

(51) Int. Cl.
*C12Q 1/6806* (2018.01)
*C12Q 1/6844* (2018.01)
*C12Q 1/6874* (2018.01)

(52) U.S. Cl.
CPC ......... *C12Q 1/6806* (2013.01); *C12Q 1/6844* (2013.01); *C12Q 1/6874* (2013.01)

(58) Field of Classification Search
CPC .................... C12Q 1/6806; C12Q 1/6844
See application file for complete search history.

(56) References Cited

U.S. PATENT DOCUMENTS

| 3,950,649 A | 4/1976 | Yonekubo |
| 4,222,743 A | 9/1980 | Wang |
| 5,184,021 A | 2/1993 | Smith |

(Continued)

FOREIGN PATENT DOCUMENTS

| CN | 117025838 A | 11/2023 |
| EP | 1907573 B1 | 1/2010 |

(Continued)

OTHER PUBLICATIONS

Macosko et al. Highly Parallel Genome-wide Expression Profiling of Individual Cells Using Nanoliter Droplets. Cell. May 21, 2015;161(5):1202-1214. doi: 10.1016/j.cell.2015.05.002. PMID: 26000488; PMCID: PMC4481139 (Year: 2015).*

(Continued)

*Primary Examiner* — Aaron A Priest
*Assistant Examiner* — Tian Yu
(74) *Attorney, Agent, or Firm* — Fenwick & West LLP; Heidi A. Erlacher; Jessica D. Cande

(57) ABSTRACT

The present disclosure provides compositions, apparatuses and methods for capturing on a support nucleic acids from cellular samples, preparing library molecules on the support, amplifying the library molecules on the support to generate nucleic acid template molecules, and analyzing the immobilized nucleic acid template molecules including detecting and/or sequencing the immobilized nucleic acid template molecules. The immobilized nucleic acid template molecules correspond to the nucleic acids from the cellular samples. The immobilized nucleic acid template molecules are spatially located on the support at positions that correspond to the spatial location of the nucleic acids from the cellular sample.

20 Claims, 21 Drawing Sheets

Specification includes a Sequence Listing.

(56) References Cited

U.S. PATENT DOCUMENTS

| | | |
|---|---|---|
| 5,422,712 A | 6/1995 | Ogino |
| 5,512,131 A | 4/1996 | Kumar et al. |
| 5,558,991 A | 9/1996 | Trainor |
| 5,695,936 A | 12/1997 | Mandrand et al. |
| 5,985,556 A | 11/1999 | Kambara et al. |
| 6,087,133 A | 7/2000 | Dattagupta et al. |
| 6,284,497 B1 | 9/2001 | Sabanayagam et al. |
| 6,287,766 B1 | 9/2001 | Nolan et al. |
| 6,440,748 B1 | 8/2002 | Katerkamp et al. |
| 6,482,590 B1 | 11/2002 | Ullman et al. |
| 6,548,607 B2 | 4/2003 | Halverson et al. |
| 6,664,079 B2 | 12/2003 | Ju et al. |
| 6,818,425 B2 | 11/2004 | Hjörleifsdottir et al. |
| 6,829,051 B2 | 12/2004 | Abe et al. |
| 6,833,246 B2 | 12/2004 | Balasubramanian |
| 7,030,383 B2 | 4/2006 | Babayoff et al. |
| 7,169,560 B2 | 1/2007 | Lapidus et al. |
| 7,170,050 B2 | 1/2007 | Turner et al. |
| 7,211,390 B2 | 5/2007 | Rothberg et al. |
| 7,244,559 B2 | 7/2007 | Rothberg et al. |
| 7,264,929 B2 | 9/2007 | Rothberg et al. |
| 7,264,934 B2 | 9/2007 | Fuller |
| 7,302,146 B2 | 11/2007 | Turner et al. |
| 7,405,281 B2 | 7/2008 | Xu et al. |
| 7,416,844 B2 | 8/2008 | Korlach et al. |
| 7,566,537 B2 | 7/2009 | Balasubramanian et al. |
| 7,709,197 B2 | 5/2010 | Drmanac |
| 7,754,429 B2 | 7/2010 | Rigatti et al. |
| 7,755,841 B2 | 7/2010 | Christenson et al. |
| 7,767,400 B2 | 8/2010 | Harris |
| 7,897,344 B2 | 3/2011 | Dahl et al. |
| 7,910,302 B2 | 3/2011 | Drmanac et al. |
| 7,910,354 B2 | 3/2011 | Drmanac et al. |
| 7,960,116 B2 | 6/2011 | Eid et al. |
| 7,960,120 B2 | 6/2011 | Rigatti et al. |
| 7,968,702 B2 | 6/2011 | Wegener et al. |
| 8,039,817 B2 | 10/2011 | Feng et al. |
| 8,120,002 B2 | 2/2012 | Van Dijk et al. |
| 8,133,672 B2 | 3/2012 | Bjornson et al. |
| 8,143,599 B2 | 3/2012 | Feng et al. |
| 8,175,452 B1 | 5/2012 | Staker et al. |
| 8,236,505 B2 | 8/2012 | Rigatti et al. |
| 8,242,463 B2 | 8/2012 | Feng et al. |
| 8,252,910 B2 | 8/2012 | Korlach et al. |
| 8,257,954 B2 | 9/2012 | Clark et al. |
| 8,278,630 B1 | 10/2012 | Feng et al. |
| 8,367,813 B2 | 2/2013 | Korlach |
| 8,388,982 B2 | 3/2013 | Kong et al. |
| 8,399,196 B2 | 3/2013 | Hoser |
| 8,405,048 B2 | 3/2013 | Hayashi |
| 8,415,099 B2 | 4/2013 | Drmanac et al. |
| 8,431,348 B2 | 4/2013 | Rigatti et al. |
| 8,481,258 B2 | 7/2013 | Church et al. |
| 8,481,264 B2 | 7/2013 | Bjornson et al. |
| 8,518,640 B2 | 8/2013 | Drmanac et al. |
| 8,530,164 B2 | 9/2013 | Patel et al. |
| 8,546,772 B2 | 10/2013 | Feng et al. |
| 8,551,702 B2 | 10/2013 | Drmanac et al. |
| 8,580,539 B2 | 11/2013 | Korlach |
| 8,586,947 B1 | 11/2013 | Feng et al. |
| 8,592,148 B2 | 11/2013 | Williams et al. |
| 8,592,150 B2 | 11/2013 | Drmanac et al. |
| 8,617,811 B2 | 12/2013 | Drmanac |
| 8,632,975 B2 | 1/2014 | Vander Horn et al. |
| 8,637,650 B2 | 1/2014 | Cherkasov et al. |
| 8,658,365 B2 | 2/2014 | Bjornson et al. |
| 8,660,421 B2 | 2/2014 | Staker et al. |
| 8,698,102 B2 | 4/2014 | Feng et al. |
| 8,703,461 B2 | 4/2014 | Peris et al. |
| 8,715,932 B2 | 5/2014 | Su et al. |
| 8,741,566 B2 | 6/2014 | Winther et al. |
| 8,765,379 B2 | 7/2014 | Drmanac |
| 8,835,358 B2 | 9/2014 | Fodor et al. |
| 8,906,612 B2 | 12/2014 | Shen et al. |
| 8,927,212 B2 | 1/2015 | Kong et al. |
| 8,951,731 B2 | 2/2015 | Drmanac et al. |
| 9,023,769 B2 | 5/2015 | Drmanac et al. |
| 9,029,103 B2 | 5/2015 | Rigatti et al. |
| 9,062,091 B2 | 6/2015 | Bjornson et al. |
| 9,068,220 B2 | 6/2015 | Feng et al. |
| 9,200,311 B2 | 12/2015 | Otto et al. |
| 9,222,132 B2 | 12/2015 | Drmanac |
| 9,228,228 B2 | 1/2016 | Drmanac et al. |
| 9,238,834 B2 | 1/2016 | Drmanac et al. |
| 9,255,258 B2 | 2/2016 | Vander Horn et al. |
| 9,267,172 B2 | 2/2016 | Drmanac et al. |
| 9,267,173 B2 | 2/2016 | Rigatti et al. |
| 9,273,349 B2 | 3/2016 | Nguyen et al. |
| 9,279,154 B2 | 3/2016 | Previte et al. |
| 9,290,808 B2 | 3/2016 | Fodor et al. |
| 9,290,809 B2 | 3/2016 | Fodor et al. |
| 9,315,857 B2 | 4/2016 | Fu et al. |
| 9,328,382 B2 | 5/2016 | Drmanac et al. |
| 9,334,490 B2 | 5/2016 | Drmanac |
| 9,365,898 B2 | 6/2016 | Feng et al. |
| 9,399,767 B2 | 7/2016 | Peris et al. |
| 9,476,054 B2 | 10/2016 | Drmanac et al. |
| 9,546,398 B2 | 1/2017 | Peter et al. |
| 9,567,645 B2 | 2/2017 | Fan et al. |
| 9,567,646 B2 | 2/2017 | Fan et al. |
| 9,582,877 B2 | 2/2017 | Fu et al. |
| 9,593,315 B2 | 3/2017 | Peris et al. |
| 9,598,736 B2 | 3/2017 | Fan et al. |
| 9,605,310 B2 | 3/2017 | Balasubramanian et al. |
| 9,624,489 B2 | 4/2017 | Sabot et al. |
| 9,637,782 B2 | 5/2017 | Shen et al. |
| 9,637,784 B2 | 5/2017 | Drmanac |
| 9,637,785 B2 | 5/2017 | Drmanac |
| 9,637,799 B2 | 5/2017 | Fan et al. |
| 9,650,673 B2 | 5/2017 | Drmanac et al. |
| 9,663,822 B2 | 5/2017 | Luo et al. |
| 9,708,649 B2 | 7/2017 | Saito et al. |
| 9,727,810 B2 | 8/2017 | Fodor et al. |
| 9,765,310 B2 | 9/2017 | Vander Horn et al. |
| 9,816,137 B2 | 11/2017 | Fodor et al. |
| 9,822,410 B2 | 11/2017 | McCaffrey et al. |
| 9,845,502 B2 | 12/2017 | Fodor et al. |
| 9,905,005 B2 | 2/2018 | Fu et al. |
| 9,932,631 B2 | 4/2018 | Dambacher et al. |
| 9,944,984 B2 | 4/2018 | Drmanac et al. |
| 9,951,385 B1 | 4/2018 | Vijayan et al. |
| 9,957,291 B2 | 5/2018 | Sebo et al. |
| 9,994,541 B2 | 6/2018 | Batthyany et al. |
| 10,002,316 B2 | 6/2018 | Fodor et al. |
| 10,017,809 B2 | 7/2018 | Patel |
| 10,036,059 B2 | 7/2018 | Zhang et al. |
| 10,047,394 B2 | 8/2018 | Fodor et al. |
| 10,059,991 B2 | 8/2018 | Fodor et al. |
| 10,077,470 B2 | 9/2018 | Vijayan et al. |
| 10,100,350 B2 | 10/2018 | Breslauer et al. |
| 10,125,392 B2 | 11/2018 | Drmanac |
| 10,131,958 B1 | 11/2018 | Fan et al. |
| 10,151,003 B2 | 12/2018 | Fan et al. |
| 10,202,641 B2 | 2/2019 | Shum |
| 10,221,452 B2 | 3/2019 | Rigatti et al. |
| 10,227,647 B2 | 3/2019 | Ke et al. |
| 10,246,744 B2 | 4/2019 | Vijayan et al. |
| 10,253,352 B2 | 4/2019 | Nguyen et al. |
| 10,287,631 B2 | 5/2019 | Salk et al. |
| 10,294,514 B2 | 5/2019 | Iyidogan et al. |
| 10,300,452 B2 | 5/2019 | Sun et al. |
| 10,301,622 B2 | 5/2019 | Mirkin et al. |
| 10,301,677 B2 | 5/2019 | Shum et al. |
| 10,309,879 B2 | 6/2019 | Chen et al. |
| 10,316,357 B2 | 6/2019 | Makarov et al. |
| 10,329,613 B2 | 6/2019 | Rigatti et al. |
| 10,336,991 B2 | 7/2019 | Peris et al. |
| 10,344,329 B2 | 7/2019 | Hindson et al. |
| 10,351,909 B2 | 7/2019 | Drmanac et al. |
| 10,400,272 B1 | 9/2019 | Middleton et al. |
| 10,400,275 B2 | 9/2019 | Aurich-Costa |
| 10,415,029 B2 | 9/2019 | Dambacher et al. |
| 10,428,378 B2 | 10/2019 | Iyidogan et al. |
| 10,443,098 B2 | 10/2019 | Vijayan et al. |

(56) References Cited

U.S. PATENT DOCUMENTS

| | | |
|---|---|---|
| 10,494,662 B2 | 12/2019 | Church et al. |
| 10,501,796 B2 | 12/2019 | Buermann et al. |
| 10,519,496 B2 | 12/2019 | Balasubramanian et al. |
| 10,584,379 B2 | 3/2020 | Vijayan et al. |
| 10,590,464 B2 | 3/2020 | Boutell et al. |
| 10,597,643 B2 | 3/2020 | Iyidogan et al. |
| 10,655,176 B2 | 5/2020 | Stromberg et al. |
| 10,669,299 B2 | 6/2020 | Sebo et al. |
| 10,689,699 B2 | 6/2020 | Salk et al. |
| 10,704,094 B1 | 7/2020 | Arslan et al. |
| 10,731,141 B2 | 8/2020 | Iyidogan |
| 10,752,951 B2 | 8/2020 | Salk et al. |
| 10,760,127 B2 | 9/2020 | Salk et al. |
| 10,768,173 B1 | 9/2020 | Arslan et al. |
| 10,781,483 B2 | 9/2020 | Sebo et al. |
| 10,787,573 B2 | 9/2020 | Zheng et al. |
| 10,872,678 B1 | 12/2020 | Fackenthal et al. |
| 10,876,148 B2 | 12/2020 | Zhou et al. |
| 10,919,033 B2 | 2/2021 | Ren et al. |
| 10,961,566 B2 | 3/2021 | Chee |
| 10,968,482 B2 | 4/2021 | Zhong et al. |
| 10,982,280 B2 | 4/2021 | Arslan et al. |
| 11,053,540 B1 | 7/2021 | Chen et al. |
| 11,060,138 B1 | 7/2021 | Chen et al. |
| 11,118,214 B2 | 9/2021 | Matthiesen et al. |
| 11,118,220 B2 | 9/2021 | Daugharthy et al. |
| 11,118,225 B2 | 9/2021 | Salk et al. |
| 11,124,842 B2 | 9/2021 | Bramlett et al. |
| 11,130,996 B2 | 9/2021 | Salk et al. |
| 11,174,509 B2 | 11/2021 | Link et al. |
| 11,180,749 B2 | 11/2021 | Dambacher et al. |
| 11,198,121 B1 | 12/2021 | Guo et al. |
| 11,200,446 B1 | 12/2021 | Zhou et al. |
| 11,220,707 B1 | 1/2022 | Arslan et al. |
| 11,236,388 B1 | 2/2022 | Arslan et al. |
| 11,255,847 B2 | 2/2022 | Schnall-Levin |
| 11,261,489 B2 | 3/2022 | Chen et al. |
| 11,287,422 B2 | 3/2022 | Previte et al. |
| 11,339,433 B2 | 5/2022 | Chen et al. |
| 11,365,444 B2 | 6/2022 | Chen et al. |
| 11,408,032 B2 | 8/2022 | Chen et al. |
| 11,426,732 B2 | 8/2022 | Guo et al. |
| 11,427,855 B1 | 8/2022 | Arslan et al. |
| 11,459,608 B2 | 10/2022 | Chen et al. |
| 11,535,892 B1 | 12/2022 | Arslan et al. |
| 11,542,554 B2 | 1/2023 | Daugharthy et al. |
| 11,686,681 B2 | 6/2023 | Trintchouk et al. |
| 11,859,241 B2 | 1/2024 | Arslan et al. |
| 11,891,651 B2 | 2/2024 | Arslan et al. |
| 12,241,891 B2 | 3/2025 | Previte et al. |
| 12,297,487 B2 | 5/2025 | Chee |
| 12,404,544 B2 | 9/2025 | Tentori et al. |
| 2001/0031483 A1 | 10/2001 | Sorge et al. |
| 2002/0030811 A1 | 3/2002 | Schindler |
| 2002/0065609 A1 | 5/2002 | Ashby |
| 2002/0119455 A1 | 8/2002 | Chan |
| 2002/0139936 A1 | 10/2002 | Dumas |
| 2003/0152490 A1 | 8/2003 | Trulson et al. |
| 2005/0064435 A1 | 3/2005 | Su et al. |
| 2006/0024681 A1 | 2/2006 | Smith et al. |
| 2006/0286570 A1 | 12/2006 | Rowlen et al. |
| 2006/0292611 A1 | 12/2006 | Berka et al. |
| 2007/0009954 A1 | 1/2007 | Wang et al. |
| 2007/0031829 A1 | 2/2007 | Yasuno et al. |
| 2007/0042400 A1 | 2/2007 | Choi et al. |
| 2007/0042419 A1 | 2/2007 | Barany et al. |
| 2008/0160580 A1 | 7/2008 | Adessi et al. |
| 2008/0219888 A1 | 9/2008 | Lawson et al. |
| 2009/0186343 A1 | 7/2009 | Wang et al. |
| 2009/0247414 A1 | 10/2009 | Obradovic et al. |
| 2009/0286691 A1 | 11/2009 | Kim et al. |
| 2010/0093992 A1 | 4/2010 | Cherkasov et al. |
| 2010/0137143 A1 | 6/2010 | Rothberg et al. |
| 2010/0233696 A1 | 9/2010 | Joseph et al. |
| 2010/0311144 A1 | 12/2010 | Peris et al. |
| 2010/0330570 A1 | 12/2010 | Vander Horn et al. |
| 2011/0039259 A1 | 2/2011 | Ju et al. |
| 2011/0111975 A1 | 5/2011 | Schneider et al. |
| 2011/0223601 A1 | 9/2011 | Rigatti et al. |
| 2011/0301044 A1 | 12/2011 | Feng et al. |
| 2012/0014977 A1 | 1/2012 | Furihata et al. |
| 2012/0156728 A1 | 6/2012 | Li et al. |
| 2012/0165219 A1 | 6/2012 | Van Der Zaag et al. |
| 2012/0231972 A1 | 9/2012 | Golyshin et al. |
| 2012/0252012 A1 | 10/2012 | Armougom et al. |
| 2012/0253689 A1 | 10/2012 | Rogan |
| 2012/0322666 A1 | 12/2012 | Pham et al. |
| 2013/0012399 A1 | 1/2013 | Myers et al. |
| 2013/0165350 A1 | 6/2013 | Kuimelis et al. |
| 2013/0171631 A1 | 7/2013 | Becker et al. |
| 2013/0225623 A1 | 8/2013 | Buxbaum et al. |
| 2014/0113839 A1 | 4/2014 | Wu et al. |
| 2014/0206550 A1 | 7/2014 | Bjornson et al. |
| 2014/0243242 A1 | 8/2014 | Nicol et al. |
| 2015/0362458 A1 | 12/2015 | Yanagawa et al. |
| 2016/0083786 A1 | 3/2016 | Liu et al. |
| 2017/0145495 A1 | 5/2017 | Sebo et al. |
| 2017/0145496 A1 | 5/2017 | Sebo et al. |
| 2017/0159136 A1 | 6/2017 | Church et al. |
| 2017/0189444 A1 | 7/2017 | Ismagilov et al. |
| 2017/0191125 A1 | 7/2017 | Vijayan et al. |
| 2017/0362649 A1 | 12/2017 | Lieberman-Aiden et al. |
| 2017/0369857 A1 | 12/2017 | Vander Horn et al. |
| 2018/0023108 A1 | 1/2018 | Chen et al. |
| 2018/0080073 A1 | 3/2018 | Vijayan et al. |
| 2018/0105871 A1 | 4/2018 | Korfhage et al. |
| 2018/0187245 A1 | 7/2018 | Dambacher et al. |
| 2018/0195099 A1 | 7/2018 | Kranz et al. |
| 2018/0208983 A1 | 7/2018 | Dambacher et al. |
| 2018/0237847 A1 | 8/2018 | Culler et al. |
| 2018/0251825 A1 | 9/2018 | Stoeckius et al. |
| 2018/0280975 A1 | 10/2018 | Kilcoin et al. |
| 2018/0346507 A1 | 12/2018 | Sebo et al. |
| 2018/0360974 A1 | 12/2018 | Kwiatkowski et al. |
| 2019/0048404 A1 | 2/2019 | Dambacher |
| 2019/0119740 A1 | 4/2019 | Ahn et al. |
| 2019/0119742 A1 | 4/2019 | Zhang et al. |
| 2019/0241945 A1 | 8/2019 | Malyshev et al. |
| 2019/0292594 A1 | 9/2019 | Rigatti et al. |
| 2019/0338352 A1 | 11/2019 | Nemiroski et al. |
| 2019/0367974 A1 | 12/2019 | Fleischer et al. |
| 2020/0002746 A1 | 1/2020 | Mellor et al. |
| 2020/0010885 A1 | 1/2020 | Malyshev et al. |
| 2020/0032317 A1 | 1/2020 | Rohrman et al. |
| 2020/0087637 A1 | 3/2020 | Iyidogan |
| 2020/0149095 A1 | 5/2020 | Arslan et al. |
| 2020/0179921 A1 | 6/2020 | Arslan et al. |
| 2020/0182866 A1 | 6/2020 | Arslan et al. |
| 2020/0190578 A1 | 6/2020 | Boutell et al. |
| 2020/0216899 A1 | 7/2020 | Arslan et al. |
| 2020/0224244 A1 | 7/2020 | Nilsson et al. |
| 2020/0248258 A1 | 8/2020 | Arslan et al. |
| 2020/0347443 A1 | 11/2020 | Arslan et al. |
| 2020/0370113 A1 | 11/2020 | Kellinger et al. |
| 2021/0040534 A1 | 2/2021 | Zhou et al. |
| 2021/0072234 A1 | 3/2021 | Arslan et al. |
| 2021/0121882 A1 | 4/2021 | Guo et al. |
| 2021/0123098 A1 | 4/2021 | Previte et al. |
| 2021/0123911 A1 | 4/2021 | Arslan et al. |
| 2021/0139884 A1 | 5/2021 | Kellinger et al. |
| 2021/0139981 A1 | 5/2021 | Arslan et al. |
| 2021/0189460 A1 | 6/2021 | Hosono et al. |
| 2021/0189483 A1 | 6/2021 | Drmanac et al. |
| 2021/0223161 A1 | 7/2021 | Chen et al. |
| 2021/0247389 A1 | 8/2021 | Arslan et al. |
| 2021/0269793 A1 | 9/2021 | Kellinger et al. |
| 2021/0318294 A1 | 10/2021 | Previte et al. |
| 2021/0318295 A1 | 10/2021 | Arslan et al. |
| 2021/0332416 A1 | 10/2021 | Chen et al. |
| 2021/0332430 A1 | 10/2021 | Arslan et al. |
| 2021/0333210 A1 | 10/2021 | Chen et al. |
| 2021/0333211 A1 | 10/2021 | Chen et al. |
| 2021/0373000 A1 | 12/2021 | Arslan et al. |
| 2021/0387184 A1 | 12/2021 | Guo et al. |

(56) References Cited

U.S. PATENT DOCUMENTS

| | | |
|---|---|---|
| 2022/0170919 A1 | 6/2022 | Previte et al. |
| 2022/0290216 A1 | 9/2022 | Middleton et al. |
| 2022/0403445 A1 | 12/2022 | Arslan et al. |
| 2022/0403463 A1 | 12/2022 | Arslan et al. |
| 2023/0038526 A1 | 2/2023 | Arslan et al. |
| 2023/0193354 A1 | 6/2023 | Arslan et al. |
| 2023/0203564 A1 | 6/2023 | Arslan et al. |
| 2023/0220450 A1 | 7/2023 | Akahori et al. |
| 2023/0295692 A1 | 9/2023 | Berti et al. |
| 2023/0323450 A1 | 10/2023 | Arslan et al. |
| 2024/0084380 A1 | 3/2024 | Arslan et al. |
| 2024/0240249 A1 | 7/2024 | Zheng et al. |
| 2025/0027144 A1 | 1/2025 | Arslan et al. |
| 2025/0034628 A1 | 1/2025 | Arslan et al. |
| 2025/0146068 A1 | 5/2025 | Liu et al. |
| 2025/0172547 A1 | 5/2025 | Previte et al. |

FOREIGN PATENT DOCUMENTS

| | | | |
|---|---|---|---|
| EP | 3947731 A1 | 2/2022 | |
| JP | 4347049 B2 | 10/2009 | |
| JP | 2017516099 A | 6/2017 | |
| JP | 2019501635 A | 1/2019 | |
| WO | WO-9001069 A1 | 2/1990 | |
| WO | WO 93/24658 A1 | 12/1993 | |
| WO | WO-9844151 A1 | 10/1998 | |
| WO | WO-0018957 A1 | 4/2000 | |
| WO | WO-0075374 A1 | 12/2000 | |
| WO | WO-2004070005 A2 | 8/2004 | |
| WO | WO-2005111240 A2 | 11/2005 | |
| WO | WO-2006065266 A2 | 6/2006 | |
| WO | WO-2006084132 A2 | 8/2006 | |
| WO | WO-2007010252 A1 | 1/2007 | |
| WO | WO-2007010263 A2 | 1/2007 | |
| WO | WO-2007061425 A1 | 5/2007 | |
| WO | WO-2007091077 A1 | 8/2007 | |
| WO | WO-2008151127 A1 | 12/2008 | |
| WO | WO-2009073201 A2 | 6/2009 | |
| WO | WO-2010016937 A2 | 2/2010 | |
| WO | WO-2012027625 A2 | 3/2012 | |
| WO | WO-2013123258 A1 | 8/2013 | |
| WO | WO-2015021079 A1 | 2/2015 | |
| WO | WO-2015085268 A1 | 6/2015 | |
| WO | WO 2016/190236 A1 | 12/2016 | |
| WO | WO-2017007774 A1 | 1/2017 | |
| WO | WO-2017014762 A1 | 1/2017 | |
| WO | WO-2017019456 A2 | 2/2017 | |
| WO | WO 2017/087975 A1 | 5/2017 | |
| WO | WO-2017117235 A1 | 7/2017 | |
| WO | WO-2019018366 A1 | 1/2019 | |
| WO | WO-2019241305 A1 | 12/2019 | |
| WO | WO-2020028194 A1 | 2/2020 | |
| WO | WO 2020/076979 A1 | 4/2020 | |
| WO | WO-2020076976 A1 | 4/2020 | |
| WO | WO-2020102594 A1 | 5/2020 | |
| WO | WO-2020102766 A2 | 5/2020 | |
| WO | WO-2020118255 A1 | 6/2020 | |
| WO | WO-2020123309 A1 | 6/2020 | |
| WO | WO-2020223695 A1 | 11/2020 | |
| WO | WO-2020242901 A1 | 12/2020 | |
| WO | WO-2020243017 A1 | 12/2020 | |
| WO | WO-2021061841 A1 * | 4/2021 | ........... C12Q 1/6874 |
| WO | WO-2021146597 A1 | 7/2021 | |
| WO | WO-2021168287 A1 | 8/2021 | |
| WO | WO-2021236792 A1 | 11/2021 | |
| WO | WO-2021252671 A2 | 12/2021 | |
| WO | WO-2022015600 A2 | 1/2022 | |
| WO | WO-2022026891 A1 | 2/2022 | |
| WO | WO-2022087150 A2 | 4/2022 | |
| WO | WO-2022094332 A1 | 5/2022 | |
| WO | WO-2022266470 A1 | 12/2022 | |
| WO | WO-2023004014 A1 | 1/2023 | |
| WO | WO 2023/096672 A1 | 6/2023 | |
| WO | WO 2023/159219 A2 | 8/2023 | |
| WO | WO-2023168444 A1 | 9/2023 | |
| WO | WO 2023/205707 A2 | 10/2023 | |
| WO | WO-2024040068 A1 | 2/2024 | |
| WO | WO-2024124008 A2 | 6/2024 | |
| WO | WO 2025/165512 A1 | 8/2025 | |
| WO | WO 2025/166157 A1 | 8/2025 | |

OTHER PUBLICATIONS

Mignardi et al. Fourth-generation sequencing in the cell and the clinic. Genome Med. Apr. 28, 2014;6(4):31. doi: 10.1186/gm548. PMID: 25031621; Pmcid: PMC4062057; cited as NPL # 038 in IDS filed Apr. 11, 2025 (Year: 2014).*

Zhu et al. Reverse transcriptase template switching: a SMART approach for full-length cDNA library construction. Biotechniques. Apr. 2001;30(4):892-7. doi: 10.2144/01304pf02. PMID: 11314272 (Year: 2001).*

Mignardi et al. Fourth-generation sequencing in the cell and the clinic. Genome Med. Apr. 28, 2014;6(4):31. doi: 10.1186/gm548. PMID: 25031621; Pmcid: PMC4062057; cited as NPL # 038 in IDS filed Apr. 11, 2025 (Year: 2014) (Year: 2014).*

Bentley, et al., "Accurate whole human genome sequencing using reversible terminator chemistry." Nature (2008); 456(7218): 53-59.

Bentley, Whole-genome re-sequencing, Current opinion in genetics & development, Dec. 2006, pp. 545-552.

Eschenmoser, A., "Chemical Etiology of Nucleic Acid Structure," Science, Jun. 25, 1999, 284:2118-2124.

Ferraro, M. & Gotor, V., "Biocatalytic Selective Modifications of Conventional Nucleosides, Carbocyclic Nucleosides, and C-Nucleosides," Chem. Rev., 2000, 100:4319-4347.

Jeong, L.S. et al., "Structure-Activity Relationships of β-D-(2S,5R)- and α-D-(2S,5S)-1,3-Oxathiolanyl Nucleosides as Potential Anti-HIV Agents," J. Med. Chem., 1993, 36:2627-2638.

Ke, R., et al., "In situ sequencing for RNA analysis in preserved tissue and cells," Nat Methods, (2013); 10(9):857-860.

Kim, H. O. et al., "1,3-Dioxolanylpurine Nucleosides (2R,4R) and (2R,4S) with Selective Anti-HIV-1 Activity in Human Lymphocytes," J. Med. Chem., 1993, 36:30-37.

Martinez, C. I. et al., "Acyclic Nucleoside Triphosphate Analogs as Terminators in Biocatalytic DNA Replication," Bioorganic & Medicinal Chemistry Letters, 1997, 7(23):3013-3016.

Martinez, C. I. et al., "An allylic/acyclic adenosine nucleoside triphosphate for termination of DNA synthesis by DNA template-dependent polymerases," Nucleic Acids Research, 1999, 27(5):1271-1274.

New England Biolabs Certificate of Analysis and Safety Data Sheet, Product Name: Bst DNA Polymerase, Large Fragment, Catalog No. M0275S, Lot No. 10059774, Version 5, Nov. 25, 2019, 12 pages.

New England Biolabs Certificate of Analysis and Safety Data Sheet, Product Name: Bsu DNA Polymerase, Large Fragment, Catalog No. M0330S, Lot No. 10079279, Version 5, Nov. 25, 2019, 11 pages.

New England Biolabs Certificate of Analysis and Safety Data Sheet, Product Name: CutSmart® Buffer, Catalog No. B7204S, Lot No. 10095450, Version 6, Nov. 25, 2019, 10 pages.

New England Biolabs Certificate of Analysis and Safety Data Sheet, Product Name: DNA Polymerase I (*E. coli*), Catalog No. M0209S, Lot No. 10077358, Version 5, Nov. 25, 2019, 10 pages.

New England Biolabs Certificate of Analysis and Safety Data Sheet, Product Name: EpiMark® Hot Start Taq DNA Polymerase, Catalog No. M0490S, Lot No. 10053523, Version 5, Nov. 25, 2019, 11 pages.

New England Biolabs Certificate of Analysis and Safety Data Sheet, Product Name: LongAmp® Taq DNA Polymerase, Catalog No. M0323S, Lot No. 10048011, Nov. 25, 2019, 10 pages.

New England Biolabs Certificate of Analysis and Safety Data Sheet, Product Name: OneTaq® DNA Polymerase, Catalog No. M0480S, Lot No. 10056671, Version 5, Nov. 25, 2019, 10 pages.

New England Biolabs Certificate of Analysis and Safety Data Sheet, Product Name: phi29 DNA Polymerase, Catalog No. M0269S, Lot No. 10065462, Version 5, Nov. 25, 2019, 10 pages.

New England Biolabs Certificate of Analysis and Safety Data Sheet, Product Name: Q5U ™ Hot Start High-Fidelity DNA Polymerase, Catalog No. M0515S, Lot No. 10048784, Version 2, Nov. 25, 2019, 11 pages.

(56) References Cited

OTHER PUBLICATIONS

New England Biolabs Certificate of Analysis and Safety Data Sheet, Product Name: T7 Exonuclease, Catalog No. M0263S, Lot No. 10045960, Version 5, Nov. 25, 2019, 10 pages.
New England Biolabs Certificate of Analysis and Safety Data Sheet, Product Name: Therminator ™ DNA Polymerase, Catalog No. M0261S, Lot No. 10026393, Version 5, Nov. 25, 2019, 11 pages.
New England Biolabs Certificate of Analysis and Safety Data Sheet, Product Name: Thermolabile USER® II Enzyme, Catalog No. M5508S, Lot No. 10066485, Version 2, Nov. 25, 2019, 11 pages.
Wang, F. et al., "TEQUILA-seq: a versatile and low-cost method for targeted long-read RNA sequencing," Nat Commun., (2023); 14(1):4760, pp. 1-15.
Anderson, J.P. et al.; Fluorescent Structural DNA Nanoballs Functionalized with Phosphate-Linked Nucleotide Triphosphates. Nano Letters 10(3):788-792 (2010).
Batra, V.K. et al.; Magnesium-induced assembly of a complete DNA polymerase catalytic complex. Structure 14(4):757-766 (2006).
Berki, T. et al.; Advanced Fluorescent Polymer Probes for the Site-Specific Labeling of Proteins in Live Cells Using the HaloTag Technology. ACS Omega, 4(7):12841-12847 (2019).
Chan, P., et al.; "Method for multiplex cellular detection of mRNAs using quantum dot fluorescent in situ hybridization," Nucleic Acids Res., (2005); 33(18):e161, 8 pages.
Chen, F., et al.; "Expansion Microscopy," Science, Jan. 30, 2015; vol. 347, Issue 6221:543-549.
Choi, Y., et al.; "In situ visualization of gene expression using polymer-coated quantum-dot-DNA conjugates," Small. (2009); 5(18):2085-2091.
Co-pending U.S. Appl. No. 18/544,085, inventor Sinan Arslan; et al., filed Dec. 18, 2023.
Dubber, M. & Frechet, J.M.; Solid Phase Synthesis and Multivalent Glycoconjugates on a DNA Synthesizer. Bioconjugate Chem., 14(1):239-246 (2003).
Duret, D. et al.; Labeling of native proteins with fluorescent RAFT polymer probes: Application to the detection of a cell surface protein using flow cytometry. Polym. Chem., 9(4):1857-1868 (2018).
Favier, A. et al.; Synthesis of N-acryloxysuccinimide copolymers by RAFT polymerization, as reactive building blocks with full control of composition and molecular weights. Polymer, 45(23):7821-7830 (2004).
Gabbatiss, J.; New form of DNA discovered inside living human cells. The Independent, [retrieved online May 8, 2024] URL: www.independent.co.uk/news/science/dna-new-discovered-human-cells-living-imotif-australia-research-double-helix-knot-a8318116.html, 6 pages (2018).
Gebeyehu, G. et al., 1987, Novel biotinylated nucleotide-analogs for labeling and colorimetric detection of DNA, Nucl Acids Res., 15(11):4513-4534.
Goransson, J. et al.: A single molecule array for digital targeted molecular analyses. Nucleic Acids Res. 37(1):e7, 9 pages (2009).
Heather, J.M. & Chain, B.; The Sequence of Sequencers: The History of Sequencing DNA. Genomics 107(1):1-8 (2016).
Illumina: Technology Spotlight: Illumina Sequencing (2010), [retrieved online May 8, 2024] URL: www.illumina.com/documents/products/techspotlights/techspotlight_sequencing.pdf, 5 pages.
Joyce, C.M. et al.; Fingers-closing and other rapid conformational changes in DNA polymerase I (Kienow fragment) and their role in nucleotide selectivity. Biochemistry 47(23):6103-6116 (2008).
Ju, J. et al. Four-Color DNA Sequencing by Synthesis Using Cleavable Fluorescent Nucleotide Reversible Terminators. PNAS USA 103(52):19635-19640 (2006).
Ju, J. et al.; Four-Color DNA Sequencing by Synthesis Using Cleavable Fluorescent Nucleotide Reversible Terminators. PNAS USA 103(52):19635-19640, supporting text, 25 pages (2006).
Kramer, R.H & Karpen, J.W.; Spanning binding sites on allosteric proteins with polymer-linked ligand dimers. Nature 395(6703):710-713 (1998).
Krishnamurthy, V.M. et al.; Dependence of effective molarity on linker length for an intramolecular protein-ligand system. J. Am. Chem. Soc., 129(5):1312-1320 (2007).
Lorenz, T.C.J; "Polymerase chain reaction: basic protocol plus troubleshooting and optimization strategies," Journal of Visualized Experiments 22:(63):e3998, 14 pages (2012).
Mardis, E. R., "Next Generation DNA Sequencing Methods," Annu. Rev. Genomics Hum. Genet. (2008); 9:387-402.
Pack, P. et al.; Tetravalent miniantibodies with high avidity assembling in *Escherichia coli*. J Mol Biol., 246(1):28-34 (1995).
Sah, R. et al.; Complete genome sequence of a 2019 novel coronavirus (SARS-CoV-2) strain isolated in Nepal. Microbial Resource Announcements; 9(11):e00169-20, 3 pages (2020).
Singer, B.; UV Spectral Characteristics and Acidic Dissociation Constants of 280 Alkyl Bases, Nucleosides, and Nucleotides. Practical Handbook of Biochemistry and Molecular Biology. pp. 255-261 (2010).
Terry, M.; 10 Best Genome Sequencing Companies by Revenue. List of the best genome sequencing companies by there[sic] revenue. (Original publication date: Apr. 18, 2019) BioSpace Online, pp. 1-4 [retrieved online May 8, 2024] URL: web.archive.org/web/20220518164731/https://www.biospace.com/article/top-10-gene-sequencing-companies-by-revenue/ (Nov. 2019).
Zhang, J.-H. et al.; Reconstruction of DNA sequencing by hybridization. Bioinformatics, (2003); 19(1):14-21.
Abrahamsson, S., et al.; "Fast multicolor 3D imaging using aberration-corrected multifocus microscopy," Nature Methods; 10(1):60-63 (2013); 6 pages.
Biggs, D.S.C.; "3D deconvolution microscopy," Current Protocols in Cytometry; Chapter 12(Suppl 52): Unit 12.19.1-20; 20 pages (2010).
Broxton, M., et al.; "Wave optics theory and 3-D deconvolution for the light field microscope," Stanford Computer Graphics Laboratory Technical Report; Opt Express.; 21(21):25418-25439 (2013); 22 pages.
Chen, X., et al.; "Efficient in situ barcode sequencing using padlock probe-based BaristaSeq," Nucleic Acids Research; 46(4):e22; pp. 1-10 (2018).
Denk, W., et al.; "Two-photon laser scanning fluorescence microscopy," Science; 248(4951):73-76 (1990).
Feldman, D., et al.; "Optical Pooled Screens in Human Cells," Cell; Oct. 17, 2019; 179(3):787-799 and Supplement; 31 pages (2019).
Gustafsson, M.G.L., et al.; "Three-dimensional resolution doubling in wide-field fluorescence microscopy by structured illumination," Biophysical Journal; 94(12):4957-4970 (2008).
Kudo, T., et al.; "Multiplexed, image-based pooled screens in primary cells and tissues with PerturbView," bioRxiv 2023.12.26.573143 pre-print, posted Dec. 26, 2023; Nat Biotechnol.; Oct. 7, 2024; 19 pages; doi: 10.1038/s41587-024-02391-0.
Lubeck, E., et al.; "Single-cell in situ RNA profiling by sequential hybridization," Nat Methods; 11(4):360-361 (2014).
Lubeck, E., et al.; "Single-cell systems biology by super-resolution imaging and combinatorial labeling," Nat Methods.; 9(7):743-748 (2012).
Mignardi, M., et al.; "Fourth-generation sequencing in the cell and the clinic," Genome Med.; 6(4):31; pp. 1-4 (2014).
Pitino, E., et al.; "STAMP: Single-Cell Transcriptomics Analysis and Multimodal Profiling through Imaging," bioRxiv pre-Print; Published Oct. 3, 2024 [retrieved online Mar. 27, 2025] URL: www.biorxiv.org/content/10.1101/2024.10.03.616013v1; 29 pages (2024).

* cited by examiner

Spacer:

Linkers:

11 atom Linker:

16 atom Linker:

23 atom Linker:

N3 Linker:

Linker 1:

Linker 2:

Linker 3:

Linker 4:

Linker 5:

Linker 6: 
Molecular Weight: 352.35

Linker 7: 
Molecular Weight: 449.42

Linker 8: 
Molecular Weight: 518.57

Linker 9: 
Molecular Weight: 615.64 dNTP-PA-NH₂:

dNTP-PA-11 Atom Linker-NH₂:

dNTP-PA-16 Atom Linker-NH₂:

dNTP-PA-23 Atom Linker-NH₂:

dNTP-PA-N3 Linker-NH₂:

dNTP-PA-Linker 1-NH₂:

dNTP-PA-Linker 2-NH₂:

dNTP-PA-Linker 3-NH₂:

dNTP-PA-Linker 4-NH₂:

dNTP-PA-N3 Linker-NH₂:

G-tetrad

SEQUENCE LISTING

```
Sequence total quantity: 10
SEQ ID NO: 1            moltype = DNA  length = 23
FEATURE                 Location/Qualifiers
source                  1..23
                        mol_type = other DNA
                        organism = synthetic construct
SEQUENCE: 1
agtcgtcgca gcctcacctg atc                                           23

SEQ ID NO: 2            moltype = DNA  length = 21
FEATURE                 Location/Qualifiers
source                  1..21
                        mol_type = other DNA
                        organism = synthetic construct
SEQUENCE: 2
```

```
tcgtatgccg tcttctgctt g                                                 21

SEQ ID NO: 3           moltype = DNA   length = 35
FEATURE                Location/Qualifiers
source                 1..35
                       mol_type = other DNA
                       organism = synthetic construct
SEQUENCE: 3
atgtcggaag gtgtgcaggc taccgcttgt caact                                  35

SEQ ID NO: 4           moltype = DNA   length = 34
FEATURE                Location/Qualifiers
source                 1..34
                       mol_type = other DNA
                       organism = synthetic construct
SEQUENCE: 4
agatcggaag agcacacgtc tgaactccag tcac                                   34

SEQ ID NO: 5           moltype = DNA   length = 34
FEATURE                Location/Qualifiers
source                 1..34
                       mol_type = other DNA
                       organism = synthetic construct
SEQUENCE: 5
ctgtctctta tacacatctc cgagcccacg agac                                   34

SEQ ID NO: 6           moltype = DNA   length = 35
FEATURE                Location/Qualifiers
source                 1..35
                       mol_type = other DNA
                       organism = synthetic construct
SEQUENCE: 6
cgtgctggat tggctcacca gacaccttcc gacat                                  35

SEQ ID NO: 7           moltype = DNA   length = 33
FEATURE                Location/Qualifiers
source                 1..33
                       mol_type = other DNA
                       organism = synthetic construct
SEQUENCE: 7
acactctttc cctacacgac gctcttccga tct                                    33

SEQ ID NO: 8           moltype = DNA   length = 33
FEATURE                Location/Qualifiers
source                 1..33
                       mol_type = other DNA
                       organism = synthetic construct
SEQUENCE: 8
tcgtcggcag cgtcagatgt gtataagaga cag                                    33

SEQ ID NO: 9           moltype = DNA   length = 25
FEATURE                Location/Qualifiers
source                 1..25
                       mol_type = other DNA
                       organism = synthetic construct
SEQUENCE: 9
catgtaatgc acgtactttc agggt                                             25

SEQ ID NO: 10          moltype = DNA   length = 20
FEATURE                Location/Qualifiers
source                 1..20
                       mol_type = other DNA
                       organism = synthetic construct
SEQUENCE: 10
aatgatacgg cgaccaccga                                                   20
```

SPATIALLY RESOLVED SURFACE CAPTURE OF NUCLEIC ACIDS

CROSS-REFERENCE TO RELATED APPLICATIONS

This application claims the benefit of and priority to U.S. Provisional Patent Application No. 63/398,183, filed Aug. 15, 2022, the contents of which are incorporated by reference herein in their entirety.

REFERENCE TO AN ELECTRONIC SEQUENCE LISTING

The contents of the electronic sequence listing (ELEM_014_001US_SeqList_ST26.xml; Size 9,927 bytes; and Date of Creation: Aug. 9, 2023) are herein incorporated by reference in their entireties.

TECHNICAL FIELD

The present disclosure provides compositions and methods for capturing nucleic acids from cellular samples on a support, preparing library molecules on the support, amplifying the library molecules on the support to generate nucleic acid template molecules, and analyzing the immobilized nucleic acid template molecules including detecting and/or sequencing the immobilized nucleic acid template molecules. The immobilized nucleic acid template molecules correspond to the nucleic acids from the cellular samples. The immobilized nucleic acid template molecules are spatially located on the support in an arrangement that is similar to the spatial location in the cellular sample.

BACKGROUND

Cells within a tissue of a subject have differences in cell morphology and/or function due to varied analyte levels (e.g., gene and/or protein expression) within the different cells. The specific position of a cell within a tissue (e.g., the cell's position relative to neighboring cells or the cell's position relative to the tissue microenvironment) can affect, e.g., the cell's morphology, differentiation, fate, viability, proliferation, behavior, and signaling and crosstalk with other cells in the tissue.

Spatial heterogeneity has been previously studied using techniques that only provide data for a small handful of analytes in the context of an intact tissue or a portion of a tissue, or provide a lot of analyte data for single cells, but fail to provide information regarding the position of the single cell in a parent biological sample (e.g., tissue sample).

Spatial analysis of an analyte within a biological sample may require determining the sequence of the analyte sequence or a complement thereof and the sequence of the spatial barcode or a complement thereof to identify the location of the analyte. The biological sample may be placed on a solid support to improve specificity and efficiency when being analyzed for identification or characterization of an analyte, such as DNA, RNA or other genetic material, within the sample. There exists a need for improved spatially resolved surface capture of nucleic acids on a support, and downstream assembly and sequencing techniques, which reduce the assembly, time and/or computational requirements necessary to obtain spatial sequence information. Provided herein are compositions, apparatuses and methods addressing this need.

SUMMARY

In one aspect the present disclosure provides a method for preparing spatially resolved nucleic acids, comprising: a) providing a support comprising (i) a low non-specific binding coating comprising at least one hydrophilic polymer, wherein the low non-specific binding coating has a water contact angle of no more than 45 degrees, and (ii) a plurality of immobilized surface capture primers covalently tethered to the low non-specific binding coating wherein each individual surface capture primer comprises a universal surface capture primer sequence (110), a universal binding site for a reverse sequencing primer (120), and an RNA capture sequence; b) positioning a cellular sample on the coated support under a condition suitable for the cellular sample to remain in a fixed position on the coated support, disrupting the cellular sample, releasing a plurality of RNA molecules of the cellular sample under a condition that is suitable for preserving spatial location information of the RNA molecules from the cellular sample, and collecting the plurality of RNA molecules on the plurality of immobilized surface capture primers of the support, under a condition suitable for hybridizing individual RNA molecules to individual immobilized surface capture primers to generate a plurality of capture primer-RNA duplexes, wherein each primer-RNA duplex comprises an immobilized surface capture primer hybridized to an RNA molecule; c) conducting a reverse transcription reaction on the coated support under a condition suitable for extending the 3' end of the immobilized surface capture primers and using the hybridized RNA as a template strand, under a condition suitable for generating a non-template polyC tail at the 3' end, thereby generating a plurality of first strand cDNA molecules with a non-template polyC tail at the 3' end', wherein the reverse transcription reaction comprises a plurality of template switching oligonucleotides, wherein each of the template switching oligonucleotides comprises a polyG region that is capable of hybridizing to the non-template polyC tail of the first strand cDNA molecules, a universal binding site for a forward sequencing primer (130), and a universal binding site for a surface pinning primer (140); d) conducting a primer extension reaction from the 3' terminal end of the non-template polyC tail of the plurality of first strand cDNA molecules and using the template switching oligonucleotide as a template strand, thereby generating a plurality of immobilized full length first strand cDNAs, wherein each full length first strand cDNA comprises a universal surface capture primer sequence (110); a universal binding site for a reverse sequencing primer (120); an RNA capture sequence; a cDNA insert region; a polyC tail region; a universal binding site for a forward sequencing primer (130); and a universal binding site for a surface pinning primer (140); e) removing the RNA molecule while retaining the plurality of immobilized full length first strand cDNA; f) contacting the plurality of retained immobilized full length first strand cDNAs with a plurality of single stranded circularization oligonucleotides under a condition suitable for hybridizing individual circularization oligonucleotides to an immobilized full length first strand cDNA, thereby forming a single stranded circular molecule with a gap, wherein individual single stranded circularization oligonucleotides comprise: (i) a sequence that is complementary to the universal binding site for a reverse sequencing primer (120), (ii) a sequence that is complementary to the universal surface capture primer sequence (110), (iii) a linker region, (iv) a sequence that is complementary to the universal binding site for a surface pinning primer (140), (v) and a sequence that is complementary to the universal binding site for a forward sequencing primer (130); g) conducting a polymerase-catalyzed extension reaction to fill in the gap, using the polyC tail region, the cDNA insert region and the RNA capture sequence of the immobilized full length first strand cDNA as a template strand, wherein the polymerase-catalyzed extension reaction forms a single stranded circularized molecule with a nick, and wherein the nick is closed by conducting an enzymatic ligation reaction to generate a single stranded covalently closed circular molecule which is hybridized to the immobilized full length first strand cDNA; h) conducting a rolling circle amplification reaction using the terminal 3' end of the immobilized full length first strand cDNA as an initiation site and the covalently closed circular molecule as a template strand, thereby generating a plurality of immobilized nucleic acid concatemers that are spatially resolved on the support; i) sequencing the plurality of individual immobilized nucleic acid concatemers, wherein the sequencing comprises at least a portion of the cDNA insert region of the individual nucleic acid concatemers, which correspond to the individual RNA molecules eluted from the cellular sample; and j) determining the location of individual nucleic acid concatemers on the coated support, which correspond to the spatial location of the individual RNA molecules eluted from the cellular sample.

In some embodiments, the cellular sample of step b) comprises a single cell, a plurality of cells, a tissue, an organ, an organism, or a sectioned cellular sample. In some embodiments, the cellular sample of step b) comprises a fresh sample, a frozen sample, a fresh frozen sample, or a formalin-fixed paraffin-embedded sample.

In some embodiments, the plurality of template switching oligonucleotides of step c) comprises chimeric DNA and/or RNA oligonucleotides.

In some embodiments, the linker region of the single stranded circularization oligonucleotides of step f) comprises at least one sample index sequence for multiplexing, at least one unique molecular index (UMI) sequence for molecular tagging and/or at least one universal binding site for a compaction oligonucleotide.

In some embodiments, the rolling circle amplification reaction of step h) is conducted in the presence of a plurality of compaction oligonucleotides, wherein the compaction oligonucleotides comprise single stranded oligonucleotides each having a first region at a first distal end that hybridizes to one portion of a concatemer molecule and a second region at the second distal end that hybridizes to a second portion of the same concatemer molecule, wherein the first portion of the concatemer molecule and the second portion of the concatemer molecule are brought in proximity, thereby causing compaction of the concatemer molecule to form a DNA nanoball.

In some embodiments, the sequencing of step i) comprises: a. contacting the plurality of concatemer molecules with a plurality of sequencing polymerases and a plurality of nucleic acid sequencing primers, wherein the contacting is conducted under a condition suitable to form a plurality of complexed sequencing polymerases, wherein each complexed sequencing polymerase comprises a sequencing polymerase bound to a nucleic acid duplex, and wherein the nucleic acid duplex comprises a portion of a concatemer molecule hybridized to the nucleic acid sequencing primer; b. contacting the plurality of complexed sequencing polymerases with a plurality of detectably labeled nucleotides comprising a blocking moiety at the 2' or 3' sugar position, wherein the contacting is conducted under a condition suitable for binding at least one nucleotide to at least one of the complexed sequencing polymerases, and wherein the condition is suitable for promoting polymerase-catalyzed nucleotide incorporation; c. incorporating a nucleotide into the 3' end of a sequencing primer of at least one complexed sequencing polymerase; d. detecting the incorporated nucleotide and identifying the nucleo-base of the incorporated nucleotide; e. removing the blocking moiety from the incorporated nucleotide; and f. repeating steps b. to e. at least once.

In some embodiments, the sequencing of step i) comprises: a. contacting the plurality of concatemer molecules with a plurality of sequencing polymerases and a plurality of nucleic acid sequencing primers, wherein the contacting is conducted under a condition suitable to form a plurality of complexed sequencing polymerases, wherein each complexed sequencing polymerase comprises a sequencing polymerase bound to a nucleic acid duplex, and wherein the nucleic acid duplex comprises a portion of a concatemer molecule hybridized to the nucleic acid sequencing primer; b. contacting the plurality of complexed sequencing polymerases with a plurality of nucleotides each comprising a detectable label attached to a phosphate moiety of the phosphate chain, wherein the contacting is conducted under a condition suitable for binding at least one nucleotide to at least one of the complexed sequencing polymerases, and wherein the condition is suitable for promoting polymerase-catalyzed nucleotide incorporation; c. incorporating a nucleotide into the 3' end of a sequencing primer of at least one complexed sequencing polymerase; d. detecting the incorporated nucleotide and identifying the nucleo-base of the incorporated nucleotide; and e. repeating steps b. to d. at least once.

In some embodiments, the sequencing of step i) comprises: a. contacting the plurality of concatemer molecules with a plurality of a first sequencing polymerase and a plurality of nucleic acid sequencing primers, wherein the contacting is conducted under a condition suitable to bind the plurality of first polymerases to the plurality of nucleic acid template molecules and the plurality of nucleic acid primers, thereby forming a plurality of first complexed polymerases, wherein each first complexed polymerase comprises a first polymerase bound to a nucleic acid duplex, wherein the nucleic acid duplex comprises a nucleic acid template molecule hybridized to a nucleic acid primer; b. contacting the plurality of first complexed polymerases with a plurality of detectably labeled multivalent molecules to form a plurality of multivalent-binding complexes, wherein individual detectably labeled multivalent molecules in the plurality comprise a core attached to multiple nucleotide arms, and wherein each nucleotide arm is attached to a nucleotide unit, wherein the contacting is conducted under a condition suitable for binding complementary nucleotide units of the multivalent molecules to at least two of the plurality of first complexed polymerases thereby forming a plurality of multivalent-binding complexes, and wherein the condition is suitable for inhibiting incorporation of the complementary nucleotide units into the primers of the plurality of multivalent-binding complexes; c. detecting the plurality of multivalent-binding complexes; and d. identifying the nucleo-base of the complementary nucleotide units in the plurality of multivalent-binding complexes, thereby determining the sequence of the nucleic acid template molecules.

In some embodiments, the sequencing of step i) comprises: a. dissociating the plurality of multivalent-binding complexes, by removing the plurality of first sequencing polymerases and their bound multivalent molecules, and retaining the plurality of nucleic acid duplexes; b. contacting the plurality of the retained nucleic acid duplexes of step e) with a plurality of second sequencing polymerases under a condition suitable for binding the plurality of second polymerases to the plurality of the retained nucleic acid duplexes, thereby forming a plurality of second complexed polymerases each comprising a second polymerase bound to a nucleic acid duplex; and c. contacting the plurality of second complexed polymerases with a plurality of nucleotides, wherein the contacting is conducted under a condition suitable for binding complementary nucleotides from the plurality of nucleotides to at least two of the second complexed polymerases, thereby forming a plurality of nucleotide-binding complexes, and wherein the condition is suitable for promoting nucleotide incorporation of the bound complementary nucleotides into the primers of the nucleotide-binding complexes.

In some embodiments, the method further comprises: d. detecting the complementary nucleotides which are incorporated into the primers of the nucleotide-complexed polymerases. In some embodiments, the method further comprises: d. detecting the complementary nucleotides which are incorporated into the primers of the nucleotide-complexed polymerases; and e. identifying the nucleo-bases of the complementary nucleotides which are incorporated into the primers of the nucleotide-complexed polymerases.

In some embodiments, the contacting the plurality of first complexed polymerases with the plurality of multivalent molecules of step b. is conducted in the presence of a non-catalytic divalent cation that inhibits polymerase-catalyzed nucleotide incorporation, wherein the non-catalytic divalent cation comprises strontium, barium or calcium.

In some embodiments, the individual multivalent molecules in the plurality of multivalent molecules comprise: (a) a core; and (b) a plurality of nucleotide arms which comprise: (i) a core attachment moiety, (ii) a spacer, (iii) a linker, and (iv) a nucleotide unit, wherein the core is attached to the plurality of nucleotide arms via their core attachment moiety, wherein the spacer is attached to the linker, and wherein the linker is attached to the nucleotide unit.

In some embodiments, the linker comprises an aliphatic chain having 2-6 subunits or an oligo ethylene glycol chain having 2-6 subunits.

In some embodiments, the plurality of nucleotide arms attached to a given core have the same type of nucleotide units, and wherein the types of nucleotide units comprise dATP, dGTP, dCTP, dTTP or dUTP.

In some embodiments, the plurality of multivalent molecules comprise one type of a multivalent molecule wherein each multivalent molecule in the plurality has the same type of nucleotide unit selected from the group consisting of dATP, dGTP, dCTP, dTTP and dUTP. In some embodiments, the plurality of multivalent molecules comprise a mixture of any combination of two or more types of multivalent molecules each type having nucleotide units selected from the group consisting of dATP, dGTP, dCTP, dTTP and dUTP.

In some embodiments, the method further comprises forming a plurality of binding complexes, comprising the steps of: a) binding a first nucleic acid sequencing primer, a first sequencing polymerase, and a first multivalent molecule to a first portion of a concatemer molecule, thereby forming a first binding complex, wherein a first nucleotide unit of the first multivalent molecule binds to the first polymerase; and b) binding a second nucleic acid sequencing primer, a second sequencing polymerase, and the first multivalent molecule to a second portion of the same concatemer molecule, thereby forming a second binding complex, wherein a second nucleotide unit of the first multivalent molecule binds to the second polymerase, wherein the first and the second binding complexes which include the same multivalent molecule forms an avidity complex.

In some embodiments, the method further comprises forming an avidity complex comprising the steps of: a) contacting the plurality of the first sequencing polymerase and the plurality of nucleic acid sequencing primers with different portions of a concatemer nucleic acid template molecule to form at least first complexed polymerase and a second complexed polymerase on the same concatemer molecule; and b) contacting a plurality of detectably labeled multivalent molecules to the at least first complexed polymerase and the second complexed polymerase on the same concatemer molecule, under conditions suitable to bind a single multivalent molecule from the plurality to the first complexed polymerase and the second complexed polymerase, wherein at least a first nucleotide unit of the single multivalent molecule is bound to the first complexed polymerase, which comprises a first primer hybridized to a first portion of the concatemer molecule thereby forming a first binding complex, and wherein at least a second nucleotide unit of the single multivalent molecule is bound to the second complexed polymerase which comprises a second primer hybridized to a second portion of the concatemer molecule, thereby forming a second binding complex, wherein the contacting is conducted under a condition suitable to inhibit polymerase-catalyzed incorporation of the bound first and second nucleotide units in the first and second binding complexes, and wherein the first and second binding complexes which are bound to the same multivalent molecule forms an avidity complex; c) detecting the first and second binding complexes on the same concatemer molecule; and d) identifying the first nucleotide unit in the first binding complex, thereby determining the sequence of the first portion of the concatemer molecule, and identifying the second nucleotide unit in the second binding complex thereby determining the sequence of the second portion of the concatemer molecule.

In some embodiments, the contacting the plurality of second complexed polymerases with the plurality of nucleotides of step c. is conducted in the presence of a catalytic divalent cation that promotes polymerase-catalyzed nucleotide incorporation, wherein the catalytic divalent cation comprises magnesium or manganese.

In some embodiments, the individual nucleotides in the plurality of nucleotides in step c. comprise an aromatic base, a five-carbon sugar, and 1-10 phosphate groups. In some embodiments, the plurality of nucleotides of step c. comprises one type of nucleotide selected from the group consisting of dATP, dGTP, dCTP, dTTP and dUTP, or comprise a mixture of any combination of two or more types of nucleotides selected from the group consisting of dATP, dGTP, dCTP, dTTP and dUTP.

In some embodiments, at least one of the nucleotides in the plurality of nucleotides in step c. is labeled with a fluorophore. In some embodiments, the plurality of nucleotides in step c. lack a fluorophore label.

In some embodiments, at least one of the nucleotides in the plurality of nucleotides of step c. comprises a removable chain terminating moiety attached to the 3' carbon position of the sugar group, wherein the removable chain terminating moiety comprises an alkyl group, alkenyl group, alkynyl group, allyl group, aryl group, benzyl group, azide group, azido group, O-azidomethyl group, amine group, amide group, keto group, isocyanate group, phosphate group, thio group, disulfide group, carbonate group, urea group, or silyl group, and wherein the removable chain terminating moiety is cleavable with a chemical compound to generate an extendible 3'OH moiety on the sugar group.

DESCRIPTION OF THE DRAWINGS

The features of the present disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

DETAILED DESCRIPTION

Definitions

Figure 1:
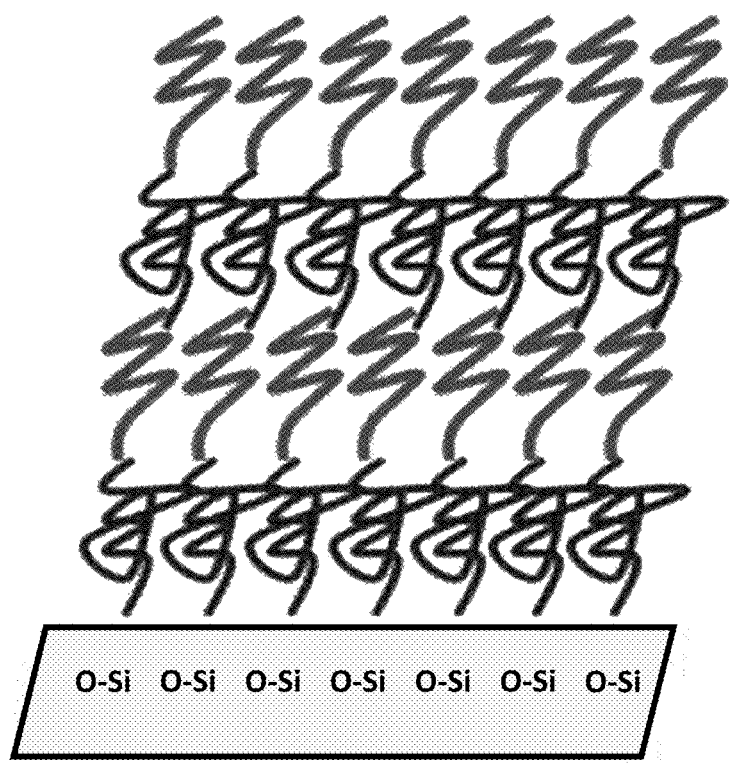
FIG. 1 is a schematic of an exemplary low binding support comprising a glass substrate and alternating layers of hydrophilic coatings which are covalently or non-covalently adhered to the glass, and which further comprises chemically-reactive functional groups that serve as attachment sites for oligonucleotide primers (e.g., capture oligonucleotides). In an alternative embodiment, the support can be made of any material such as glass, plastic or a polymer material.

The headings provided herein are not limitations of the various aspects of the disclosure, which aspects can be understood by reference to the specification as a whole.

Unless defined otherwise, technical and scientific terms used herein have meanings that are commonly understood by those of ordinary skill in the art unless defined otherwise. Generally, terminologies pertaining to techniques of molecular biology, nucleic acid chemistry, protein chemistry, genetics, microbiology, transgenic cell production, and hybridization described herein are those well-known and commonly used in the art. Techniques and procedures described herein are generally performed according to conventional methods well known in the art and as described in various general and more specific references that are cited and discussed throughout the instant specification. For example, see Sambrook et al., Molecular Cloning: A Laboratory Manual (Third ed., Cold Spring Harbor Laboratory Press, Cold Spring Harbor, N.Y. 2000). See also Ausubel et al., Current Protocols in Molecular Biology, Greene Publishing Associates (1992). The nomenclatures utilized in connection with, and the laboratory procedures and techniques described herein are those well-known and commonly used in the art.

Unless otherwise required by context herein, singular terms shall include pluralities and plural terms shall include the singular. Singular forms "a", "an" and "the", and singular use of any word, include plural referents unless expressly and unequivocally limited on one referent.

It is understood the use of the alternative term (e.g., "or") is taken to mean either one or both or any combination thereof of the alternatives.

The term "and/or" used herein is to be taken mean specific disclosure of each of the specified features or components with or without the other. For example, the term "and/or" as used in a phrase such as "A and/or B" herein is intended to include: "A and B"; "A or B"; "A" (A alone); and "B" (B alone). In a similar manner, the term "and/or" as used in a phrase such as "A, B, and/or C" is intended to encompass each of the following aspects: "A, B, and C"; "A, B, or C"; "A or C"; "A or B"; "B or C"; "A and B"; "B and C"; "A and C"; "A" (A alone); "B" (B alone); and "C" (C alone).

As used herein and in the appended claims, terms "comprising", "including", "having" and "containing", and their grammatical variants, as used herein are intended to be non-limiting so that one item or multiple items in a list do not exclude other items that can be substituted or added to the listed items. It is understood that wherever aspects are described herein with the language "comprising," otherwise analogous aspects described in terms of "consisting of" and/or "consisting essentially of" are also provided.

As used herein, the terms "about" and "approximately" refer to a value or composition that is within an acceptable error range for the particular value or composition as determined by one of ordinary skill in the art, which will depend in part on how the value or composition is measured or determined, i.e., the limitations of the measurement system. For example, "about" or "approximately" can mean within one or more than one standard deviation per the practice in the art. Alternatively, "about" or "approximately" can mean a range of up to 10% (i.e., ±10%) or more depending on the limitations of the measurement system. For example, about 5 mg can include any number between 4.5 mg and 5.5 mg. Furthermore, particularly with respect to biological systems or processes, the terms can mean up to an order of magnitude or up to 5-fold of a value. When particular values or compositions are provided in the instant disclosure, unless otherwise stated, the meaning of "about" or "approximately" should be assumed to be within an acceptable error range for that particular value or composition. Also, where ranges and/or subranges of values are provided, the ranges and/or subranges can include the endpoints of the ranges and/or subranges.

The term "polymerase" and its variants, as used herein, comprises an enzyme comprising a domain that binds a nucleotide (or nucleoside) where the polymerase can form a complex having a template nucleic acid and a complementary nucleotide. The polymerase can have one or more activities including, but not limited to, base analog detection activities, DNA polymerization activity, reverse transcriptase activity, DNA binding, strand displacement activity, and nucleotide binding and recognition. A polymerase can be any enzyme that can catalyze polymerization of nucleotides (including analogs thereof) into a nucleic acid strand. Typically, but not necessarily, such nucleotide polymerization can occur in a template-dependent fashion. Typically, a polymerase comprises one or more active sites at which nucleotide binding and/or catalysis of nucleotide polymerization can occur. In some embodiments, a polymerase includes other enzymatic activities, such as for example, 3' to 5' exonuclease activity or 5' to 3' exonuclease activity. In some embodiments, a polymerase has strand displacing activity. A polymerase can include without limitation naturally occurring polymerases and any subunits and truncations thereof, mutant polymerases, variant polymerases, recombinant, fusion or otherwise engineered polymerases, chemically modified polymerases, synthetic molecules or assemblies, and any analogs, derivatives, or fragments thereof that retain the ability to catalyze nucleotide polymerization (e.g., catalytically active fragment). The polymerase includes catalytically inactive polymerases, catalytically active polymerases, reverse transcriptases, and other enzymes comprising a nucleotide binding domain. In some embodiments, a polymerase can be isolated from a cell, or generated using recombinant DNA technology or chemical synthesis methods. In some embodiments, a polymerase can be expressed in prokaryote, eukaryote, viral, or phage organisms. In some embodiments, a polymerase can be post-translationally modified proteins or fragments thereof. A polymerase can be derived from a prokaryote, eukaryote, virus or phage. A polymerase comprises DNA-directed DNA polymerase and RNA-directed DNA polymerase.

As used herein, the term "strand displacing" refers to the ability of a polymerase to locally separate strands of double-stranded nucleic acids and synthesize a new strand in a template-based manner. Strand displacing polymerases displace a complementary strand from a template strand and catalyze new strand synthesis. Strand displacing polymerases include mesophilic and thermophilic polymerases. Strand displacing polymerases include wild type enzymes, and variants including exonuclease minus mutants, mutant versions, chimeric enzymes and truncated enzymes. Examples of strand displacing polymerases include, without limitation, phi29 DNA polymerase, large fragment of Bst DNA polymerase, large fragment of Bsu DNA polymerase (exo-), Bca DNA polymerase (exo-), Klenow fragment of E. coli DNA polymerase, T5 polymerase, M-MuLV reverse transcriptase, HIV viral reverse transcriptase, Deep Vent DNA polymerase and KOD DNA polymerase. The phi29 DNA polymerase can be wild type phi29 DNA polymerase (e.g., MagniPhi from Expedeon), or variant EquiPhi29 DNA polymerase (e.g., from Thermo Fisher Scientific), or chimeric QualiPhi DNA polymerase (e.g., from 4basebio).

The terms "nucleic acid", "polynucleotide" and "oligonucleotide" and other related terms used herein are used interchangeably and refer to polymers of nucleotides and are not limited to any particular length. Nucleic acids include recombinant and chemically-synthesized forms. Nucleic acids can be isolated. Nucleic acids include DNA molecules (e.g., cDNA or genomic DNA), RNA molecules (e.g., mRNA), analogs of the DNA or RNA generated using nucleotide analogs (e.g., peptide nucleic acids (PNA) and non-naturally occurring nucleotide analogs), and chimeric forms containing DNA and RNA. Nucleic acids can be single-stranded or double-stranded. Nucleic acids comprise polymers of nucleotides, where the nucleotides may include natural or non-natural bases, and/or sugars. Nucleic acids comprise naturally-occurring internucleosidic linkages, for example phosphdiester linkages. Nucleic acids can lack a phosphate group. Nucleic acids can comprise non-natural internucleoside linkages, including phosphorothioate, phosphorothiolate, and/or peptide nucleic acid (PNA) linkages. In some embodiments, nucleic acids comprise one type of polynucleotides or a mixture of two or more different types of polynucleotides.

The term "operably linked" and "operably joined" or related terms as used herein refers to juxtaposition of components. The juxtapositioned components can be linked together covalently. For example, two nucleic acid components can be enzymatically ligated together where the linkage that joins together the two components comprises phosphodiester linkage. A first and second nucleic acid component can be linked together, where the first nucleic acid component can confer a function on a second nucleic acid component. For example, linkage between a primer binding sequence and a sequence of interest forms a nucleic acid library molecule having a portion that can bind to a primer. In another example, a transgene (e.g., a nucleic acid encoding a polypeptide or a nucleic acid sequence of interest) can be ligated to a vector where the linkage permits expression or functioning of the transgene sequence contained in the vector. In some embodiments, a transgene is operably linked to a host cell regulatory sequence (e.g., a promoter sequence) that affects expression of the transgene. In some embodiments, the vector comprises at least one host cell regulatory sequence, including a promoter sequence, enhancer, transcription and/or translation initiation sequence, transcription and/or translation termination sequence, polypeptide secretion signal sequences, and the like. In some embodiments, the host cell regulatory sequence controls expression of the level, timing and/or location of the transgene.

The terms "linked", "joined", "attached", "appended" and variants thereof comprise any type of fusion, bond, adherence or association between any combination of compounds or molecules that is of sufficient stability to withstand use in the particular procedure. The procedure can include but is not limited to: nucleotide binding; nucleotide incorporation; de-blocking (e.g., removal of chain-terminating moiety); washing; removing; flowing; detecting; imaging and/or identifying. Such linkage can comprise, for example, covalent, ionic, hydrogen, dipole-dipole, hydrophilic, hydrophobic, or affinity bonding, bonds or associations involving van der Waals forces, mechanical bonding, and the like. In some embodiments, such linkage occurs intramolecularly, for example linking together the ends of a single-stranded or double-stranded linear nucleic acid molecule to form a circular molecule. In some embodiments, such linkage can occur between a combination of different molecules, or between a molecule and a non-molecule, including but not limited to: linkage between a nucleic acid molecule and a solid surface; linkage between a protein and a detectable reporter moiety; linkage between a nucleotide and detectable reporter moiety; and the like. Some examples of linkages can be found, for example, in Hermanson, G., "Bioconjugate Techniques", Second Edition (2008); Aslam, M., Dent, A., "Bioconjugation: Protein Coupling Techniques for the Biomedical Sciences", London: Macmillan (1998); Aslam, M., Dent, A., "Bioconjugation: Protein Coupling Techniques for the Biomedical Sciences", London: Macmillan (1998).

The term "primer" and related terms as used herein refers to an oligonucleotide that is capable of hybridizing with a DNA and/or RNA polynucleotide template to form a duplex molecule. Primers can comprise natural nucleotides and/or nucleotide analogs. Primers can be recombinant nucleic acid molecules. Primers may have any length, but typically range from 4-50 nucleotides. A typical primer comprises a 5' end and 3' end. The 3' end of the primer can include a 3' OH moiety which serves as a nucleotide polymerization initiation site in a polymerase-catalyzed primer extension reaction. Alternatively, the 3' end of the primer can lack a 3' OH moiety, or can include a terminal 3' blocking group that inhibits nucleotide polymerization in a polymerase-catalyzed reaction. Any one nucleotide, or more than one nucleotide, along the length of the primer can be labeled with a detectable reporter moiety. A primer can be in solution (e.g., a soluble primer) or can be immobilized to a support (e.g., a capture primer).

The term "template nucleic acid", "template polynucleotide", "target nucleic acid" "target polynucleotide", "template strand" and other variations refer to a nucleic acid strand that serves as the basis nucleic acid molecule for any of the reiterative sequencing methods described herein. The template nucleic acid can be single-stranded or double-stranded, or the template nucleic acid can have single-stranded or double-stranded portions. The template nucleic acid can be obtained from a naturally-occurring source, recombinant form, or chemically synthesized to include any type of nucleic acid analog. The template nucleic acid can be linear, circular, or other forms. The template nucleic acids can include an insert portion having an insert sequence. The template nucleic acids can also include at least one adaptor sequence. The insert portion can be isolated in any form, including chromosomal, genomic, organellar (e.g., mitochondrial, chloroplast or ribosomal), recombinant molecules, cloned, amplified, cDNA, RNA such as precursor mRNA or mRNA, oligonucleotides, whole genomic DNA, obtained from fresh frozen paraffin embedded tissue, needle biopsies, circulating tumor cells, cell free circulating DNA, or any type of nucleic acid library. The insert portion can be isolated from any source including from organisms such as prokaryotes, eukaryotes (e.g., humans, plants and animals), fungus, viruses cells, tissues, normal or diseased cells or tissues, body fluids including blood, urine, serum, lymph, tumor, saliva, anal and vaginal secretions, amniotic samples, perspiration, semen, environmental samples, culture samples, or synthesized nucleic acid molecules prepared using recombinant molecular biology or chemical synthesis methods. The insert portion can be isolated from any organ, including head, neck, brain, breast, ovary, cervix, colon, rectum, endometrium, gallbladder, intestines, bladder, prostate, testicles, liver, lung, kidney, esophagus, pancreas, thyroid, pituitary, thymus, skin, heart, larynx, or other organs. The template nucleic acid can be subjected to nucleic acid analysis, including sequencing and composition analysis.

The term "adaptor" and related terms refers to oligonucleotides that can be operably linked to a target polynucleotide, where the adaptor confers a function to the co-joined adaptor-target molecule. Adaptors comprise DNA, RNA, chimeric DNA/RNA, or analogs thereof. Adaptors can include at least one ribonucleoside residue. Adaptors can be single-stranded, double-stranded, or have single-stranded and/or double-stranded portions. Adaptors can be configured to be linear, stem-looped, hairpin, or Y-shaped forms. Adaptors can be any length, including 4-100 nucleotides or longer. Adaptors can have blunt ends, overhang ends, or a combination of both. Overhang ends include 5' overhang and 3' overhang ends. The 5' end of a single-stranded adaptor, or one strand of a double-stranded adaptor, can have a 5' phosphate group or lack a 5' phosphate group. Adaptors can include a 5' tail that does not hybridize to a target polynucleotide (e.g., tailed adaptor), or adaptors can be non-tailed. An adaptor can include a sequence that is complementary to at least a portion of a primer, such as an amplification primer, a sequencing primer, or a capture primer (e.g., soluble or immobilized capture primers). Adaptors can include a random sequence or degenerate sequence. Adaptors can include at least one inosine residue. Adaptors can include at least one phosphorothioate, phosphorothiolate and/or phosphoramidate linkage. Adaptors can include a barcode sequence which can be used to distinguish polynucleotides (e.g., insert sequences) from different sample sources in a multiplex assay. Adaptors can include a unique identification sequence (e.g., unique molecular index, UMI; or a unique molecular tag) that can be used to uniquely identify a nucleic acid molecule to which the adaptor is appended. In some embodiments, a unique identification sequence can be used to increase error correction and accuracy, reduce the rate of false-positive variant calls and/or increase sensitivity of variant detection. Adaptors can include at least one restriction enzyme recognition sequence, including any one or any combination of two or more selected from a group consisting of type I, type II, type III, type IV, type Hs or type IIB.

In some embodiments, any of the amplification primer sequences, sequencing primer sequences, capture primer sequences, target capture sequences, circularization anchor sequences, sample barcode sequences, spatial barcode sequences, or anchor region sequences can be about 3-50 nucleotides in length, or about 5-40 nucleotides in length, or about 5-25 nucleotides in length.

The term "universal sequence" and related terms refers to a sequence in a nucleic acid molecule that is common among two or more polynucleotide molecules. For example, an adaptor having a universal sequence can be operably joined to a plurality of polynucleotides so that the population of co-joined molecules carry the same universal adaptor sequence. Examples of universal adaptor sequences include an amplification primer sequence, a sequencing primer sequence or a capture primer sequence (e.g., soluble or immobilized capture primers).

When used in reference to nucleic acid molecules, the terms "hybridize" or "hybridizing" or "hybridization" or other related terms refers to hydrogen bonding between two different nucleic acids to form a duplex nucleic acid. Hybridization also includes hydrogen bonding between two different regions of a single nucleic acid molecule to form a self-hybridizing molecule having a duplex region. Hybridization can comprise Watson-Crick or Hoogstein binding to form a duplex double-stranded nucleic acid, or a double-stranded region within a nucleic acid molecule. The double-stranded nucleic acid, or the two different regions of a single nucleic acid, may be wholly complementary, or partially complementary. Complementary nucleic acid strands need not hybridize with each other across their entire length. The complementary base pairing can be the standard A-T or C-G base pairing, or can be other forms of base-pairing interactions. Duplex nucleic acids can include mismatched base-paired nucleotides.

When used in reference to nucleic acids, the terms "extend", "extending", "extension" and other variants, refers to incorporation of one or more nucleotides into a nucleic acid molecule. Nucleotide incorporation comprises polymerization of one or more nucleotides into the terminal 3' OH end of a nucleic acid strand, resulting in extension of the nucleic acid strand. Nucleotide incorporation can be conducted with natural nucleotides and/or nucleotide analogs. Typically, but not necessarily, nucleotide incorporation occurs in a template-dependent fashion. Any suitable method of extending a nucleic acid molecule may be used, including primer extension catalyzed by a DNA polymerase or RNA polymerase.

The term "nucleotides" and related terms refers to a molecule comprising an aromatic base, a five-carbon sugar (e.g., ribose or deoxyribose), and at least one phosphate group. Canonical or non-canonical nucleotides are consistent with use of the term. The phosphate in some embodiments comprises a monophosphate, diphosphate, or triphosphate, or corresponding phosphate analog. The term "nucleoside" refers to a molecule comprising an aromatic base and a sugar. Nucleotides and nucleosides can be non-labeled or labeled with a detectable reporter moiety.

Nucleotides (and nucleosides) typically comprise a hetero cyclic base including substituted or unsubstituted nitrogen-containing parent heteroaromatic ring which are commonly found in nucleic acids, including naturally-occurring, substituted, modified, or engineered variants, or analogs of the same. The base of a nucleotide (or nucleoside) is capable of forming Watson-Crick and/or Hoogstein hydrogen bonds with an appropriate complementary base. Exemplary bases include, but are not limited to, purines and pyrimidines such as: 2-aminopurine, 2,6-diaminopurine, adenine (A), etheno-adenine, $N^6$-$\Delta^2$-isopentenyladenine (6iA), $N^6$-$\Delta^2$-isopentenyl-2-methylthioadenine (2ms6iA), $N^6$-methyladenine, guanine (G), isoguanine, $N^2$-dimethylguanine (dmG), 7-methylguanine (7mG), 2-thiopyrimidine, 6-thioguanine (6sG), hypoxanthine and $O^6$-methylguanine; 7-deaza-purines such as 7-deazaadenine (7-deaza-A) and 7-deazaguanine (7-deaza-G); pyrimidines such as cytosine (C), 5-propynylcytosine, isocytosine, thymine (T), 4-thiothymine (4sT), 5,6-dihydrothymine, $O^4$-methylthymine, uracil (U), 4-thiouracil (4sU) and 5,6-dihydrouracil (dihydrouracil; D); indoles such as nitroindole and 4-methylindole; pyrroles such as nitropyrrole; nebularine; inosines; hydroxymethyl-cytosines; 5-methycytosines; base (Y); as well as methylated, glycosylated, and acylated base moieties; and the like. Additional exemplary bases can be found in Fasman, 1989, in "Practical Handbook of Biochemistry and Molecular Biology", pp. 385-394, CRC Press, Boca Raton, Fla.

Nucleotides (and nucleosides) typically comprise a sugar moiety, such as carbocyclic moiety (Ferraro and Gotor 2000 Chem. Rev. 100: 4319-48), acyclic moieties (Martinez, et al., 1999 Nucleic Acids Research 27: 1271-1274; Martinez, et al., 1997 Bioorganic & Medicinal Chemistry Letters vol. 7: 3013-3016), and other sugar moieties (Joeng, et al., 1993 J. Med. Chem. 36: 2627-2638; Kim, et al., 1993 J. Med. Chem. 36: 30-7; Eschenmosser 1999 Science 284:2118-2124; and U.S. Pat. No. 5,558,991). The sugar moiety comprises: ribosyl; 2'-deoxyribosyl; 3'-deoxyribosyl; 2',3'-dideoxyribosyl; 2',3'-didehydrodideoxyribosyl; 2'-alkoxyribosyl; 2'-azidoribosyl; 2'-aminoribosyl; 2'-fluororibosyl; 2'-mercaptoriboxyl; 2'-alkylthioribosyl; 3'-alkoxyribosyl; 3'-azidoribosyl; 3'-aminoribosyl; 3'-fluororibosyl; 3'-mercaptoriboxyl; 3'-alkylthioribosyl carbocyclic; acyclic or other modified sugars.

In some embodiments, nucleotides comprise a chain of one, two or three phosphorus atoms where the chain is typically attached to the 5' carbon of the sugar moiety via an ester or phosphoramide linkage. In some embodiments, the nucleotide is an analog having a phosphorus chain in which the phosphorus atoms are linked together with intervening O, S, NH, methylene or ethylene. In some embodiments, the phosphorus atoms in the chain include substituted side groups including O, S or $BH_3$. In some embodiments, the chain includes phosphate groups substituted with analogs including phosphoramidate, phosphorothioate, phosphordithioate, and O-methylphosphoroamidite groups.

As used herein, a "nucleotide unit" or 'nucleotide moiety" refers to nucleotides (e.g., dATP, dTTP, dGTP, dCTP, or dUTP), or analogs thereof, comprising comprises a base, sugar and at least one phosphate group. Nucleotide units can be attached to the multivalent molecules used in the sequencing reactions described herein. In general, all nucleotide units attached to the same multivalent molecule will have the same identity (e.g., all A, all T, all C, or all G), although the skilled artisan will appreciate that there may be situations in which a multivalent molecule comprising nucleotide units of differing identity will be advantageous.

The term "reporter moiety", "reporter moieties" or related terms refers to a compound that generates, or causes to generate, a detectable signal. A reporter moiety is sometimes called a "label". Any suitable reporter moiety may be used, including luminescent, photoluminescent, electroluminescent, bioluminescent, chemiluminescent, fluorescent, phosphorescent, chromophore, radioisotope, electrochemical, mass spectrometry, Raman, hapten, affinity tag, atom, or an enzyme. A reporter moiety generates a detectable signal resulting from a chemical or physical change (e.g., heat, light, electrical, pH, salt concentration, enzymatic activity, or proximity events). A proximity event includes two reporter moieties approaching each other, or associating with each other, or binding each other. It is well known to one skilled in the art to select reporter moieties so that each absorbs excitation radiation and/or emits fluorescence at a wavelength distinguishable from the other reporter moieties to permit monitoring the presence of different reporter moieties in the same reaction or in different reactions. Two or more different reporter moieties can be selected having spectrally distinct emission profiles, or having minimal overlapping spectral emission profiles. Reporter moieties can be linked (e.g., operably linked) to nucleotides, nucleosides, nucleic acids, enzymes (e.g., polymerases or reverse transcriptases), or support (e.g., surfaces).

A reporter moiety (or label) comprises a fluorescent label or a fluorophore. Exemplary fluorescent moieties which may serve as fluorescent labels or fluorophores include, but are not limited to fluorescein and fluorescein derivatives such as carboxyfluorescein, tetrachlorofluorescein, hexachlorofluorescein, carboxynapthofluorescein, fluorescein isothiocyanate, NHS-fluorescein, iodoacetamidofluorescein, fluorescein maleimide, SAMSA-fluorescein, fluorescein thiosemicarbazide, carbohydrazinomethylthioacetyl-amino fluorescein, rhodamine and rhodamine derivatives such as TRITC, TMR, lissamine rhodamine, Texas Red, rhodamine B, rhodamine 6G, rhodamine 10, NHS-rhodamine, TMR-iodoacetamide, lissamine rhodamine B sulfonyl chloride, lissamine rhodamine B sulfonyl hydrazine, Texas Red sulfonyl chloride, Texas Red hydrazide, coumarin and coumarin derivatives such as AMCA, AMCA-NHS, AMCA-sulfo-NHS, AMCA-HPDP, DCIA, AMCE-hydrazide, BODIPY and derivatives such as BODIPY FL C3-SE, BODIPY 530/550 C3, BODIPY 530/550 C3-SE, BODIPY 530/550 C3 hydrazide, BODIPY 493/503 C3 hydrazide, BODIPY FL C3 hydrazide, BODIPY FL IA, BODIPY 530/551 IA, Br-BODIPY 493/503, Cascade Blue and derivatives such as Cascade Blue acetyl azide, Cascade Blue cadaverine, Cascade Blue ethylenediamine, Cascade Blue hydrazide, Lucifer Yellow and derivatives such as Lucifer Yellow iodoacetamide, Lucifer Yellow CH, cyanine and derivatives such as indolium based cyanine dyes, benzo-indolium based cyanine dyes, pyridium based cyanine dyes, thiozolium based cyanine dyes, quinolinium based cyanine dyes, imidazolium based cyanine dyes, Cy 3, Cy5, lanthanide chelates and derivatives such as BCPDA, TBP, TMT, BHHCT, BCOT, Europium chelates, Terbium chelates, Alexa Fluor dyes, DyLight dyes, Atto dyes, LightCycler Red dyes, CAL Flour dyes, JOE and derivatives thereof, Oregon Green dyes, WellRED dyes, IRD dyes, phycoerythrin and phycobilin dyes, Malachite green, stilbene, DEG dyes, NR dyes, near-infrared dyes and others known in the art such as those described in Haugland, Molecular Probes Handbook, (Eugene, Oreg.) 6th Edition; Lakowicz, Principles of Fluorescence Spectroscopy, 2nd Ed., Plenum Press New York (1999), or Hermanson, Bioconjugate Techniques, 2nd Edition, or derivatives thereof, or any combination thereof. Cyanine dyes may exist in either sulfonated or non-sulfonated forms, and consist of two indolenin, benzo-indolium, pyridium, thiozolium, and/or quinolinium groups separated by a polymethine bridge between two nitrogen atoms. Commercially available cyanine fluorophores include, for example, Cy3, (which may comprise 1-[6-(2,5-dioxopyrrolidin-1-yloxy)-6-oxohexyl]-2-(3-{1-[6-(2,5-di-oxopyrrolidin-1-yloxy)-6-oxohexyl]-3,3-dimethyl-1,3-di-hydro-2H-indol-2-ylidene}prop-1-en-1-yl)-3,3-dimethyl-3H-indolium or 1-[6-(2,5-dioxopyrrolidin-1-yloxy)-6-oxohexyl]-2-(3-{1-[6-(2,5-dioxopyrrolidin-1-yl oxy)-6-oxohexyl]-3,3-dimethyl-5-sulfo-1,3-dihydro-2H-indol-2-ylidene}prop-1-en-1-yl)-3,3-dimethyl-3H-indolium-5-sulfonate), Cy5 (which may comprise 1-(6-((2,5-dioxopyrrolidin-1-yl)oxy)-6-oxohexyl)-2-((1E,3E)-5-((E)-1-(6-((2,5-dioxopyrrolidin-1-yl)oxy)-6-oxohexyl)-3,3-dimethyl-5-indolin-2-ylidene)penta-1,3-dien-1-yl)-3,3-dimethyl-3H-indol-1-ium or 1-(6-((2,5-dioxopyrrolidin-1-yl)oxy)-6-oxohexyl)-2-((1E,3E)-5-4E)-1-(6-((2,5-dioxopyrrolidin-1-yl)oxy)-6-oxohexyl)-3,3-dimethyl-5-sulfoindolin-2-ylidene)penta-1,3-dien-1-yl)-3,3-dimethyl-3H-indol-1-ium-5-sulfonate), and Cy7 (which may comprise 1-(5-carboxypentyl)-2-[(1E,3E,5E,7Z)-7-(1-ethyl-1,3-dihydro-2H-indol-2-ylidene)hepta-1,3,5-trien-1-yl]-3H-indolium or 1-(5-carboxypentyl)-2-[(1E,3E,5E,7Z)-7-(1-ethyl-5-sulfo-1,3-dihydro-2H-indol-2-ylidene)hepta-1,3,5-trien-1-yl]-3H-indolium-5-sulfonate), where "Cy" stands for 'cyanine', and the first digit identifies the number of carbon atoms between two indolenine groups. Cy2 which is an oxazole derivative rather than indolenin, and the benzo-derivatized Cy3.5, Cy5.5 and Cy7.5 are exceptions to this rule.

In some embodiments, the reporter moiety can be a FRET pair, e.g., such that multiple classifications can be performed under a single excitation and imaging step. As used herein, FRET may comprise excitation exchange (Forster) transfers, or electron-exchange (Dexter) transfers.

When used in reference to nucleic acids, the terms "amplify", "amplifying", "amplification", and other related terms include producing multiple copies of an original polynucleotide template molecule, where the copies comprise a sequence that is complementary to the template sequence, or the copies comprise a sequence that is the same as the template sequence. In some embodiments, the copies comprise a sequence that is substantially identical to a template sequence, or is substantially identical to a sequence that is complementary to the template sequence.

The term "support" as used herein refers to a substrate that is designed for deposition of biological molecules or biological samples for assays and/or analyses. Examples of biological molecules to be deposited onto a support include nucleic acids (e.g., DNA, RNA), polypeptides, saccharides, lipids, a single cell or multiple cells. Examples of biological samples include, but are not limited to saliva, phlegm, mucus, blood, plasma, serum, urine, stool, sweat, tears and fluids from tissues or organs.

In some embodiments, the support is solid, semi-solid, or a combination of both. In some embodiments, the support is porous, semi-porous, non-porous, or any combination of porosity. In some embodiments, the support can be substantially planar, concave, convex, or any combination thereof. In some embodiments, the support can be cylindrical, for example comprising a capillary or interior surface of a capillary.

In some embodiments, the surface of the support can be substantially smooth. In some embodiments, the support can be regularly or irregularly textured, including bumps, etched, pores, three-dimensional scaffolds, or any combination thereof.

In some embodiments, the support comprises a bead having any shape, including spherical, hemi-spherical, cylindrical, barrel-shaped, toroidal, disc-shaped, rod-like, conical, triangular, cubical, polygonal, tubular or wire-like.

The support can be fabricated from any material, including but not limited to glass, fused-silica, silicon, a polymer (e.g., polystyrene (PS), macroporous polystyrene (MPPS), polymethylmethacrylate (PMMA), polycarbonate (PC), polypropylene (PP), polyethylene (PE), high density polyethylene (HDPE), cyclic olefin polymers (COP), cyclic olefin copolymers (COC), polyethylene terephthalate (PET)), or any combination thereof. Various compositions of both glass and plastic substrates are contemplated.

In some aspects, the support can have a plurality (e.g., two or more) of nucleic acid templates immobilized thereon. In some embodiments, the plurality of immobilized nucleic acid templates has the same sequence. In some embodiments, the plurality of immobilized nucleic acid templates has different sequences. In some embodiments, individual nucleic acid template molecules in the plurality of nucleic acid templates are immobilized to a different site on the support. In some embodiments, two or more individual nucleic acid template molecules in the plurality of nucleic acid templates are immobilized to a site on the support.

The term "array" refers to a support comprising a plurality of sites located at pre-determined locations on the support to form an array of sites. The sites can be discrete and separated by interstitial regions. In some embodiments, the pre-determined sites on the support can be arranged in one dimension in a row or a column, or arranged in two dimensions in rows and columns. In some embodiments, the plurality of pre-determined sites is arranged on the support in an organized fashion. In some embodiments, the plurality of pre-determined sites is arranged in any organized pattern, including rectilinear, hexagonal patterns, grid patterns, patterns having reflective symmetry, patterns having rotational symmetry, or the like. The pitch between different pairs of sites can be that same or can vary. In some embodiments, the support comprises at least $10^2$ sites, at least $10^3$ sites, at least $10^4$ sites, at least $10^5$ sites, at least $10^6$ sites, at least $10^7$ sites, at least $10^8$ sites, at least $10^9$ sites, at least $10^{10}$ sites, at least $10^{11}$ sites, at least $10^{12}$ sites, at least $10^{13}$ sites, at least $10^{14}$ sites, at least $10^{15}$ sites, or more, where the sites are located at pre-determined locations on the support. In some embodiments, a plurality of pre-determined sites on the support (e.g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites, or more) are immobilized with nucleic acid templates to form a nucleic acid template array. In some embodiments, the nucleic acid templates that are immobilized at a plurality of pre-determined sites by hybridization to immobilized surface capture primers, or the nucleic acid templates are covalently attached to the surface capture primer. In some embodiments, the nucleic acid templates that are immobilized at a plurality of pre-determined sites, for example immobilized at $10^2$-$10^{15}$ sites or more (e.g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites, or more). In some embodiments, the immobilized nucleic acid templates are clonally-amplified to generate immobilized nucleic acid clusters at the plurality of pre-determined sites. In some embodiments, individual immobilized nucleic acid clusters comprise linear clusters, or comprise single-stranded or double-stranded concatemers.

In some embodiments, a support comprising a plurality of sites located at random locations on the support is referred to herein as a support having randomly located sites thereon. In such embodiments, the location of the randomly located sites on the support are not pre-determined. Consequently, the plurality of randomly-located sites is arranged on the support in a disordered and/or unpredictable fashion. In some embodiments, the support comprises at least $10^2$ sites, at least $10^3$ sites, at least $10^4$ sites, at least $10^5$ sites, at least $10^6$ sites, at least $10^7$ sites, at least $10^8$ sites, at least $10^9$ sites, at least $10^{10}$ sites, at least $10^{11}$ sites, at least $10^{12}$ sites, at least $10^{13}$ sites, at least $10^{14}$ sites, at least $10^{15}$ sites, or more, where the sites are randomly located on the support. In some embodiments, a plurality of randomly located sites on the support (e.g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites, or more) are immobilized with nucleic acid templates to form a support immobilized with nucleic acid templates. In some embodiments, the nucleic acid templates that are immobilized at a plurality of randomly located sites by hybridization to immobilized surface capture primers, or the nucleic acid templates are covalently attached to the surface capture primer. In some embodiments, the nucleic acid templates that are immobilized at a plurality of randomly located sites, for example immobilized at $10^2$-$10^{15}$ sites or more (e.g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites, or more). In some embodiments, the immobilized nucleic acid templates are clonally-amplified to generate immobilized nucleic acid clusters at the plurality of randomly located sites. In some embodiments, individual immobilized nucleic acid clusters comprise linear clusters, or comprise single-stranded or double-stranded concatemers.

In some embodiments, the plurality of immobilized surface capture primers on the support are in fluid communication with each other to permit flowing a solution of reagents (e.g., nucleic acid template molecules, soluble primers, enzymes, nucleotides, divalent cations, buffers, and the like) onto the support so that the plurality of immobilized surface capture primers on the support can be essentially simultaneously reacted with the reagents in a massively parallel manner. In some embodiments, the fluid communication of the plurality of immobilized surface capture primers can be used to conduct nucleic acid amplification reactions (e.g., RCA, MDA, PCR, and bridge amplification) essentially simultaneously on the plurality of immobilized surface capture primers.

In some embodiments, the plurality of immobilized nucleic acid clusters on the support are in fluid communication with each other to permit flowing a solution of reagents (e.g., enzymes, nucleotides, divalent cations, and the like) onto the support so that the plurality of immobilized nucleic acid clusters on the support can be essentially simultaneously reacted with the reagents in a massively parallel manner. In some embodiments, the fluid communication of the plurality of immobilized nucleic acid clusters can be used to conduct nucleotide binding assays and/or conduct nucleotide polymerization reactions (e.g., primer extension or sequencing) essentially simultaneously on the plurality of immobilized nucleic acid clusters, and optionally to conduct detection and imaging for massively parallel sequencing.

When used in reference to immobilized enzymes, the term "immobilized" and related terms refer to enzymes (e.g., polymerases) that are attached to a support through covalent bond or non-covalent interaction, or attached to a coating on the support, or buried within a matrix formed by a coating on the support.

When used in reference to immobilized nucleic acids, the term "immobilized" and related terms refer to nucleic acid molecules that are attached to a support through covalent bond or non-covalent interaction, or attached to a coating on the support, or buried within a matrix formed by a coating on the support, where the nucleic acid molecules include surface capture primers, nucleic acid template molecules and extension products of capture primers. Extension products of capture primers can include nucleic acid concatemers (e.g., nucleic acid clusters).

In some embodiments, one or more nucleic acid templates are immobilized on the support, for example immobilized at the sites on the support. In some embodiments, the one or more nucleic acid templates are clonally-amplified. In some embodiments, the one or more nucleic acid templates are clonally-amplified off the support (e.g., in-solution) and then deposited onto the support and immobilized on the support. In some embodiments, the clonal amplification reaction of the one or more nucleic acid templates is conducted on the support resulting in immobilization on the support. In some embodiments, the one or more nucleic acid templates are clonally-amplified (e.g., in solution or on the support) using a nucleic acid amplification reaction, including any one or any combination of: polymerase chain reaction (PCR), multiple displacement amplification (MDA), transcription-mediated amplification (TMA), nucleic acid sequence-based amplification (NASBA), strand displacement amplification (SDA), real-time SDA, bridge amplification, isothermal bridge amplification, rolling circle amplification (RCA), circle-to-circle amplification, helicase-dependent amplification, recombinase-dependent amplification, and/or single-stranded binding (SSB) protein-dependent amplification.

The term "persistence time" and related terms refers to the length of time that a binding complex, which is formed between the target nucleic acid, a polymerase, a conjugated or unconjugated nucleotide, remains stable without any binding component dissociates from the binding complex. The persistence time is indicative of the stability of the binding complex and strength of the binding interactions. Persistence time can be measured by observing the onset and/or duration of a binding complex, such as by observing a signal from a labeled component of the binding complex. For example, a labeled nucleotide or a labeled reagent comprising one or more nucleotides may be present in a binding complex, thus allowing the signal from the label to be detected during the persistence time of the binding complex. One exemplary label is a fluorescent label.

INTRODUCTION

The present disclosure provides compositions, apparatuses and methods for capturing nucleic acids from cellular samples on a support, preparing library molecules on the support, amplifying the library molecules on the support to generate nucleic acid template molecules, and analyzing the immobilized nucleic acid template molecules including detecting and/or sequencing the immobilized nucleic acid template molecules. The immobilized nucleic acid template molecules correspond to the nucleic acids from the cellular samples. The immobilized nucleic acid template molecules are spatially located on the support in an arrangement that is similar to the spatial location in the cellular sample.

Methods for Preparing Spatially Resolved Nucleic Acids

The present disclosure provides methods for preparing spatially resolved nucleic acids, comprising: step (a) providing a support which is passivated with at least one layer of a low non-specific binding coating. In some embodiments, the low non-specific binding coating comprises a high contrast-to-noise (CNR) coating that provides a low-binding/low scatter base layer. In some embodiments, the low non-specific binding coating comprises at least one hydrophilic polymer layer. In some embodiments, the low non-specific binding coating has a water contact angle of no more than 45 degrees. In some embodiments, the low non-specific binding coating can form a continuous layer on the support, or the low non-specific binding coating can be placed on the support in an organized pattern across the support, for example as spots, grids and/or lines. In some embodiments, the low non-specific binding coating can provide a surface having a high contrast-to-noise (CNR) ratio. Additional descriptions of the low non-specific binding coating is provided below. In some embodiments, the support is passivated with a cell-binding coating which comprises polylysine, polyarginine, other polycations, tissue-specific antibodies, detergents, amphipathic peptides, tissue-specific or generic receptor ligands especially cell surface receptor ligands, and/or lectins. In some embodiments, the cell-binding coating can be placed on the support in an organized pattern across the support, for example as spots, grids and/or lines. In some embodiments, the cell-binding coating can be present at low density which is optimized to provide cell or tissue binding without interfering with the low binding/high CNR properties of the low non-specific binding coating(s).

In some embodiments in step (a), the support is solid, semi-solid, or a combination of both. In some embodiments, the support is porous, semi-porous, non-porous, or any combination of porosity. In some embodiments, the support can be substantially planar, concave, convex, or any combination thereof.

Figure 11:
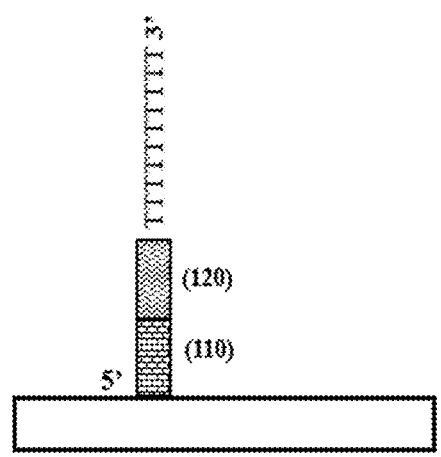
FIG. 11 is a schematic of a support comprising an immobilized surface capture primer.

In some embodiments in step (a), the low non-specific binding coating comprises a plurality of surface capture primers that selectively hybridize (capture) nucleic acids from a cellular sample such as RNA and/or DNA. The surface capture primers can hybridize to any portion of the RNA or DNA from the cellular sample. In some embodiments, the surface capture primers comprise an RNA capture sequence which comprises a polyT sequence, a target-specific sequence and/or a random sequence. In some embodiments, the surface capture primers comprise a universal adaptor sequence, such as a universal surface capture primer sequence, a universal surface pinning primer sequence, a universal binding site for a reverse sequencing primer, a universal binding site for a forward sequencing primer and/or a universal binding site for a compaction oligonucleotide. In some embodiments, the polyT sequence comprises 3-30 nucleotides having a thymine base. In some embodiments, individual surface capture primers comprise (e.g., arranged in a 5' to 3' orientation): a universal surface capture primer sequence (110), a universal binding site for a reverse sequencing primer (120), and an RNA capture sequence (e.g., see FIG. 11). In some embodiments, the RNA capture sequence comprises a poly-T sequence and/or an RNA target-specific sequence. In some embodiments, the 5' ends of the surface capture primers are tethered to the low non-specific binding coating. In some embodiments, the support further comprises a plurality of surface pinning primers which are tethered to the low non-specific binding coating. In some embodiments, the immobilized surface pinning primers serve to pin down at least one portion of concatemer molecules to the support (e.g., concatemer molecules are described below). In some embodiments, the immobilized surface pinning primers have a non-extendible 3' end and cannot be used for amplification. In some embodiments, the surface capture primers and surface pinning primers can be covalently tethered to the low non-specific binding coating.

In some embodiments, the universal surface capture primer sequence (110) comprises the sequence: 5'-AGTCGTCGCAGCCTCACCTGATC-3' (SEQ ID NO: 1).

In some embodiments, the universal surface capture primer sequence (110) comprises the sequence: 5'-TCGTATGCCGTCTTCTGCTTG-3' (SEQ ID NO: 2).

In some embodiments, universal binding site for a reverse sequencing primer (120) comprises the sequence: 5'-ATGTCGGAAGGTGTGCAGGCTACCGCTTGT-CAACT-3' (SEQ ID NO: 3).

In some embodiments, universal binding site for a reverse sequencing primer (120) comprises the sequence: 5'-AGATCGGAAGAGCACACGTCTGAACTCCAGTCAC-3' (SEQ ID NO: 4).

In some embodiments, universal binding site for a reverse sequencing primer (120) comprises the sequence: 5'-CTGTCTCTTATACACATCTCCGAGCCCACGAGAC-3' (SEQ ID NO: 5).

Figure 12:
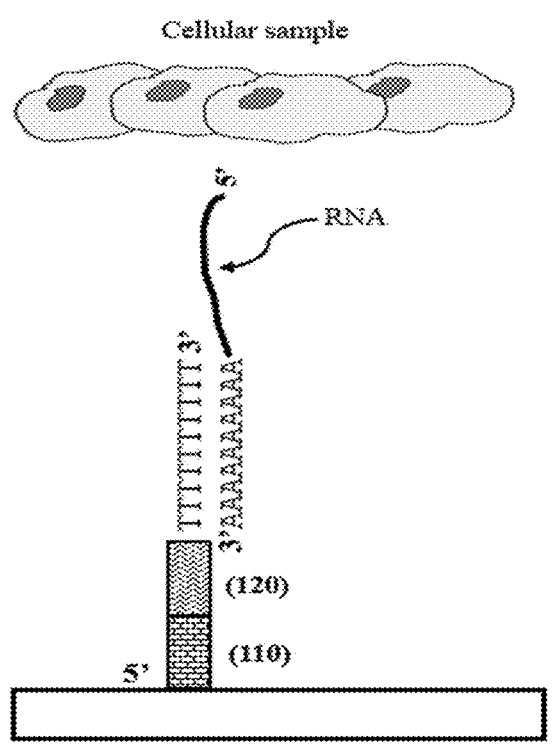
FIG. 12 is a schematic showing a cellular sample positioned on the support and an RNA molecule eluted from the cellular sample onto the surface capture primer immobilized to the support.

In some embodiments, the methods for preparing spatially resolved nucleic acids further comprise step (b): positioning a cellular sample on the support under conditions suitable for the cell sample to remain in a fixed position on the coated support. In some embodiments, the cellular sample can be manually positioned on the support, for example using a tool such as forceps. In some embodiments, the cellular sample can be a tissue slice which is flowed or placed onto the support. In some embodiments, the support comprises a flowcell which can be a closed flowcell or a resealable flowcell. In some embodiments, the cellular sample can be permeabilized to permit nucleic acids to elute from inside the cell to outside of the cell and contact the support. In some embodiments, RNA can elute from inside the cell and onto the surface capture primers that are immobilized on the coated support. In some embodiments, the eluted RNA can hybridize to the surface capture primers to generate a plurality of capture primer-RNA duplexes each comprising a surface capture primer hybridized to an RNA molecule (e.g., see FIG. 12). In some embodiments, RNA can elute from inside the cell and onto the support by diffusion, by thermally assisted diffusion, by radiation assisted diffusion, by electrophoresis, by centrifugation, or by other methods. In some embodiments, RNA can elute from inside the cell and onto the surface capture primers in a manner that preserves the spatial location information of the RNA molecules in the cellular sample. In some embodiments, the location of the RNA molecules hybridized to surface capture primers on the coated support corresponds to the spatial location of the RNA molecules when they were previously located inside the cellular sample. In some embodiments, the cellular sample can be permeabilized prior to, or after or concurrently, with positioning a cellular sample on the support. In some embodiments, the cellular sample can be treated with a chemical fixation reagent or the cellular sample is not chemically fixed. In some embodiments, the cellular sample can be stained, de-stained or un-stained. In some embodiments, the cellular sample can be imaged, or stained and imaged at step (b). The cellular sample can be stained by employing any of the techniques described in "Histological and Histochemical Methods: Theory and Practice", 4$^{th}$ Edition, Kiernan, J. A., Ed. (2008). In some embodiments, imaging may be conducted using negative stains or by fluorescent or interferometric methods. In some embodiments, in step (b), the cellular sample (e.g., tissue slice) can be positioned on the support for automated or semi-automated scanning. In some embodiments, the cellular sample can be removed from the support after eluting the nucleic acids from the cellular sample and onto the immobilized surface capture primers on the support of step (b). In some embodiments, the cellular sample can be removed from the support after any of steps (c)-(i) which are described below. In some embodiments, the cellular sample can be imaged, or stained and imaged during any of steps (c)-(i).

Figure 13:
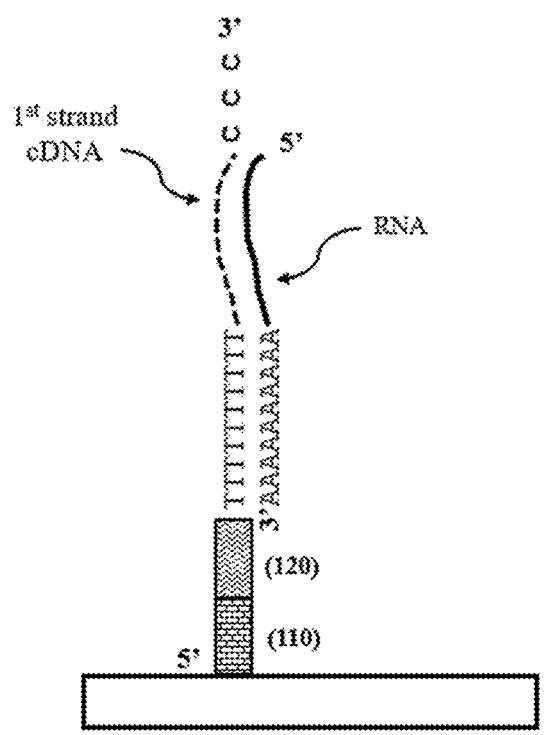
FIG. 13 is a schematic showing synthesis of a first strand cDNA (dashed line) and non-template polyC tail at the 3' end of the first strand cDNA.

In some embodiments, the methods for preparing spatially resolved nucleic acids further comprise step (c): conducting a reverse transcription reaction on the support by contacting the capture primer-RNA duplexes with Moloney Murine Leukemia Virus (MMLV) reverse transcriptase, a plurality of nucleotides (e.g., dATP, dGTP, dCTP, dTTP and/or dUTP). In some embodiments, the reverse transcription reaction generates a plurality of first strand cDNA molecules by extending the 3' end of the immobilized surface capture primers and using the hybridized RNA as a template strand. In some embodiments, the reverse transcription reaction can be conducted under a condition suitable for the MMLV reverse transcription enzyme to generate a non-template polyC tail at the 3' end of the first strand cDNA (e.g., see FIG. 13). Alternatively, a non-template polyC tail can be appended to the 3' end of the first strand cDNA using terminal deoxynucleotidyl transferase and dCTP.

Figure 14:
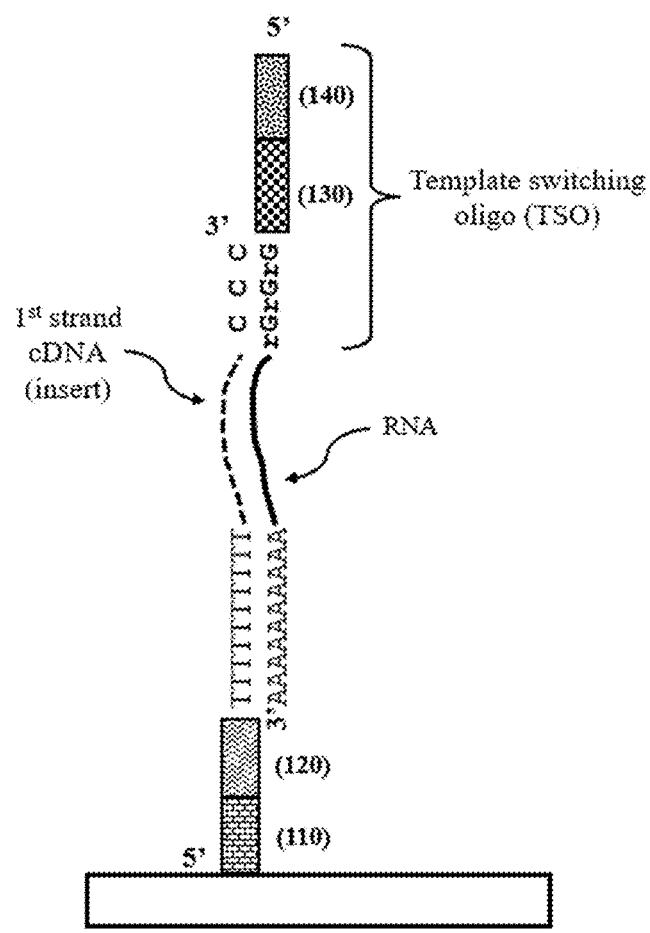
FIG. 14 is a schematic showing a template switching oligonucleotide which is hybridized to the non-template polyC tail at the 3' end of the first strand cDNA. rGrGrG represents an exemplary polyG region. The polyG region of the template switching oligonucleotide may comprise ribonucleotide bases.

In some embodiments, the reverse transcription reaction of step (c) can be conducted in the presence of a plurality of template switching oligonucleotides. Individual template switching oligonucleotides can hybridize to the non-template polyC tail at the 3' end of the first strand of the cDNA (e.g., see FIG. 14). In some embodiments, the template switching oligonucleotides comprise a DNA/RNA chimeric oligonucleotide. In some embodiments, the template switching oligonucleotides comprise a polyG region which can hybridize with the polyC tail at the 3' end of the first strand of the cDNA. In some embodiments, the polyG region of the template switching oligonucleotide comprises ribonucleotide bases (e.g., see FIG. 14). In some embodiments, the template switching oligonucleotide further comprises at least one universal adaptor sequence, for example a universal binding site for a surface pinning primer (140), and a universal binding site for a forward sequencing primer (130) (e.g., see FIG. 14).

In some embodiments, the universal binding site for a forward sequencing primer (130) comprises the sequence: 5'-CGTGCTGGATTGGCTCACCAGACACCTTCCGA-CAT-3' (SEQ ID NO: 6).

In some embodiments, the universal binding site for a forward sequencing primer (130) comprises the sequence: 5'-ACACTCTTTCCCTACACGACGCTCTTCCGATCT-3' (SEQ ID NO: 7).

In some embodiments, the universal binding site for a forward sequencing primer (130) comprises the sequence: 5'-TCGTCGGCAGCGTCAGATGTGTATAAGAGACAG-3' (SEQ ID NO: 8).

In some embodiments, the universal binding site for a surface pinning primer (140) comprises the sequence: 5'-CATGTAATGCACGTACTTTCAGGGT-3' (SEQ ID NO: 9).

In some embodiments, the universal binding site for a surface pinning primer (140) comprises the sequence: 5'-AATGATACGGCGACCACCGA-3' (SEQ ID NO: 10).

Figure 15:
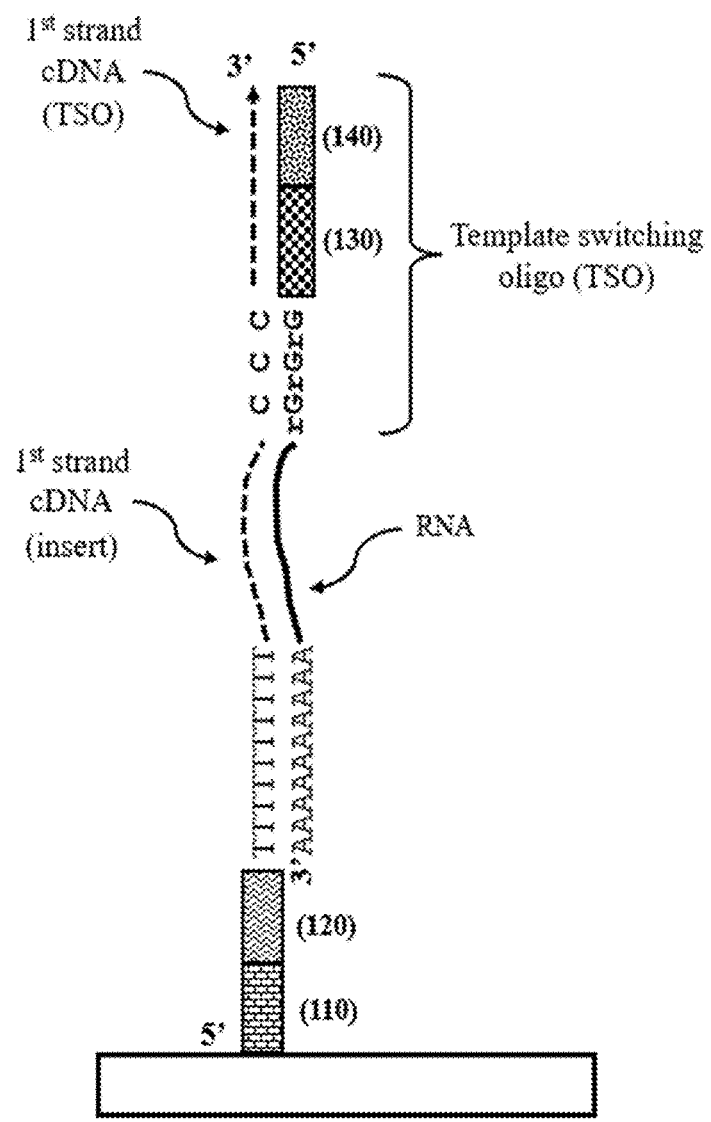
FIG. 15 is a schematic showing extension of the first strand cDNA (upper dashed arrow) using the template switching oligonucleotide as a template strand to generate a full length first strand cDNA.

In some embodiments, the methods for preparing spatially resolved nucleic acids further comprise step (d): extending the first strand of the cDNA using MMLV reverse transcriptase, a plurality of nucleotides (e.g., dATP, dGTP, dCTP, dTTP and/or dUTP), and at least a portion of the template switching oligonucleotide (TSO) as a template strand (see the upper dashed line with an arrow in FIG. 15 labelled '1$^{st}$ strand cDNA (TSO)'). In some embodiments, the extension reaction of step (d) extends from the 3' terminal end of the polyC tail of the first strand cDNA. The extension reaction of step (d) can generate a full length first strand of cDNA, which comprises (in a 5' to 3' orientation): a universal surface capture primer sequence (110); a universal binding site for a reverse sequencing primer (120); an RNA capture sequence; a cDNA insert corresponding to the RNA; a polyC tail; a universal binding site for forward sequencing primer (130); and a universal binding site for surface pinning primer (140).

Figure 16:
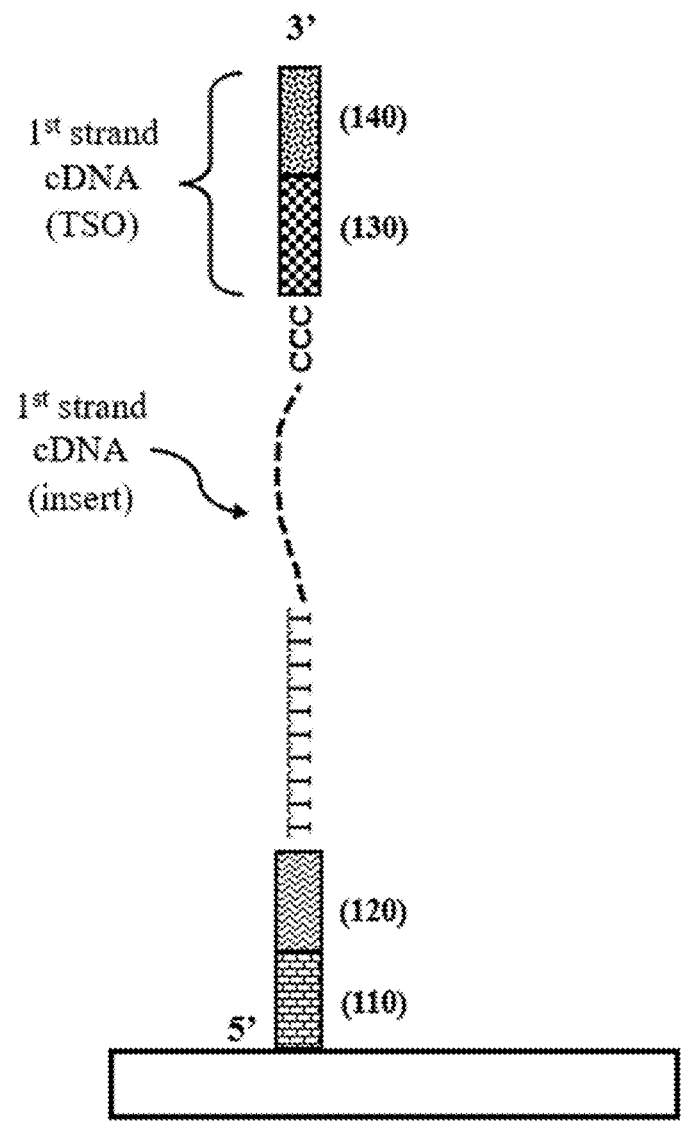
FIG. 16 is a schematic showing the RNA strand has been removed/degraded while retaining the full length first stand cDNA which is immobilized to the support.

In some embodiments, the methods for preparing spatially resolved nucleic acids further comprise step (e): removing the RNA while retaining the immobilized full length first strand cDNA. In some embodiments, the RNA can be removed using RNase. In some embodiments, the retained immobilized full length first strand cDNA comprises (in a 5' to 3' orientation): a universal surface capture primer sequence (110); a universal binding site for a reverse sequencing primer (120); an RNA capture sequence; a cDNA insert corresponding to the RNA; a polyC tail; a universal binding site for forward sequencing primer (130); and a universal binding site for surface pinning primer (140) (e.g., see FIG. 16).

Figure 17:
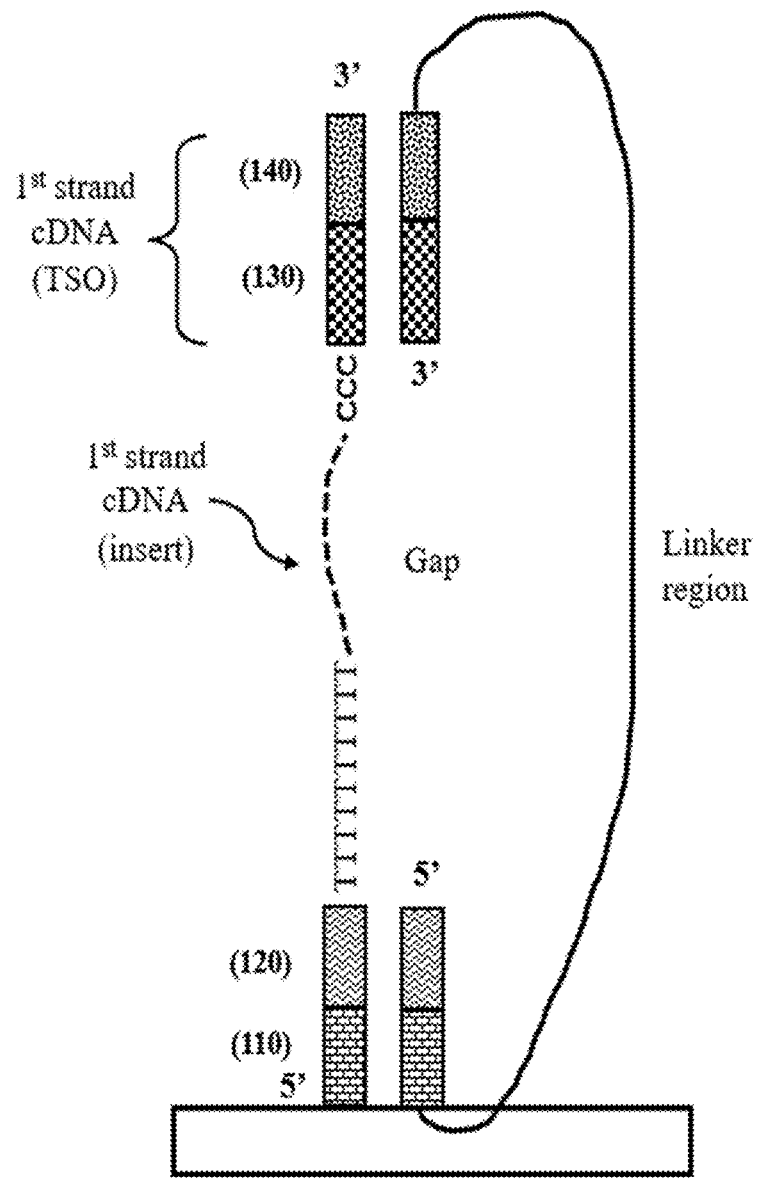
FIG. 17 is a schematic showing hybridizing a circularization oligonucleotide to the immobilized full length first stand cDNA to form a single stranded circular molecule with a gap.

In some embodiments, the methods for preparing spatially resolved nucleic acids further comprise step (f): contacting the retained immobilized full length first strand cDNA with a plurality of single stranded circularization oligonucleotides. In some embodiments, individual circularization oligonucleotides comprise: an adaptor sequence that is complementary to the universal binding site for a reverse sequencing primer (120); an adaptor sequence that is complementary to the universal surface capture primer sequence (110); a linker region; an adaptor sequence that is complementary to the universal binding site for surface pinning primer (140); and an adaptor sequence that is complementary to the universal binding site for forward sequencing primer (130) (e.g., see FIG. 17). In some embodiments, the circularization oligonucleotide lacks an adaptor sequence that is complementary to the universal surface capture primer sequence (110). The retained immobilized full length first strand cDNA are contacted with a plurality of single stranded circularization oligonucleotides under a condition suitable for the circularization oligonucleotide to hybridize to the universal adaptor sequences of the immobilized first strand cDNA but not hybridize to the RNA capture sequence, the cDNA insert region or the polyC tail. Hybridization of the circularization oligonucleotide to the immobilized full length first strand cDNA forms a single stranded circular molecule with a gap. In some embodiments, the linker region can include any one or any combination of two or more of: at least one sample index sequence for multiplexing; at least one unique molecular index (UMI) sequence for molecular tagging; and/or a universal binding site for a compaction oligonucleotide. In some embodiments, the sample index comprises 5-20 bases which can be used to distinguish polynucleotides (e.g., insert sequences) from different sample sources in a multiplex assay. In some embodiments, the unique molecular index (UMI) comprises 3-20 bases which can be used to uniquely identify individual nucleic acid molecules to which the UMI sequence is appended (e.g., molecular tagging). In some embodiments, the unique molecular index (UMI) comprises a random sequence.

Figure 18:
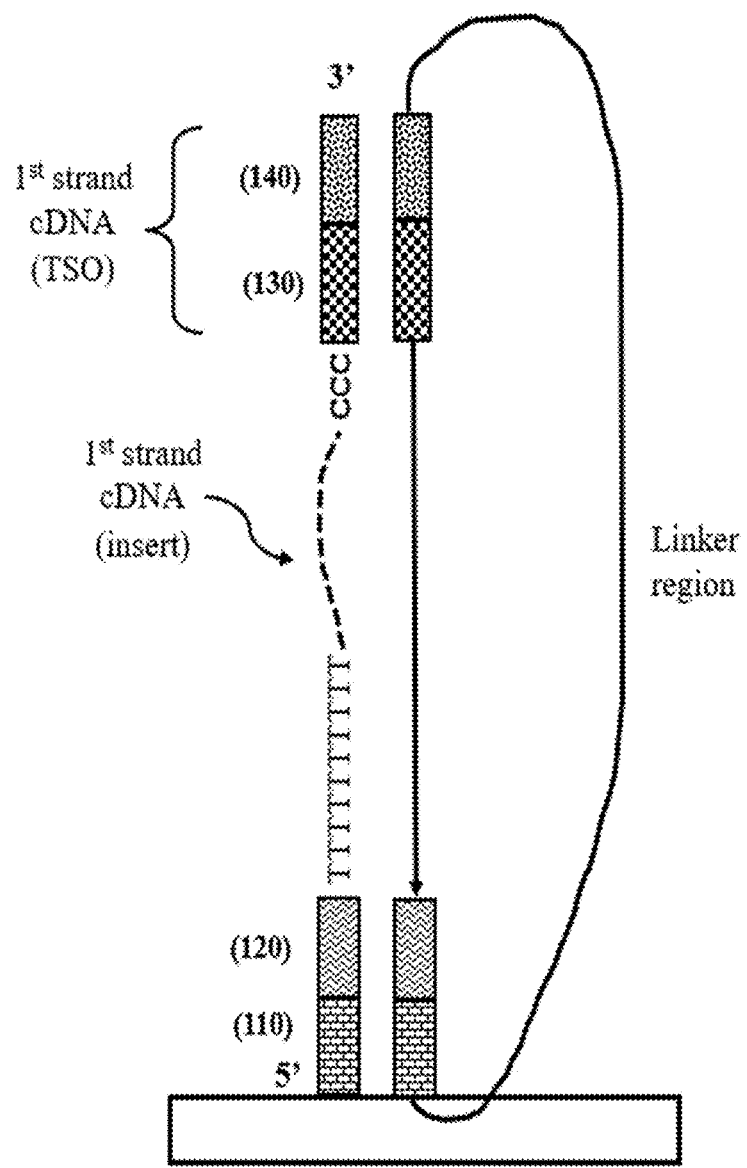
FIG. 18 is a schematic showing a polymerase-catalyzed extension reaction to fill in the gap resulting in a nick. A ligation reaction can be conducted to ligate the nick.

In some embodiments, the methods for preparing spatially resolved nucleic acids further comprise step (g): conducting a polymerase-catalyzed extension reaction to fill in the gap, using as a template strand the polyC tail region, the first strand cDNA insert region, and the RNA capture sequence region. The polymerase-catalyzed extension reaction forms a single stranded circularized molecule with a nick. In some embodiments, step (g) further comprises conducting an enzymatic ligation reaction to generate a single stranded, covalently closed circular molecule, which is hybridized to the immobilized full length first strand cDNA (e.g., see FIG. 18).

Figure 19:
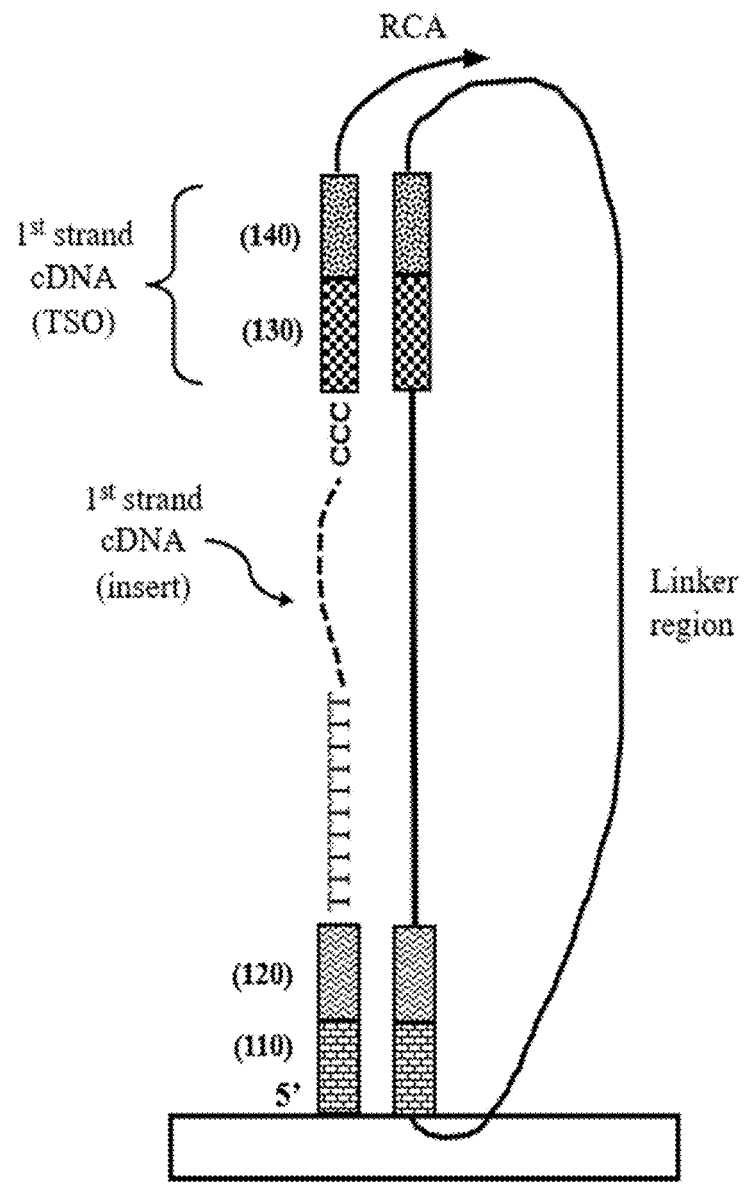
FIG. 19 is a schematic showing the initial stage of a rolling circle amplification reaction on the support.

In some embodiments, the methods for preparing spatially resolved nucleic acids further comprise step (h): conducting a rolling circle amplification reaction using the terminal 3' end of the immobilized full length 1$^{st}$ strand cDNA as an initiation site to generate nucleic acid concatemers immobilized to the support. In some embodiments, the rolling circle amplification reaction employs a DNA polymerase having a strand displacing activity and a plurality of nucleotides (e.g., dATP, dGTP, dCTP, dTTP and/or dUTP). The rolling circle amplification reaction can use the covalently closed circular molecule as a template strand to generate concatemers having a plurality of tandem repeat units, where each unit comprises: a linker region (or a complementary sequence thereof); a universal surface capture primer sequence (110) (or a complementary sequence thereof); a universal binding site for a reverse sequencing primer (120) (or a complementary sequence thereof); an RNA capture sequence (or a complementary sequence thereof); a first strand cDNA insert region (or a complementary sequence thereof); a polyC region (or a complementary sequence thereof); a universal binding site for forward sequencing primer (130) (or a complementary sequence thereof); and a universal binding site for surface pinning primer (140) (or a complementary sequence thereof) (e.g., see FIG. 19).

In some embodiments, the rolling circle amplification reaction of step (h) can be conducted in the presence or absence of a plurality of compaction oligonucleotides. In some embodiments, the compaction oligonucleotides comprise single stranded oligonucleotides having a first region at one end that hybridizes to a portion of a concatemer molecule and a second region at the other end that hybridizes to another portion of the same concatemer molecule, where hybridization of the compaction oligonucleotide to a given concatemer compacts the size and/or shape of the concatemer. In some embodiments, the 5' and 3' regions of the compaction oligonucleotide can hybridize to different portions of the same concatemer to pull together distal portions of the concatemer causing compaction of the concatemer to form a DNA nanoball. Additional descriptions of compaction oligonucleotides can be found below.

In some embodiments, the DNA polymerase having a strand displacing activity of step (h) can be selected from a group consisting of phi29 DNA polymerase, large fragment of Bst DNA polymerase, large fragment of Bsu DNA polymerase, and Bca (exo-) DNA polymerase, Klenow fragment of E. coli DNA polymerase, T5 polymerase, M-MuLV reverse transcriptase, HIV viral reverse transcriptase, or Deep Vent DNA polymerase. In some embodiments, the phi29 DNA polymerase can be wild type phi29 DNA polymerase (e.g., MagniPhi from Expedeon), or variant EquiPhi29 DNA polymerase (e.g., from Thermo Fisher Scientific), and chimeric QualiPhi DNA polymerase (e.g., from 4basebio).

In some embodiments, the methods for preparing spatially resolved nucleic acids further comprise step (i): sequencing the plurality of immobilized concatemers. In some embodiments, the sequencing of step (i) comprises sequencing at least a portion of individual immobilized concatemers to identify the individual captured RNA. In some embodiments, the location of individual sequenced concatemers on the coated support corresponds to the spatial location of the individual RNAs from the cellular sample. In some embodiments, the sequencing of step (i) comprises sequencing at least a portion of individual immobilized concatemers including sequencing at least a portion of the cDNA insert portion of the concatemer that corresponds to the captured RNA. In some embodiments, sequencing the immobilized concatemers on the low non-specific binding coating of step (a) can provide a surface having a high contrast-to-noise (CNR) ratio during sequencing. The high contrast-to-noise (CNR) ratio can provide improved sensitivity and specificity for accurate spatial location of the concatemers on the support which corresponds to accurate location of the RNA transcripts of interest from the cellular sample. In some embodiments, the sequencing of step (i) comprises use of fluorescently labeled nucleotide reagents and sequencing polymerases. In some embodiments, the sequencing of step (i) comprises imaging to detect fluorescent signals emitted from the immobilized concatemers during a sequencing reaction which employs fluorescently labeled nucleotide reagents and sequencing polymerases.

In some embodiments, the plurality of immobilized concatemers can be sequenced using any nucleic acid sequencing method that employs labeled or non-labeled chain terminating nucleotides, where the chain terminating nucleotides include a 3'-O-azido group (or 3'-O-methylazido group) or any other type of bulky blocking group at the sugar 3' position. In some embodiments, the concatemer template molecules can be sequenced using a two-stage sequencing method using labeled multivalent molecules and non-labeled chain terminating nucleotides. In some embodiments, the concatemer template molecules can be sequenced using a sequencing-by-synthesis (SBS) method which employs labeled chain-terminating nucleotides. In some embodiments, the concatemer template molecules can be sequenced using a sequencing-by-binding methods (SBB) which employ non-labeled chain-terminating nucleotides. In some embodiments, the concatemer template molecules can be sequenced using phosphate-chain labeled nucleotides. These various sequencing methods are described below.

In some embodiments, the immobilized concatemers can be detected by contacting the immobilized concatemers with a plurality of oligonucleotide probes that are labeled with a detectable reporter moiety under a condition that is suitable for selective hybridization of the probes to the immobilized concatemers. In some embodiments, the contacting step can further include an imaging step. In some embodiments, the oligonucleotide probes comprise a target-specific sequence such as a sequence that is complementary to any portion of the cDNA insert region. In some embodiments, the oligonucleotide probes comprise a sequence that can hybridize with a universal adaptor sequence including any of the universal binding site for a surface capture primer, a universal binding site for a surface pinning primer, a universal binding sequence for a forward sequencing primer, a universal binding sequence for a reverse sequencing primer, a sample barcode sequence and/or a unique molecular index sequence.

In some embodiments, the methods for preparing spatially resolved nucleic acids further comprise step (j): determining the location of individual concatemers on the coated support which corresponds to the spatial location of the individual RNAs eluted from the cellular sample. In some embodiments, the sequencing and imaging of step (i) can be used to determine the location of individual concatemers immobilized to the coated support which corresponds to the spatial location of the individual RNAs eluted from the cellular sample.

Cellular Sample

In any of the methods described herein, the cellular sample refers to a single cell, a whole cell, a plurality of cells, a tissue, an organ, an organism, or section of any of these cellular samples. The cellular sample can be extracted (e.g., biopsied) from an organism, or obtained from a cell culture grown in liquid or in a culture dish. The cellular sample comprises a sample that is fresh, frozen, fresh frozen, or archived (e.g., formalin-fixed paraffin-embedded; FFPE). The cellular sample can be embedded in a wax, paraffin, resin, epoxy or agar. The cellular sample can be fixed, for example in any one or any combination of two or more of acetone, ethanol, methanol, formaldehyde, paraformaldehyde-Triton or glutaraldehyde. The cellular sample can be sectioned or non-sectioned. The cellular sample can be stained, de-stained or non-stained.

In some embodiments, the cellular sample can be obtained from a virus, fungus, prokaryote or eukaryote. In some embodiments, the cellular sample can be obtained from an animal, insect or plant. In some embodiments, the cellular sample comprises one or more virally-infected cells.

In some embodiments, the cellular sample can be obtained from any organism including human, simian, ape, canine, feline, bovine, equine, murine, porcine, caprine, lupine, ranine, piscine, plant, insect or bacteria.

In some embodiments, the cellular sample can be obtained from any organ including head, neck, brain, breast, ovary, cervix, colon, rectum, endometrium, gallbladder, intestines, bladder, prostate, testicles, liver, lung, kidney, esophagus, pancreas, thyroid, pituitary, thymus, skin, heart, larynx, or other organs.

In any of the methods described herein, the cellular sample harbors a plurality of RNA which can be eluted onto the plurality of surface capture primers immobilized to the coated support. In some embodiments, the eluted RNA include target RNA and/or non-target RNA. In some embodiments, the eluted RNA comprises wild type RNA, mutant RNA and/or splice variant RNA. In some embodiments, the eluted RNA comprises pre-spliced RNA, partially spliced RNA, and/or fully spliced RNA. In some embodiments, the eluted RNA comprises coding RNA, non-coding RNA, mRNA, tRNA, alternative rRNA, rRNA, microRNA (miRNA), mature microRNA, immature microRNA, lncRNA, ncRNA and/or intron RNA. In some embodiments, the eluted RNA comprises housekeeping RNA, cell-specific RNA, tissue-specific RNA or disease-specific RNA. In some embodiments, the eluted RNA comprises RNA expressed by one or more cells in response to a stimulus such as heat, light, a chemical or a drug. In some embodiments, the eluted RNA comprises RNA found in healthy cells or diseased cells. In some embodiments, the eluted RNA comprises RNA transcribed from transgenic DNA sequences that are introduced into the cellular sample using recombinant DNA procedures. For example, the RNA can be transcribed from a transgenic DNA sequence that is controlled by an inducible or constitutive promoter sequence. In some embodiments, the eluted RNA comprises RNA that is transcribed from DNA sequences that are not transgenic.

Permeabilization

In any of the methods described herein, the cellular sample can be permeabilized to permit the nucleic acids within the sample, including the target nucleic acid molecule (e.g., RNA and/or DNA), to migrate from inside the cell(s)

to the plurality of capture oligonucleotides that are immobilized on a support. The cellular sample can be contacted with one or more permeabilizing agents, including organic solvents, detergents, chemical compounds, cross-linking agents and/or enzymes. In some embodiments, the organic solvents comprise acetone, ethanol, and methanol. In some embodiments, the detergents comprise saponin, Triton X-100, Tween-20, or sodium dodecyl sulfate (SDS), or N-lauroylsarcosine sodium salt solution. In some embodiments, the cross-linking agent comprises paraformaldehyde. In some embodiments, the enzyme comprises trypsin, pepsin or protease (e.g. proteinase K). In some embodiments, the cellular sample can be permeabilized using an alkaline condition, or an acidic condition with a protease enzyme. In some embodiments, the target nucleic acid molecule from the cellular sample is hybridized (captured) on the capture oligonucleotides immobilized on the support (or the support coating) in a manner that preserves spatial location information of the target nucleic acid molecule in the cellular sample.

In any of the methods described herein, the cellular sample comprises a permeabilized cellular sample. In some embodiments, the methods comprise treating the cellular sample with a permeabilization reagent that alters the cell membrane to permit penetration of experimental reagents into the cells. For example, the permeabilization reagent removes membrane lipids from the cell membrane. In some embodiments, the cellular sample can be treated with a permeabilization reagent which comprises any combination of an organic solvent, detergent, chemical compound, cross-linking agent and/or enzyme. In some embodiments, the organic solvents comprise acetone, ethanol, and methanol. In some embodiments, the detergents comprise saponin, Triton X-100, Tween-20, sodium dodecyl sulfate (SDS), an N-lauroylsarcosine sodium salt solution, or a nonionic polyoxyethylene surfactant (e.g., NP40). In some embodiments, the cross-linking agent comprises paraformaldehyde. In some embodiments, the enzyme comprises trypsin, pepsin or protease (e.g. proteinase K). In some embodiments, the cells can be permeabilized using an alkaline condition, or an acidic condition with a protease enzyme. In some embodiments, the permeabilization reagent comprises water and/or PBS.

For example, the fixed cells can be permeabilized with 70% ethanol for about 30-60 minutes, and the permeabilizing reagent can be exchanged with PBS-T (e.g., PBS with 0.05% Tween-20). In some embodiments, the cells can be post-fixed with 3% paraformaldehyde and 0.1% glutaraldehyde for about 30-60 minutes, and washed with PBS-T multiple times.

Cell Fixation

In any of the methods described herein, the cellular sample comprises a fixed cellular sample. In some embodiments, the cellular sample can be treated with a fixation reagent (e.g., a fixing reagent) that preserves the cell and its contents to inhibit degradation and can inhibit cell lysis. For example, the fixation reagent can preserve RNA harbored by the cellular sample. In some embodiments, the fixation reagent inhibits loss of nucleic acids from the cellular sample.

In some embodiments, the fixation reagent can cross-link the RNA to prevent the RNA from escaping the cellular sample. In some embodiments, a cross-linking fixation reagent comprises any combination of an aldehyde, formaldehyde, paraformaldehyde, formalin, glutaraldehyde, imidoesters, N-hydroxysuccinimide esters (NETS) and/or glyoxal (a bifunctional aldehyde).

In some embodiments, the fixation reagent comprises at least one alcohol, including methanol or ethanol. In some embodiments, the fixation reagent comprises at least one ketone, including acetone. In some embodiments, the fixation reagent comprises acetic acid, glacial acetic acid and/or picric acid. In some embodiments, the fixation reagent comprises mercuric chloride. In some embodiments, the fixation reagent comprises a zinc salt comprising zinc sulphate or zinc chloride. In some embodiments, the fixation reagent can denature polypeptides.

In some embodiments, the fixation reagent comprises 4% w/v of paraformaldehyde to water/PBS. In some embodiments, the fixation reagent comprises 10% of 35% formaldehyde at a neutral pH. In some embodiments, the fixation reagent comprises 2% v/v of glutaraldehyde to water/PBS. In some embodiments, the fixation reagent comprises 25% of 37% formaldehyde solution, 70% picric acid and 5% acetic acid.

In some embodiments, the cellular sample can be fixed on the support with 4% paraformaldehyde for about 30-60 minutes and washed with PBS.

Compaction Oligonucleotides

In some embodiments, the rolling circle amplification reaction can be conducted in the presence of a plurality of compaction oligonucleotides which, when hybridized to a concatemer molecule, compacts the size and/or shape of the concatemer to form a compact nanoball. In some embodiments, the compaction oligonucleotides comprise single stranded oligonucleotides having a first region at one end that hybridizes to a portion of a concatemer molecule and a second region at the other end that hybridizes to another portion of the same concatemer molecule, where hybridization of the compaction oligonucleotide to a given concatemer compacts the size and/or shape of the concatemer.

In some embodiments, the compaction oligonucleotides include a 5' region, an optional internal region (intervening region), and a 3' region. The 5' and 3' regions of the compaction oligonucleotide can hybridize to different portions of the same concatemer to pull together distal portions of the concatemer causing compaction of the concatemer to form a DNA nanoball. For example, and without limitation, the 5' region of the compaction oligonucleotide is designed to hybridize to a first portion of the concatemer molecule (e.g., a universal compaction oligonucleotide binding site), and the 3' region of the compaction oligonucleotide is designed to hybridized to a second portion of the concatemer molecule (e.g., a universal compaction oligonucleotide binding site). Inclusion of compaction oligonucleotides during RCA can promote formation of DNA nanoballs having tighter size and shape compared to concatemers generated in the absence of the compaction oligonucleotides. The compact and stable characteristics of the DNA nanoballs improves sequencing accuracy, for example, by increasing signal intensity and the nanoballs retain their shape and size during multiple sequencing cycles.

In some embodiments, the compaction oligonucleotides comprise single stranded oligonucleotides comprising DNA, RNA, or a combination of DNA and RNA. The compaction oligonucleotides can be any length, including 20-150 nucleotides, e.g., 20, 30, 40, 50, 60, 70, 80, 90, 100, 110, 120, 130, 140, or 150 nucleotides, or any range therebetween. In some embodiments, the compaction oligonucleotides can be 30-100 nucleotides in length. In some embodiments, the compaction oligonucleotides can be 40-80 nucleotides in length. In some embodiments, the compaction oligonucleotides can be 80-1200 nucleotides in length.

In some embodiments, the compaction oligonucleotides comprises a 5' region and a 3' region, and optionally an intervening region between the 5' and 3' regions. The intervening region can be any length, for example about 2-20 nucleotides in length, e.g., 2, 3, 4, 5, 6, 7, 8, 9, 10, 11, 12, 13, 14, 15, 16, 17, 18, 19, or 20, or any range therebetween. The intervening region comprises a homopolymer having consecutive identical bases (e.g., AAA, GGG, CCC, TTT, or UUU). The intervening region comprises a non-homopolymer sequence.

In some embodiments, the 5' region of the compaction oligonucleotides can be wholly complementary or partially complementary along its length to a first portion of a concatemer molecule. In some embodiments, the 3' region of the compaction oligonucleotides can be wholly complementary or partially complementary along its length to a second portion of a concatemer molecule. In some embodiments, the 5' region of the compaction oligonucleotides can hybridize to a first universal sequence portion of a concatemer molecule. In some embodiments, the 3' region of the compaction oligonucleotides can hybridize to a second universal sequence portion of a concatemer molecule.

In some embodiments, the 5' region of the compaction oligonucleotide can have the same sequence as the 3' region. The 5' region of the compaction oligonucleotide can have a sequence that is different from the 3' region. In some embodiments, the 3' region of the compaction oligonucleotide can have a sequence that is a reverse sequence of the 5' region. In some embodiments, the 5' region of the compaction oligonucleotide can have a sequence that is a reverse sequence of the 3' region.

In some embodiments, the 3' region of any of the compaction oligonucleotides can include an additional three bases at the terminal 3' end which comprises 2'-O-methyl RNA bases (e.g., designated mUmUmU) or the terminal 3' end lacks additional 2'-O-methyl RNA bases.

In some embodiments, the compaction oligonucleotides comprise one or more modified bases or linkages at their 5' or 3' ends to confer certain functionalities. In some embodiments, the compaction oligonucleotides comprise at least one phosphorothioate linkages at their 5' and/or 3' ends to confer exonuclease resistance. In some embodiments, at least one nucleotide at or near the 3' end comprises a 2' fluoro base which confers exonuclease resistance. In some embodiments, the 3' end of the compaction oligonucleotides is non-extendible. In some embodiments, the 3' end of the compaction oligonucleotides comprise at least one 2'-O-methyl RNA base which blocks polymerase-catalyzed extension. For example, the 3' end of the compaction oligonucleotide comprises three bases comprising 2'-O-methyl RNA base (e.g., designated mUmUmU). In some embodiments, the compaction oligonucleotides comprise a 3' inverted dT at their 3' ends which blocks polymerase-catalyzed extension. In some embodiments, the compaction oligonucleotides comprise 3' phosphorylation which blocks polymerase-catalyzed extension. In some embodiments, the internal region of the compaction oligonucleotides comprise at least one locked nucleic acid (LNA) which increases the thermal stability of duplexes formed by hybridizing a compaction oligonucleotide to a concatemer molecule. In some embodiments, the compaction oligonucleotides comprise a phosphorylated 5' end (e.g., using a polynucleotide kinase).

In some embodiments, the compaction oligonucleotides includes an additional three bases at the terminal 3' end which comprises 2'-O-methyl RNA bases (e.g., designated mUmUmU) or the terminal 3' end lacks additional 2'-O-methyl RNA bases.

Figure 20:
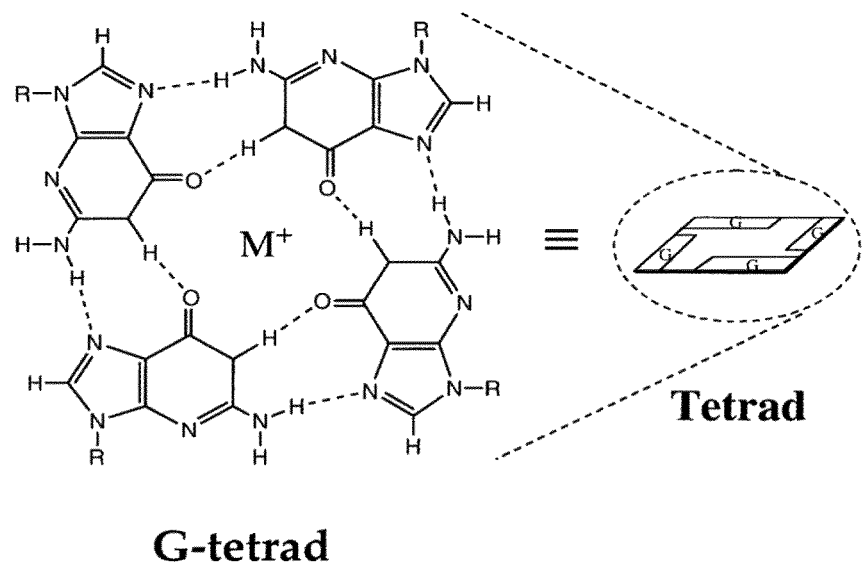
FIG. 20 is a schematic of a guanine tetrad (e.g., G-tetrad).

In some embodiments, the compaction oligonucleotides can include at least one region having consecutive guanines. For example, the compaction oligonucleotides can include at least one region having 2, 3, 4, 5, 6 or more consecutive guanines. In some embodiments, the compaction oligonucleotides comprise four consecutive guanines which can form a guanine tetrad structure (see FIG. 20). The guanine tetrad structure can be stabilized via Hoogsteen hydrogen bonding. The guanine tetrad structure can be stabilized by a central cation including potassium, sodium, lithium, rubidium or cesium.

Figure 21:
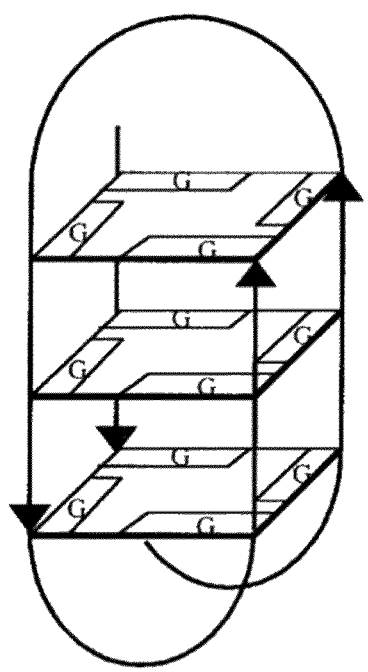
FIG. 21 is a schematic of an exemplary intramolecular G-quadruplex structure.

At least one compaction oligonucleotide can form a guanine tetrad (FIG. 20) and hybridize to the universal binding sequences in a concatemer which can cause the concatemer to fold to form an intramolecular G-quadruplex structure (FIG. 21). The concatemers can self-collapse to form compact nanoballs. Formation of the guanine tetrads and G-quadruplexes in the nanoballs may increase the stability of the nanoballs to retain their compact size and shape which can withstand changes in pH, temperature and/or repeated flows of reagents during sequencing inside the cellular sample.

In some embodiments, the rolling circle amplification reaction comprises a plurality of compaction oligonucleotides having the same sequence. Alternatively, the rolling circle amplification reaction comprises a plurality of compaction oligonucleotides having a mixture of two or more different sequences.

In some embodiments, the immobilized concatemer template molecule can self-collapse into a compact nucleic acid nanoball. The nanoballs can be imaged and a FWHM measurement can be obtained to give the shape/size of the nanoballs.

In some embodiments, inclusion of compaction oligonucleotides in the rolling circle amplification reaction can promote collapsing of a concatemer into a DNA nanoball. Conducting RCA with compaction oligonucleotides helps retain the compact size and shape of a DNA nanoball during multiple sequencing cycles which can improve FWHM (full width half maximum) of a spot image of the DNA nanoball inside a cellular sample. In some embodiments, the DNA nanoball does not unravel during multiple sequencing cycles. In some embodiments, the spot image of the DNA nanoball does not enlarge during multiple sequencing cycles. In some embodiments, the spot image of the DNA nanoball remains a discrete spot during multiple sequencing cycles. The spot image can be represented as a Gaussian spot and the size can be measured as a FWHM. A smaller spot size as indicated by a smaller FWHM typically correlates with an improved image of the spot. In some embodiments, the FWHM of a nanoball spot can be about 10 µm or smaller.

Methods for Sequencing

The present disclosure provides methods for sequencing a plurality of concatemer template molecules which are immobilized to a support, for example any of the immobilized concatemer molecules described herein. In some embodiments, the sequencing reactions employ a plurality of sequencing primers, a plurality of sequencing polymerases, and nucleotide reagents comprising any one or any combination of nucleotides and/or multivalent molecules. In some embodiments, the nucleotide reagents comprise canonical nucleotides. In some embodiments, the nucleotide reagents comprise nucleotide analogs comprise detectably labeled nucleotides. In some embodiments, the nucleotide reagents comprise nucleotides carrying a removable or non-removable chain terminating moiety. In some embodiments, the nucleotide reagents comprise multivalent molecules each comprising a central core attached to multiple polymer arms each having a nucleotide moiety at the end of the arms. In some embodiments, the sequencing reactions employ binding non-labeled nucleotides without incorporation. In some embodiments, the sequencing reactions employ incorporating non-labeled nucleotide analogs. In some embodiments, the sequencing reactions employ incorporating detectably labeled nucleotides having removable chain terminating moiety. In some embodiments, the sequencing reactions employ a two-stage sequencing reaction comprising binding detectably labeled multivalent molecules without incorporation, and incorporating nucleotide analogs. In some embodiments, the sequencing reactions employ phosphate chain-labeled nucleotides.

Methods for Sequencing Using Nucleotide Analogs

In some aspects, the present disclosure provides methods for sequencing, comprising step (a): contacting a sequencing polymerase to (i) a nucleic acid concatemer molecule and (ii) a nucleic acid primer (e.g., a forward or reverse sequencing primer), wherein the contacting is conducted under a condition suitable to bind the sequencing polymerase to the nucleic acid concatemer molecule which is hybridized to the nucleic acid primer, wherein the nucleic acid concatemer molecule hybridized to the nucleic acid primer forms the nucleic acid duplex. In some embodiments, the sequencing polymerase comprises a recombinant mutant sequencing polymerase. In some embodiments, the primer comprises a 3' extendible end.

In some embodiments, the methods for sequencing further comprise step (b): contacting the sequencing polymerase with a plurality of nucleotides under a condition suitable for binding at least one nucleotide to the sequencing polymerase which is bound to the nucleic acid duplex and suitable for polymerase-catalyzed nucleotide incorporation. In some embodiments, the sequencing polymerase is contacted with the plurality of nucleotides in the presence of at least one catalytic cation comprising magnesium and/or manganese. In some embodiments, the plurality of nucleotides comprises at least one nucleotide analog having a chain terminating moiety at the sugar 2' or 3' position. In some embodiments, the plurality of nucleotides comprises at least one nucleotide that lacks a chain terminating moiety.

In some embodiments, the methods for sequencing further comprise step (c): incorporating at least one nucleotide into the 3' end of the extendible primer under a condition suitable for incorporating the at least one nucleotide. In some embodiments, the suitable conditions for nucleotide binding the polymerase and for incorporation the nucleotide can be the same or different. In some embodiments, conditions suitable for incorporating the nucleotide comprise inclusion of at least one catalytic cation comprising magnesium and/or manganese. In some embodiments, the at least one nucleotide binds the sequencing polymerase and incorporates into the 3' end of the extendible primer. In some embodiments, the incorporating the nucleotide into the 3' end of the primer in step (c) comprises a primer extension reaction.

In some embodiments, the methods for sequencing further comprise step (d): repeating the incorporating at least one nucleotide into the 3' end of the extendible primer of step (c) at least once. In some embodiments, the plurality of nucleotides comprises a plurality of nucleotides labeled with detectable reporter moiety. The detectable reporter moiety comprises a fluorophore. In some embodiments, the fluorophore is attached to the nucleotide base. In some embodiments, the fluorophore is attached to the nucleotide base with a linker which is cleavable/removable from the base. In some embodiments, at least one of the nucleotides in the plurality is not labeled with a detectable reporter moiety. In some embodiments, a particular detectable reporter moiety (e.g., fluorophore) that is attached to the nucleotide can correspond to the nucleotide base (e.g., dATP, dGTP, dCTP, dTTP or dUTP) to permit detection and identification of the nucleotide base. In some embodiments, the method further comprises detecting the at least one incorporated nucleotide at step (c) and/or (d). In some embodiments, the method further comprises identifying the at least one incorporated nucleotide at step (c) and/or (d). In some embodiments, the sequence of the nucleic acid concatemer molecule can be determined by detecting and identifying the nucleotide that binds the sequencing polymerase, thereby determining the sequence of the concatemer molecule. In some embodiments, the sequence of the nucleic acid concatemer molecule can be determined by detecting and identifying the nucleotide that incorporates into the 3' end of the primer, thereby determining the sequence of the concatemer molecule.

In some embodiments, in the methods for sequencing, the plurality of sequencing polymerases that are bound to the nucleic acid duplexes comprise a plurality of complexed polymerases, having at least a first and second complexed polymerase, wherein (a) the first complexed polymerases comprises a first sequencing polymerase bound to a first nucleic acid duplex comprising a first nucleic acid template sequence which is hybridized to a first nucleic acid primer, (b) the second complexed polymerases comprises a second sequencing polymerase bound to a second nucleic acid duplex comprising a second nucleic acid template sequence which is hybridized to a second nucleic acid primer, (c) the first and second nucleic acid template sequences comprise the same or different sequences, (d) the first and second nucleic acid concatemers are clonally-amplified, (e) the first and second primers comprise extendible 3' ends or non-extendible 3' ends, and (f) the plurality of complexed polymerases are immobilized to a support. In some embodiments, the density of the plurality of complexed polymerases is about $10^2$-$10^{15}$ (e.g., $10^2$-$10^{15}$ or more, e.g., $10^2$, $10^3$, $10^4$, $10^5$, $10^6$, $10^7$, $10^8$, $10^9$, $10^{10}$ $10^{11}$, $10^{12}$, $10^{13}$, $10^{14}$, $10^{15}$) complexed polymerases per mm$^2$ that are immobilized to the support.

Two-Stage Sequencing Methods for Nucleic Acids

In some aspects, the present disclosure provides a two-stage method for sequencing nucleic acid molecules. In some embodiments, the first stage generally comprises binding multivalent molecules to complexed polymerases to form multivalent-complexed polymerases, and detecting the multivalent-complexed polymerases.

In some embodiments, the first stage comprises step (a): contacting a plurality of a first sequencing polymerase to (i) a plurality of nucleic acid concatemer molecules and (ii) a plurality of nucleic acid primers (e.g., forward or reverse sequencing primers), wherein the contacting is conducted under a condition suitable to bind the plurality of first sequencing polymerases to the plurality of nucleic acid concatemer molecules and the plurality of nucleic acid primers thereby forming a plurality of first complexed polymerases each comprising a first sequencing polymerase bound to a nucleic acid duplex wherein the nucleic acid duplex comprises a nucleic acid concatemer molecule hybridized to a nucleic acid primer. In some embodiments, the first polymerase comprises a recombinant mutant sequencing polymerase.

In some embodiments, in the methods for sequencing concatemer molecules, the primer comprises a 3' extendible end or a 3' non-extendible end. In some embodiments, the plurality of nucleic acid concatemer molecules comprise amplified template molecules (e.g., clonally amplified template molecules). In some embodiments, the plurality of nucleic acid concatemer molecules comprise one copy of a target sequence of interest. In some embodiments, the plurality of nucleic acid molecules comprise two or more tandem copies of a target sequence of interest (e.g., concatemers). In some embodiments, the nucleic acid concatemer molecules in the plurality of nucleic acid concatemer molecules comprise the same target sequence of interest or different target sequences of interest. In some embodiments, the plurality of nucleic acid concatemer molecules and/or the plurality of nucleic acid primers are in solution or are immobilized to a support. In some embodiments, when the plurality of nucleic acid concatemer molecules and/or the plurality of nucleic acid primers are immobilized to a support, the binding with the first sequencing polymerase generates a plurality of immobilized first complexed polymerases. In some embodiments, the plurality of nucleic acid concatemer molecules and/or nucleic acid primers are immobilized to $10^2$-$10^{15}$ different sites on a support (e. g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites). In some embodiments, the binding of the plurality of concatemer molecules and nucleic acid primers with the plurality of first sequencing polymerases generates a plurality of first complexed polymerases immobilized to $10^2$-$10^{15}$ different sites on the support (e.g., $10^2$-$10^{15}$ sites or more, e.g., $10^2$ sites, $10^3$ sites, $10^4$ sites, $10^5$ sites, $10^6$ sites, $10^7$ sites, $10^8$ sites, $10^9$ sites, $10^{10}$ sites, $10^{11}$ sites, $10^{12}$ sites, $10^{13}$ sites, $10^{14}$ sites, $10^{15}$ sites). In some embodiments, the plurality of immobilized first complexed polymerases on the support are immobilized to pre-determined or to random sites on the support. In some embodiments, the plurality of immobilized first complexed polymerases are in fluid communication with each other to permit flowing a solution of reagents (e.g., enzymes including sequencing polymerases, multivalent molecules, nucleotides, and/or divalent cations) onto the support so that the plurality of immobilized complexed polymerases on the support are reacted with the solution of reagents in a massively parallel manner.

In some embodiments, the methods for sequencing further comprise step (b): contacting the plurality of first complexed polymerases with a plurality of multivalent molecules to form a plurality of multivalent-complexed polymerases (e.g., binding complexes). In some embodiments, individual multivalent molecules in the plurality of multivalent molecules comprise a core attached to multiple nucleotide arms and each nucleotide arm is attached to a nucleotide (e.g., nucleotide unit) (e.g., FIGS. 2-6). In some embodiments, the contacting of step (b) is conducted under a condition suitable for binding complementary nucleotide units of the multivalent molecules to at least two of the plurality of first complexed polymerases thereby forming a plurality of multivalent-complexed polymerases. In some embodiments, the condition is suitable for inhibiting polymerase-catalyzed incorporation of the complementary nucleotide units into the primers of the plurality of multivalent-complexed polymerases. In some embodiments, the plurality of multivalent molecules comprises at least one multivalent molecule having multiple nucleotide arms (e.g., FIGS. 2-6) each attached with a nucleotide analog (e.g., nucleotide analog unit), where the nucleotide analog includes a chain terminating moiety at the sugar 2' and/or 3' position. In some embodiments, the plurality of multivalent molecules comprises at least one multivalent molecule comprising multiple nucleotide arms each attached with a nucleotide unit that lacks a chain terminating moiety. In some embodiments, at least one of the multivalent molecules in the plurality of multivalent molecules is labeled with a detectable reporter moiety. Any portion of the multivalent molecule can be labeled including the core, nucleotide arm or nucleo-base. In some embodiments, the detectable reporter moiety comprises a fluorophore. In some embodiments, the contacting of step (b) is conducted in the presence of at least one non-catalytic cation comprising strontium, barium and/or calcium.

In some embodiments, the methods for sequencing further comprise step (c): detecting the plurality of multivalent-complexed polymerases. In some embodiments, the detecting includes detecting the multivalent molecules that are bound to the complexed polymerases, where the complementary nucleotide units of the multivalent molecules are bound to the primers but incorporation of the complementary nucleotide units is inhibited. In some embodiments, the multivalent molecules are labeled with a detectable reporter moiety to permit detection. In some embodiments, the labeled multivalent molecules comprise a fluorophore attached to the core, linker and/or nucleotide unit of the multivalent molecules.

In some embodiments, the methods for sequencing further comprise step (d): identifying the base of the complementary nucleotide units that are bound to the plurality of first complexed polymerases, thereby determining the sequence of the concatemer molecule. In some embodiments, the multivalent molecules are labeled with a detectable reporter moiety that corresponds to the particular nucleotide units attached to the nucleotide arms to permit identification of the complementary nucleotide units (e.g., nucleotide base adenine, guanine, cytosine, thymine or uracil) that are bound to the plurality of first complexed polymerases.

In some embodiments, the second stage of the two-stage sequencing method generally comprises nucleotide incorporation. In some embodiments, the methods for sequencing further comprise step (e): dissociating the plurality of multivalent-complexed polymerases and removing the plurality of first sequencing polymerases and their bound multivalent molecules, and retaining the plurality of nucleic acid duplexes.

In some embodiments, the methods for sequencing further comprises step (f): contacting the plurality of the retained nucleic acid duplexes of step (e) with a plurality of second sequencing polymerases, wherein the contacting is conducted under a condition suitable for binding the plurality of second sequencing polymerases to the plurality of the retained nucleic acid duplexes, thereby forming a plurality of second complexed polymerases each comprising a second sequencing polymerase bound to a nucleic acid duplex. In some embodiments, the second sequencing polymerase comprises a recombinant mutant sequencing polymerase.

In some embodiments, the plurality of first sequencing polymerases of step (a) have an amino acid sequence that is 100% identical to the amino acid sequence as the plurality of the second sequencing polymerases of step (f). In some embodiments, the plurality of first sequencing polymerases of step (a) have an amino acid sequence that differs from the amino acid sequence of the plurality of the second sequencing polymerases of step (f).

In some embodiments, the methods for sequencing further comprise step (g): contacting the plurality of second complexed polymerases with a plurality of nucleotides, wherein the contacting is conducted under a condition suitable for binding complementary nucleotides from the plurality of nucleotides to at least two of the second complexed polymerases thereby forming a plurality of nucleotide-complexed polymerases. In some embodiments, the contacting of step (g) is conducted under a condition that is suitable for promoting polymerase-catalyzed incorporation of the bound complementary nucleotides into the primers of the nucleotide-complexed polymerases thereby forming a plurality of nucleotide-complexed polymerases. In some embodiments, the incorporating the nucleotide into the 3' end of the primer in step (g) comprises a primer extension reaction. In some embodiments, the contacting of step (g) is conducted in the presence of at least one catalytic cation comprising magnesium and/or manganese. In some embodiments, the contacting of step (g) is conducted in the presence of magnesium and/or manganese. In some embodiments, the plurality of nucleotides comprises native nucleotides (e.g., non-analog nucleotides) or nucleotide analogs. In some embodiments, the plurality of nucleotides comprise a 2' and/or 3' chain terminating moiety which is removable or is not removable. In some embodiments, the plurality of nucleotides comprises a plurality of nucleotides labeled with detectable reporter moiety. The detectable reporter moiety may comprise a fluorophore. In some embodiments, the fluorophore is attached to the nucleotide base. In some embodiments, the fluorophore is attached to the nucleotide base with a linker which is cleavable/removable from the base or is not removable from the base. In some embodiments, a particular detectable reporter moiety (e.g., fluorophore) that is attached to the nucleotide can correspond to the nucleotide base (e.g., dATP, dGTP, dCTP, dTTP or dUTP) to permit detection and identification of the nucleotide base. In some embodiments, at least one of the nucleotides in the plurality is not labeled with a detectable reporter moiety. In some embodiments, the plurality of nucleotides is not labeled with a detectable reporter moiety.

In some embodiments, the methods for sequencing further comprise step (h): when the nucleotides are labeled with a detectable reporter moiety, step (h) comprises detecting the complementary nucleotides which are incorporated into the primers of the nucleotide-complexed polymerases. In some embodiments, the plurality of nucleotides is labeled with a detectable reporter moiety to permit detection. In some embodiments, in the methods for sequencing concatemer molecules, when the nucleotides are non-labeled then the detecting step is omitted.

In some embodiments, the methods for sequencing further comprise step (i): when the nucleotides are labeled with a detectable reporter moiety, step (i) comprises identifying the bases of the complementary nucleotides which are incorporated into the primers of the nucleotide-complexed polymerases. In some embodiments, the identification of the incorporated complementary nucleotides in step (i) can be used to confirm the identity of the complementary nucleotides of the multivalent molecules that are bound to the plurality of first complexed polymerases in step (d). In some embodiments, the identifying of step (i) can be used to determine the sequence of the nucleic acid concatemer molecules. In some embodiments, in the methods for sequencing concatemer molecules, when the nucleotides are non-labeled then the identifying step is omitted.

In some embodiments, the methods for sequencing further comprise step (j): removing the chain terminating moiety from the incorporated nucleotide when step (g) is conducted by contacting the plurality of second complexed polymerases with a plurality of nucleotides that comprise at least one nucleotide having a 2' and/or 3' chain terminating moiety.

In some embodiments, the methods for sequencing further comprise step (k): repeating steps (a)-(j) at least once. In some embodiments, the sequence of the nucleic acid concatemer molecules can be determined by detecting and identifying the multivalent molecules that bind the sequencing polymerases but do not incorporate into the 3' end of the primer at steps (c) and (d). In some embodiments, the sequence of the nucleic acid concatemer molecule can be determined (or confirmed) by detecting and identifying the nucleotide that incorporates into the 3' end of the primer at steps (h) and (i).

In some embodiments, in any of the methods for sequencing nucleic acid molecules, the binding of the plurality of first complexed polymerases with the plurality of multivalent molecules forms at least one avidity complex, the method comprising the steps: (a) binding a first nucleic acid primer, a first sequencing polymerase, and a first multivalent molecule to a first portion of a concatemer template molecule thereby forming a first binding complex, wherein a first nucleotide unit of the first multivalent molecule binds to the first sequencing polymerase; and (b) binding a second nucleic acid primer, a second sequencing polymerase, and the first multivalent molecule to a second portion of the same concatemer template molecule thereby forming a second binding complex, wherein a second nucleotide unit of the first multivalent molecule binds to the second sequencing polymerase, wherein the first and second binding complexes which include the same multivalent molecule forms an avidity complex. In some embodiments, the first sequencing polymerase comprises any wild type or mutant polymerase described herein. In some embodiments, the second sequencing polymerase comprises any wild type or mutant polymerase described herein. The concatemer template molecule comprises tandem repeat sequences of a sequence of interest and at least one universal sequencing primer binding site. The first and second nucleic acid primers can bind to a sequencing primer binding site along the concatemer template molecule. Exemplary multivalent molecules are shown in FIGS. 2-6.

In some embodiments, in any of the methods for sequencing nucleic acid molecules, wherein the method includes binding the plurality of first complexed polymerases with the plurality of multivalent molecules to form at least one avidity complex, the method comprising the steps: (a) contacting the plurality of sequencing polymerases and the plurality of nucleic acid primers with different portions of a concatemer nucleic acid concatemer molecule to form at least first and second complexed polymerases on the same concatemer template molecule; (b) contacting a plurality of multivalent molecules to the at least first and second complexed polymerases on the same concatemer template molecule, under conditions suitable to bind a single multivalent molecule from the plurality to the first and second complexed polymerases, wherein at least a first nucleotide unit of the single multivalent molecule is bound to the first complexed polymerase which includes a first primer hybridized to a first portion of the concatemer template molecule thereby forming a first binding complex (e.g., first ternary complex), and wherein at least a second nucleotide unit of the single multivalent molecule is bound to the second complexed polymerase which includes a second primer hybridized to a second portion of the concatemer template molecule thereby forming a second binding complex (e.g., second ternary complex), wherein the contacting is conducted under a condition suitable to inhibit polymerase-catalyzed incorporation of the bound first and second nucleotide units in the first and second binding complexes, and wherein the first and second binding complexes which are bound to the same multivalent molecule forms an avidity complex; and (c) detecting the first and second binding complexes on the same concatemer template molecule, and (d) identifying the first nucleotide unit in the first binding complex thereby determining the sequence of the first portion of the concatemer template molecule, and identifying the second nucleotide unit in the second binding complex thereby determining the sequence of the second portion of the concatemer template molecule. In some embodiments, the plurality of sequencing polymerases comprise any wild type or mutant sequencing polymerase described herein. The concatemer template molecule comprises tandem repeat sequences of a sequence of interest and at least one universal sequencing primer binding site. The plurality of nucleic acid primers can bind to a sequencing primer binding site along the concatemer template molecule. Exemplary multivalent molecules are shown in FIGS. 2-6.

In some embodiments, the two-stage sequencing can employ multivalent molecules that are labeled with fluorophores and the detecting and/or identifying steps comprise use of fluorescence imaging. In some embodiments, the fluorescence imaging comprises dual wavelength excitation/four wavelength emission fluorescence imaging. In some embodiments, four different types of multivalent molecules are employed, each comprising a different nucleotide unit (or nucleotide unit analog). For example, a first type of multivalent molecules comprise dATP nucleotide units, a second type of multivalent molecules comprise dGTP nucleotide units, a third type of multivalent molecules comprise dCTP nucleotide units, and a fourth type of multivalent molecules comprise dTTP nucleotide units. In some embodiments, the four different types of multivalent molecules are labeled with a different fluorophore that corresponds to the nucleotide units attached to a given multivalent molecule to permit identification of the nucleotide units. In some embodiments, the detecting step comprises simultaneous or single excitation at a wavelength sufficient to excite all four fluorophores and imaging of fluorescence emission at wavelengths sufficient to detect each respective fluorophore. In some embodiments, the four labeled multivalent molecules are used to determine the identity of a terminal nucleotide in the nucleic acid template molecule. In some embodiments, the four types of multivalent molecules are labeled with different fluorophores, including for example fluorophores that emit different visible colors such as blue, green, yellow, orange or red. In some embodiments, the four types of multivalent molecules are labeled with different fluorophores, including for example Cy2 or a dye or fluorophore similar in excitation or emission properties, Cy3 or a dye or fluorophore similar in excitation or emission properties, Cy3.5 or a dye or fluorophore similar in excitation or emission properties, Cy5 or a dye or fluorophore similar in excitation or emission properties, Cy5.5 or a dye or fluorophore similar in excitation or emission properties, and Cy7 or a dye or fluorophore similar in excitation or emission properties. In some embodiments, the detecting step comprises simultaneous excitation at any two of 532 nm, 568 nm and 633 nm, and imaging of fluorescence emission at about 570 nm, 592 nm, 670 nm, and 702 nm, respectively. In some embodiments, the fluorescence imaging comprises dual wavelength excitation/dual wavelength emission fluorescence imaging. In some embodiments, the four different types of multivalent molecules are labeled with distinguishable fluorophores (or a set of fluorophores), and the detecting step comprises simultaneous or single excitation at a wavelength sufficient to excite one, two, three, or four fluorophores or sets of fluorophores, and imaging of fluorescence emission at wavelengths is sufficient to detect each respective fluorophore.

In some embodiments, the two-stage sequencing methods can be conducted with three different types of labeled multivalent molecules and one type of unlabeled multivalent molecule (e.g., a "dark" multivalent molecule), where the labeled multivalent molecules are labeled with a different fluorophore that corresponds to the nucleotide units attached to a given multivalent molecule to permit identification of the nucleotide units. In some embodiments, the detecting step comprises simultaneous excitation at a wavelength sufficient to excite the three types of fluorophores and imaging of fluorescence emission at wavelengths is sufficient to detect each respective fluorophore, and detection of the fourth type of multivalent molecule is determined or determinable with reference to the location of "dark" or unlabeled spots.

In some embodiments, the fluorophores comprise a FRET donor and accepter pair, such that multiple detections and identifications can be performed under a single excitation and imaging step. In some embodiments, a sequencing cycle comprises forming a plurality of complexed polymerases, contacting the complexed polymerases with a plurality of different types of fluorescently-labeled multivalent molecules, and detecting the fluorescently-labeled multivalent molecules that are bound to the complexed polymerases. In some embodiments, a sequencing cycle can be conducted in less than 30 minutes, in less than 20 minutes, or in less than 10 minutes. In some embodiments, conducting sequencing reactions with labeled multivalent molecules gives an average Q-score for base calling accuracy over a sequencing run which is greater than or equal to 30, and/or greater than or equal to 40. In some embodiments, at least 50%, at least 60%, at least 70%, at least 80%, or at least 90% of the base calls have a Q-score of greater than 30 and/or greater than or equal to 40. In some embodiments, the present disclosure provides the method, herein at least 95% of the base calls have a Q-score of greater than 30.

Sequencing-by-Binding Methods

In some aspects, the present disclosure provides methods for sequencing any of the immobilized concatemer molecules described herein, wherein the sequencing methods comprise a sequencing-by-binding (SBB) procedure which employs non-labeled chain-terminating nucleotides. In some embodiments, the sequencing-by-binding (SBB) method comprises the steps of (a) sequentially contacting a primed template nucleic acid with at least two separate mixtures under ternary complex stabilizing conditions, wherein the at least two separate mixtures each include a polymerase and a nucleotide, whereby the sequentially contacting results in the primed template nucleic acid being contacted, under the ternary complex stabilizing conditions, with nucleotide cognates for first, second and third base type base types in the template; (b) examining the at least two separate mixtures to determine whether a ternary complex formed; and (c) identifying the next correct nucleotide for the primed template nucleic acid molecule, wherein the next correct nucleotide is identified as a cognate of the first, second or third base type if ternary complex is detected in step (b), and wherein the next correct nucleotide is imputed to be a nucleotide cognate of a fourth base type based on the absence of a ternary complex in step (b); (d) adding a next correct nucleotide to the primer of the primed template nucleic acid after step (b), thereby producing an extended primer; and (e) repeating steps (a) through (d) at least once on the primed template nucleic acid that comprises the extended primer. Exemplary sequencing-by-binding methods are described in U.S. Pat.

Nos. 10,246,744 and 10,731,141 (where the contents of both patents are hereby incorporated by reference in their entireties).

Methods for Sequencing Using Phosphate-Chain Labeled Nucleotides

The present disclosure provides methods for sequencing any of the immobilized concatemer molecules described herein, wherein the sequencing methods comprise sequencing with phosphate-chain labeled nucleotides, comprising step (a): contacting (i) a plurality of sequencing polymerases, (ii) a plurality of concatemer template molecules immobilized to a support and (iii) a plurality of nucleic acid sequencing primers (e.g., forward or reverse sequencing primers), where the contacting is conducted under a condition suitable to form a plurality of complexed sequencing polymerases each complex comprising a sequencing polymerase bound to a nucleic acid duplex wherein the nucleic acid duplex comprises a portion of a concatemer template molecule hybridized to a nucleic acid sequencing primer. In some embodiments, the sequencing polymerases comprise a recombinant mutant sequencing polymerase that can bind and incorporate nucleotide analogs. In some embodiments, the sequencing polymerases are immobilized to the same support as the concatemers. In some embodiments, the sequencing polymerases are not immobilized to the a support. In some embodiments, the sequencing primers comprise 3' extendible ends or 3' blocked end that can be converted into a 3' extendible end.

In some embodiments, the methods for sequencing concatemer template molecules further comprise step (b): contacting the plurality of complexed sequencing polymerases with a plurality of phosphate chain-labeled nucleotides under a condition suitable for binding at least one phosphate chain-labeled nucleotide to one of the complexed sequencing polymerases, and the condition is suitable for promoting polymerase-catalyzed nucleotide incorporation. In some embodiments, the complexed sequencing polymerase is contacted with the plurality of nucleotides in the presence of at least one catalytic cation comprising magnesium and/or manganese. In some embodiments, individual phosphate chain-labeled nucleotides in the plurality comprise an aromatic base, a five carbon sugar (e.g., ribose or deoxyribose), and phosphate chain comprising 3-20 (e.g., about 3, 4, 5, 6, 7, 8, 9, 10, 11, 12, 13, 14, 15, 16, 17, 18, 19, or 20 phosphate groups) phosphate groups, where the terminal phosphate group is linked to a detectable reporter moiety (e.g., a fluorophore). The first, second and third phosphate groups can be referred to as alpha, beta, and gamma phosphate groups. In some embodiments, a particular detectable reporter moiety which is attached to the terminal phosphate group corresponds to the nucleotide base (e.g., dATP, dGTP, dCTP, dTTP or dUTP) to permit detection and identification of the nucleo-base. In some embodiments, the sequencing polymerases are capable of binding a complementary phosphate chain labeled nucleotide and incorporating the complementary nucleotide opposite a nucleotide in a template molecule. In some embodiments, the polymerase-catalyzed nucleotide incorporation reaction cleaves between the alpha and beta phosphate groups thereby releasing a multi-phosphate chain linked to the detectable reporter moiety. In some embodiments, the plurality of phosphate chain-labeled nucleotides comprises one type or a mixture of any two or more types of nucleotides comprising dATP, dGTP, dCTP, dTTP and/or dUTP.

In some embodiments, the sequencing method further comprises step (c): detecting the fluorescent signal emitted by the phosphate chain labeled nucleotide that is bound by the sequencing polymerase, and incorporated into the terminal end of the sequencing primer. In some embodiments, step (c) further comprises identifying the phosphate chain labeled nucleotide that is bound by the sequencing polymerase, and incorporated into the terminal end of the sequencing primer.

In some embodiments, the sequencing method further comprises step (d): repeating steps (b)-(c) at least once. In some embodiments, sequencing methods that employ phosphate chain labeled nucleotides can be conducted according to the methods described in U.S. Pat. Nos. 7,170,050; 7,302,146; and/or 7,405,281.

In some embodiments, in step (a), the plurality of concatemer template molecules are immobilized to a support which comprises a plurality of separate compartments. In some embodiments, the plurality of sequencing polymerases are in solution in a compartment. In some embodiments, at least one sequencing polymerase is immobilized to the bottom of individual compartments. In some embodiments, the separate compartments comprise a silica bottom through which light can penetrate. In some embodiments, the separate compartments comprise a silica bottom configured with a nanophotonic confinement structure comprising a hole in a metal cladding film (e.g., aluminum cladding film). In some embodiments, the hole in the metal cladding has a small aperture, for example, approximately 70 nm. In some embodiments, the height of the nanophotonic confinement structure is approximately 100 nm. In some embodiments, the nanophotonic confinement structure comprises a zero mode waveguide (ZMW). In some embodiments, the nanophotonic confinement structure contains a liquid.

In some embodiments, the covalently closed circular library molecule (600) can serve as a non-immobilized template molecule. In some embodiments, the sequencing methods comprise step (a): providing a support having a plurality of sequencing polymerases immobilized thereon. In some embodiments, the sequencing polymerase comprises a processive DNA polymerase. In some embodiments, the sequencing polymerase comprises a wild type or mutant DNA polymerase, including for example a Phi29 DNA polymerase. In some embodiments, the support comprise a plurality of separate compartments and a sequencing polymerase is immobilized to the bottom of a compartment. In some embodiments, the separate compartments comprise a silica bottom through which light can penetrate. In some embodiments, the separate compartments comprise a silica bottom configured with a nanophotonic confinement structure comprising a hole in a metal cladding film (e.g., aluminum cladding film). In some embodiments, the hole in the metal cladding has a small aperture, for example, approximately 70 nm. In some embodiments, the height of the nanophotonic confinement structure is approximately 100 nm. In some embodiments, the nanophotonic confinement structure comprises a zero mode waveguide (ZMW). In some embodiments, the nanophotonic confinement structure contains a liquid.

In some embodiments, the sequencing method further comprises step (b): contacting the plurality of immobilized sequencing polymerases with a plurality of single stranded circular nucleic acid template molecules (e.g., covalently closed circular library molecules (600)) and a plurality of oligonucleotide sequencing primers, under a condition suitable for individual immobilized sequencing polymerases to bind a single stranded circular template molecule, and suitable for individual sequencing primers to hybridize to individual single stranded circular template molecules, thereby generating a plurality of polymerase/template/ primer complexes. In some embodiments, the individual sequencing primers hybridize to a universal sequencing primer binding site on the single stranded circular template molecule.

In some embodiments, the sequencing method further comprises step (c): contacting the plurality of polymerase/template/primer complexes with a plurality of phosphate chain labeled nucleotides each comprising an aromatic base, a five carbon sugar (e.g., ribose or deoxyribose), and phosphate chain comprising 3-20 phosphate groups, where the terminal phosphate group is linked to a detectable reporter moiety (e.g., a fluorophore). The first, second and third phosphate groups can be referred to as alpha, beta and gamma phosphate groups. In some embodiments, a particular detectable reporter moiety which is attached to the terminal phosphate group corresponds to the nucleotide base (e.g., dATP, dGTP, dCTP, dTTP or dUTP) to permit detection and identification of the nucleo-base. In some embodiments, the plurality of polymerase/template/primer complexes are contacted with the plurality of phosphate chain labeled nucleotides under a condition suitable for polymerase-catalyzed nucleotide incorporation. In some embodiments, the sequencing polymerases are capable of binding a complementary phosphate chain labeled nucleotide and incorporating the complementary nucleotide opposite a nucleotide in a template molecule. In some embodiments, the polymerase-catalyzed nucleotide incorporation reaction cleaves between the alpha and beta phosphate groups thereby releasing a multi-phosphate chain linked to a fluorophore.

In some embodiments, the sequencing method further comprises step (d): detecting the fluorescent signal emitted by the phosphate chain labeled nucleotide that is bound by the sequencing polymerase, and incorporated into the terminal end of the sequencing primer. In some embodiments, step (d) further comprises identifying the phosphate chain labeled nucleotide that is bound by the sequencing polymerase, and incorporated into the terminal end of the sequencing primer.

In some embodiments, the sequencing method further comprises step (d): repeating steps (c)-(d) at least once. In some embodiments, sequencing methods that employ phosphate chain labeled nucleotides can be conducted according to the methods described in U.S. Pat. Nos. 7,170,050; 7,302,146; and/or 7,405,281.

Sequencing Polymerases

In any of the methods described herein, sequencing polymerases can be used for conducting sequencing reactions. In some embodiments, the sequencing polymerase(s) is/are capable of binding and incorporating a complementary nucleotide opposite a nucleotide in a concatemer template molecule. In some embodiments, the sequencing polymerase(s) is/are capable of binding a complementary nucleotide unit of a multivalent molecule opposite a nucleotide in a concatemer template molecule. In some embodiments, the plurality of sequencing polymerases comprise recombinant mutant polymerases.

Examples of suitable polymerases for use in sequencing with nucleotides and/or multivalent molecules include but are not limited to: Klenow DNA polymerase; *Thermus aquaticus* DNA polymerase I (Taq polymerase); KlenTaq polymerase; Candidatus altiarchaeales archaeon; Candidatus Hadarchaeum Yellowstonense; Hadesarchaea archaeon; Euryarchaeota archaeon; Thermoplasmata archaeon; *Thermococcus* polymerases such as *Thermococcus litoralis*, bacteriophage T7 DNA polymerase; human alpha, delta and epsilon DNA polymerases; bacteriophage polymerases such as T4, RB69 and phi29 bacteriophage DNA polymerases; *Pyrococcus furiosus* DNA polymerase (Pfu polymerase); *Bacillus subtilis* DNA polymerase III; *E. coli* DNA polymerase III alpha and epsilon; 9 degree N polymerase; reverse transcriptases such as HIV type M or O reverse transcriptases; avian myeloblastosis virus reverse transcriptase; Moloney Murine Leukemia Virus (MMLV) reverse transcriptase; or telomerase. Further non-limiting examples of DNA polymerases include those from various Archaea genera, such as, *Aeropyrum, Archaeglobus, Desulfurococcus, Pyrobaculum, Pyrococcus, Pyrolobus, Pyrodictium, Staphylothermus, Stetteria, Sulfolobus, Thermococcus,* and *Vulcanisaeta* and the like or variants thereof, including such polymerases as are known in the art such as 9 degrees N, VENT, DEEP VENT, THERMINATOR, Pfu, KOD, Pfx, Tgo and RB69 polymerases.

Nucleotides and Chain-Terminating Nucleotides

In any of the methods described herein, any of the sequencing methods described herein can employ at least one nucleotide. The nucleotides comprise a base, sugar and at least one phosphate group. In some embodiments, at least one nucleotide in the plurality comprises an aromatic base, a five carbon sugar (e.g., ribose or deoxyribose), and one or more phosphate groups (e.g., 1-10 phosphate groups). The plurality of nucleotides can comprise at least one type of nucleotide selected from the group consisting of dATP, dGTP, dCTP, dTTP and dUTP. The plurality of nucleotides can comprise at a mixture of any combination of two or more types of nucleotides selected from the group consisting of dATP, dGTP, dCTP, dTTP and/or dUTP. In some embodiments, at least one nucleotide in the plurality is not a nucleotide analog. In some embodiments, at least one nucleotide in the plurality comprises a nucleotide analog.

In some embodiments, in any of the methods for sequencing described herein, at least one nucleotide in the plurality of nucleotides comprise a chain of one, two or three phosphorus atoms where the chain is typically attached to the 5' carbon of the sugar moiety via an ester or phosphoramide linkage. In some embodiments, at least one nucleotide in the plurality is an analog having a phosphorus chain in which the phosphorus atoms are linked together with intervening O, S, NH, methylene or ethylene. In some embodiments, the phosphorus atoms in the chain include substituted side groups including O, S or $BH_3$. In some embodiments, the chain includes phosphate groups substituted with analogs including phosphoramidate, phosphorothioate, phosphordithioate, and O-methylphosphoroamidite groups.

In some embodiments, in any of the methods for sequencing described herein, at least one nucleotide in the plurality of nucleotides comprises a terminator nucleotide analog having a chain terminating moiety (e.g., blocking moiety) at the sugar 2' position, at the sugar 3' position, or at the sugar 2' and 3' position. In some embodiments, the chain terminating moiety can inhibit polymerase-catalyzed incorporation of a subsequent nucleotide unit or free nucleotide in a nascent strand during a primer extension reaction. In some embodiments, the chain terminating moiety is attached to the 3' sugar hydroxyl position where the sugar comprises a ribose or deoxyribose sugar moiety. In some embodiments, the chain terminating moiety is removable/cleavable from the 3' sugar hydroxyl position to generate a nucleotide having a 3'OH sugar group which is extendible with a subsequent nucleotide in a polymerase-catalyzed nucleotide incorporation reaction. In some embodiments, the chain terminating moiety comprises an alkyl group, alkenyl group, alkynyl group, allyl group, aryl group, benzyl group, azide group, amine group, amide group, keto group, isocyanate group, phosphate group, thio group, disulfide group, carbonate group, urea group, acetal group or silyl group. In some embodiments, the chain terminating moiety is cleavable/removable from the nucleotide, for example by reacting the chain terminating moiety with a chemical agent, pH change, light or heat. In some embodiments, the chain terminating moieties alkyl, alkenyl, alkynyl and allyl are cleavable with tetrakis(triphenylphosphine)palladium(0) (Pd(PPh$_3$)$_4$) with piperidine, or with 2,3-Dichloro-5,6-dicyano-1,4-benzo-quinone (DDQ). In some embodiments, the chain terminating moieties aryl and benzyl are cleavable with H2 Pd/C. In some embodiments, the chain terminating moieties amine, amide, keto, isocyanate, phosphate, thio, disulfide are cleavable with phosphine or with a thiol group including beta-mercaptoethanol or dithiothritol (DTT). In some embodiments, the chain terminating moiety carbonate is cleavable with potassium carbonate (K$_2$CO$_3$) in MeOH, with triethylamine in pyridine, or with Zn in acetic acid (AcOH). In some embodiments, the chain terminating moieties urea and silyl are cleavable with tetrabutylammonium fluoride, pyridine-HF, with ammonium fluoride, or with triethylamine trihydrofluoride.

In some embodiments, in any of the methods for sequencing described herein, at least one nucleotide in the plurality of nucleotides comprises a terminator nucleotide analog having a chain terminating moiety (e.g., blocking moiety) at the sugar 2' position, at the sugar 3' position, or at the sugar 2' and 3' position. In some embodiments, the chain terminating moiety comprises an azide, azido or azidomethyl group. In some embodiments, the chain terminating moiety comprises a 3'-O-azido or 3'-O-azidomethyl group. In some embodiments, the chain terminating moieties azide, azido and azidomethyl group are cleavable/removable with a phosphine compound. In some embodiments, the phosphine compound comprises a derivatized tri-alkyl phosphine moiety or a derivatized tri-aryl phosphine moiety. In some embodiments, the phosphine compound comprises Tris(2-carboxyethyl)phosphine (TCEP) or bis-sulfo triphenyl phosphine (BS-TPP) or Tri(hydroxyproyl)phosphine (THPP). In some embodiments, the cleaving agent comprises 4-dimethylaminopyridine (4-DMAP).

In some embodiments, in any of the methods for sequencing described herein, the nucleotide comprises a chain terminating moiety which is selected from a group consisting of 3'-deoxy nucleotides, 2',3'-dideoxynucleotides, 3'-methyl, 3'-azido, 3'-azidomethyl, 3'-O-azidoalkyl, 3'-O-ethynyl, 3'-O-aminoalkyl, 3'-O-fluoroalkyl, 3'-fluoromethyl, 3'-difluoromethyl, 3'-trifluoromethyl, 3'-sulfonyl, 3'-malonyl, 3'-amino, 3'-O-amino, 3'-sulfhydral, 3'-aminomethyl, 3'-ethyl, 3'butyl, 3'-tert butyl, 3'-Fluorenylmethyloxycarbonyl, 3' tert-Butyloxycarbonyl, 3'-O-alkyl hydroxylamino group, 3'-phosphorothioate, and 3-O-benzyl, or derivatives thereof.

In some embodiments, in any of the methods for sequencing described herein, the plurality of nucleotides comprises a plurality of nucleotides labeled with detectable reporter moiety. The detectable reporter moiety comprises a fluorophore. In some embodiments, the fluorophore is attached to the nucleotide base. In some embodiments, the fluorophore is attached to the nucleotide base with a linker which is cleavable/removable from the base. In some embodiments, at least one of the nucleotides in the plurality is not labeled with a detectable reporter moiety. In some embodiments, a particular detectable reporter moiety (e.g., fluorophore) that is attached to the nucleotide can correspond to the nucleotide base (e.g., dATP, dGTP, dCTP, dTTP or dUTP) to permit detection and identification of the nucleotide base.

In some embodiments, in any of the methods for sequencing nucleic acid molecules described herein, the cleavable linker on the nucleotide base comprises a cleavable moiety comprising an alkyl group, alkenyl group, alkynyl group, allyl group, aryl group, benzyl group, azide group, amine group, amide group, keto group, isocyanate group, phosphate group, thio group, disulfide group, carbonate group, urea group, acetal group or silyl group. In some embodiments, the cleavable linker on the base is cleavable/removable from the base by reacting the cleavable moiety with a chemical agent, pH change, light or heat. In some embodiments, the cleavable moieties alkyl, alkenyl, alkynyl and allyl are cleavable with tetrakis(triphenylphosphine)palladium(0) (Pd(PPh$_3$)$_4$) with piperidine, or with 2,3-Dichloro-5,6-dicyano-1,4-benzo-quinone (DDQ). In some embodiments, the cleavable moieties aryl and benzyl are cleavable with H2 Pd/C. In some embodiments, the cleavable moieties amine, amide, keto, isocyanate, phosphate, thio, disulfide are cleavable with phosphine or with a thiol group including beta-mercaptoethanol or dithiothritol (DTT). In some embodiments, the cleavable moiety carbonate is cleavable with potassium carbonate (K$_2$CO$_3$) in MeOH, with triethylamine in pyridine, or with Zn in acetic acid (AcOH). In some embodiments, the cleavable moieties urea and silyl are cleavable with tetrabutylammonium fluoride, pyridine-HF, with ammonium fluoride, or with triethylamine trihydrofluoride.

In some embodiments, in any of the methods for sequencing described herein, the cleavable linker on the nucleotide base comprises cleavable moiety including an azide, azido or azidomethyl group. In some embodiments, the cleavable moieties azide, azido and azidomethyl group are cleavable/removable with a phosphine compound. In some embodiments, the phosphine compound comprises a derivatized tri-alkyl phosphine moiety or a derivatized tri-aryl phosphine moiety. In some embodiments, the phosphine compound comprises Tris(2-carboxyethyl)phosphine (TCEP) or bis-sulfo triphenyl phosphine (BS-TPP) or Tri(hydroxyproyl)phosphine (THPP). In some embodiments, the cleaving agent comprises 4-dimethylaminopyridine (4-DMAP).

In some embodiments, in any of the methods for sequencing described herein, the chain terminating moiety (e.g., at the sugar 2' and/or sugar 3' position) and the cleavable linker on the nucleotide base have the same or different cleavable moieties. In some embodiments, the chain terminating moiety (e.g., at the sugar 2' and/or sugar 3' position) and the detectable reporter moiety linked to the base are chemically cleavable/removable with the same chemical agent. In some embodiments, the chain terminating moiety (e.g., at the sugar 2' and/or sugar 3' position) and the detectable reporter moiety linked to the base are chemically cleavable/removable with different chemical agents.

Multivalent Molecules

Figure 2:
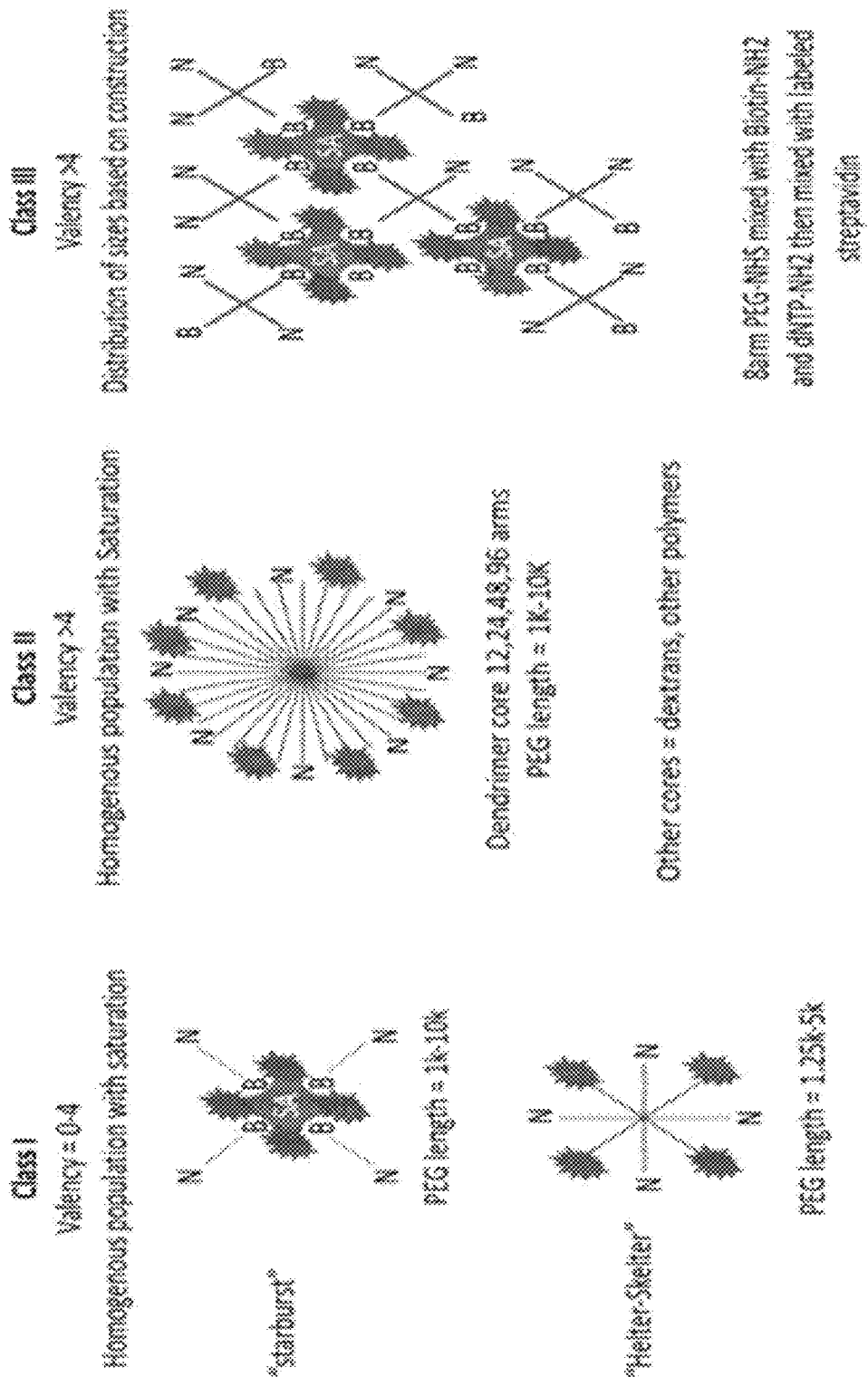
FIG. 2 is a schematic of various exemplary configurations of multivalent molecules. Left (Class I): schematics of multivalent molecules having a "starburst" or "helter-skelter" configuration. Center (Class II): a schematic of a multivalent molecule having a dendrimer configuration. Right (Class III): a schematic of multiple multivalent molecules formed by reacting streptavidin with 4-arm or 8-arm PEG-NHS with biotin and dNTPs. Nucleotide units are designated 'N', biotin is designated 'B', and streptavidin is designated 'SA'.
Figure 3:
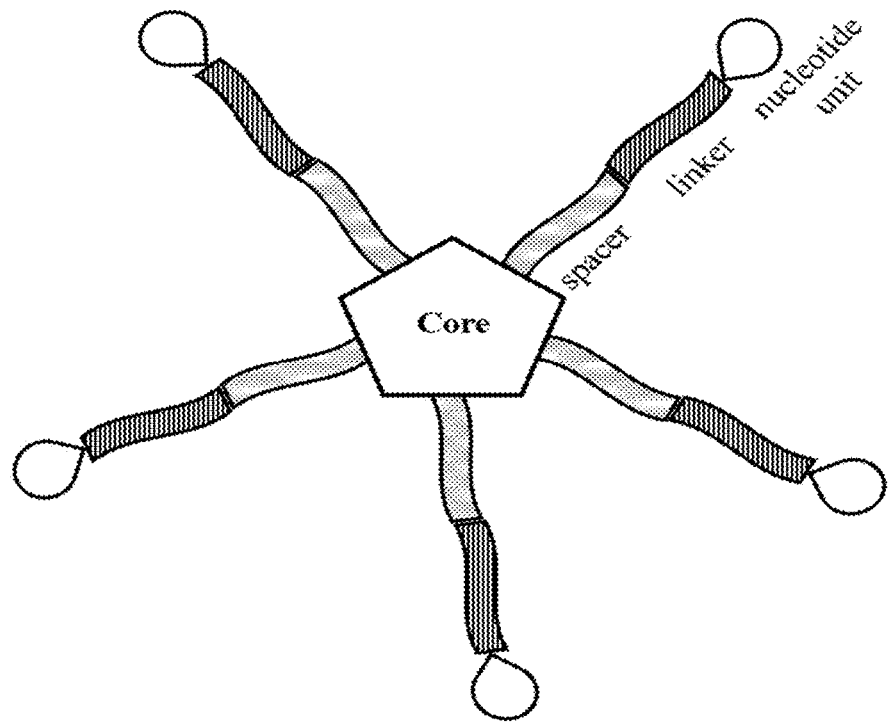
FIG. 3 is a schematic of an exemplary multivalent molecule comprising a generic core attached to a plurality of nucleotide-arms.
Figure 4:
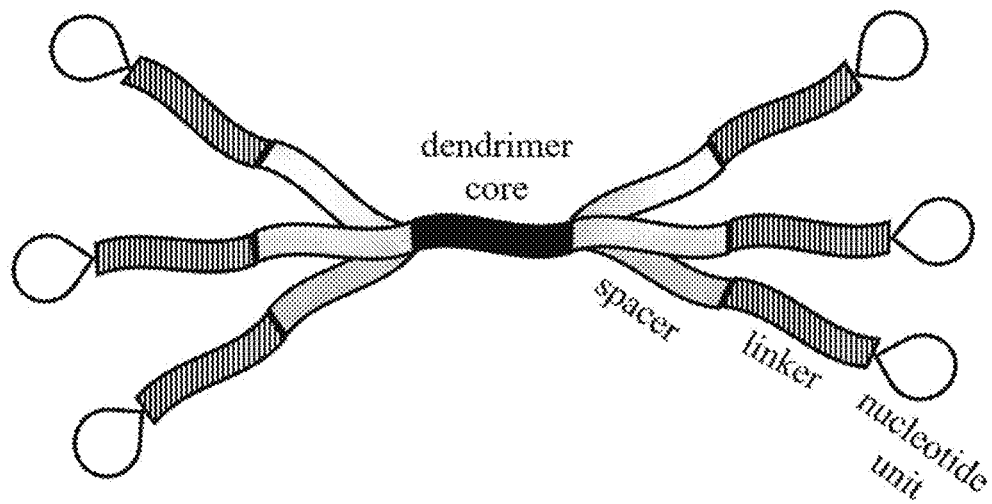
FIG. 4 is a schematic of an exemplary multivalent molecule comprising a dendrimer core attached to a plurality of nucleotide-arms.
Figure 5:
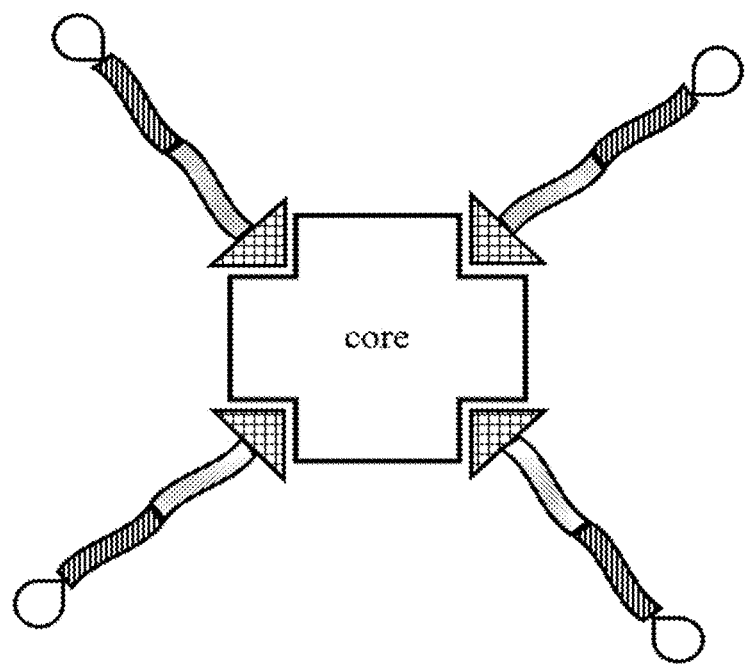
FIG. 5 shows a schematic of an exemplary multivalent molecule comprising a core attached to a plurality of nucleotide-arms, where the nucleotide arms comprise biotin, spacer, linker and a nucleotide unit.
Figure 6:
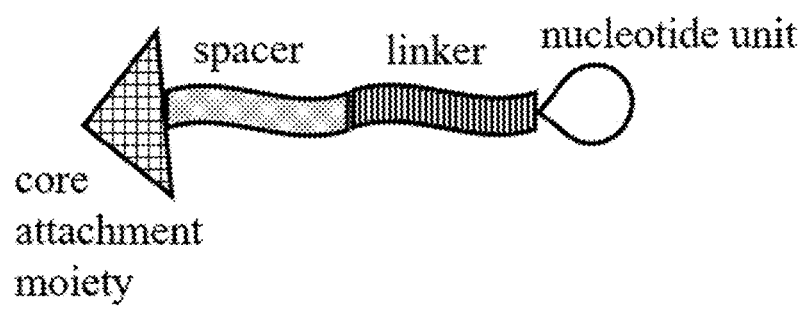
FIG. 6 is a schematic of an exemplary nucleotide-arm comprising a core attachment moiety, spacer, linker and nucleotide unit.
Figure 7:
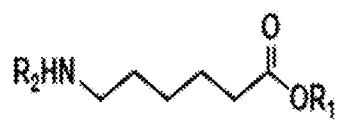
FIG. 7 shows the chemical structure of an exemplary spacer (TOP), and the chemical structures of various exemplary linkers, including an 11-atom Linker, 16-atom Linker, 23-atom Linker and an N3 Linker (BOTTOM).
Figure 7:
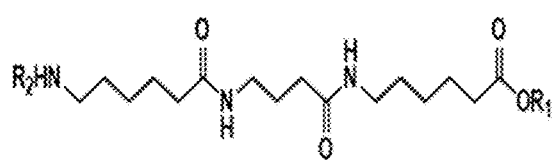
Figure 7:
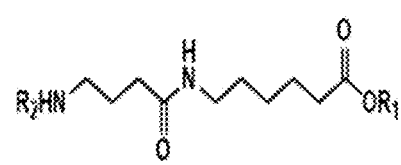
Figure 7:
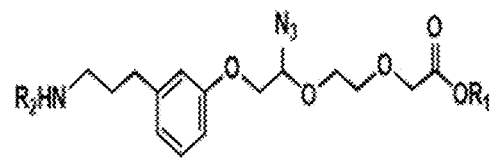
Figure 8:
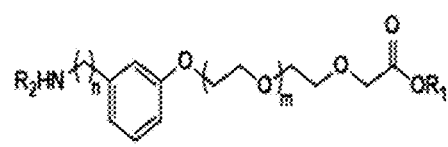
FIG. 8 shows the chemical structures of various exemplary linkers, including Linkers 1-9.
Figure 8:
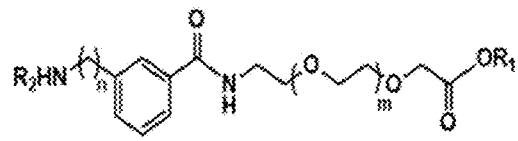
Figure 8:
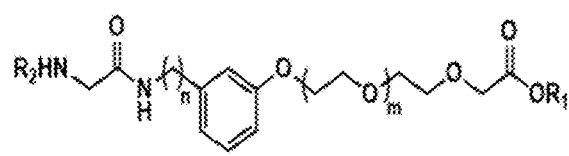
Figure 8:
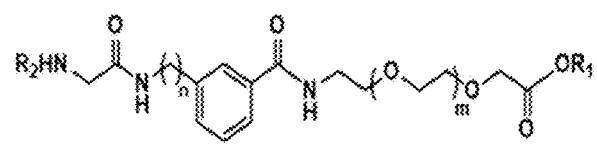
Figure 8:
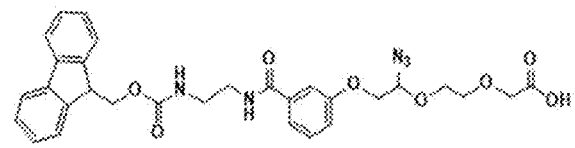
Figure 8:
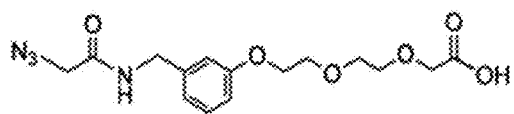
Figure 8:
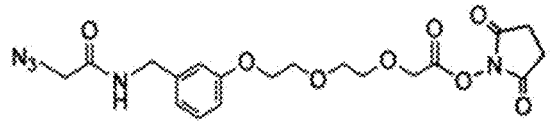
Figure 8:
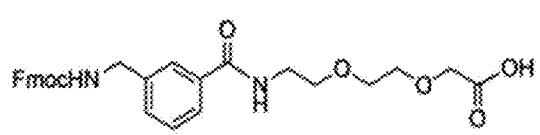
Figure 8:
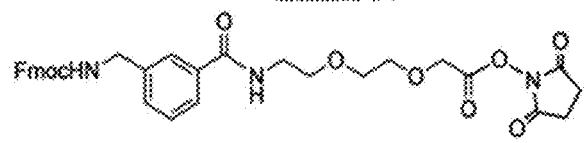
Figure 9A:
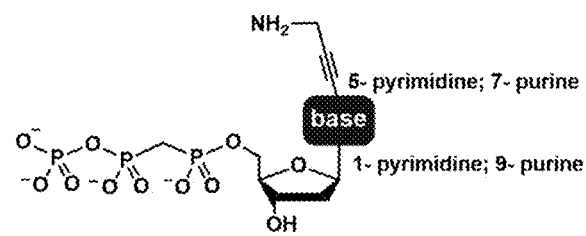
FIG. 9A-9D show the chemical structures of various exemplary linkers joined/attached to nucleotide units.
Figure 9A:
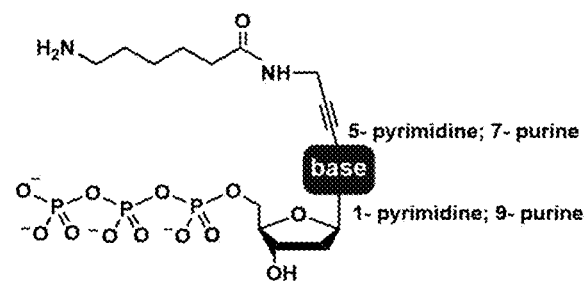
Figure 9A:
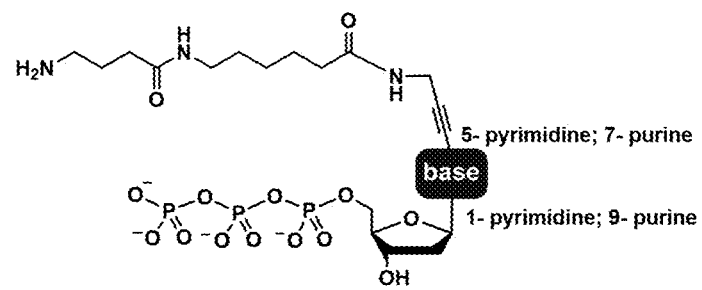
Figure 9B:
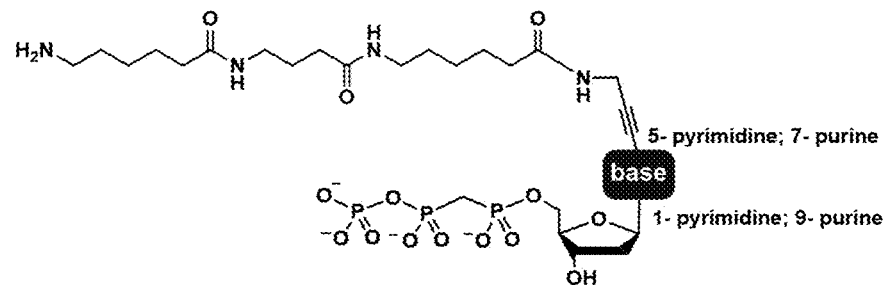
Figure 9B:
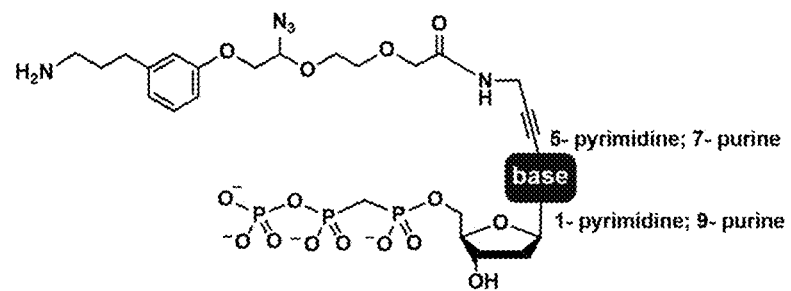
Figure 9B:
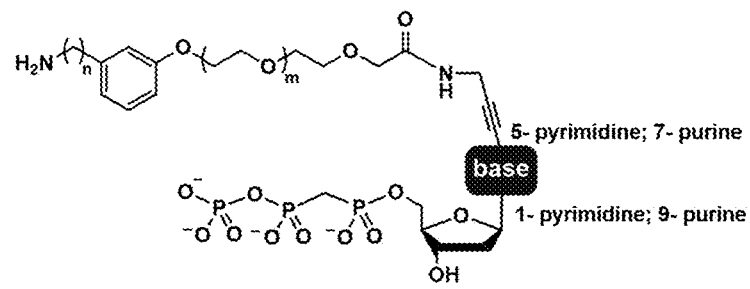
Figure 9C:
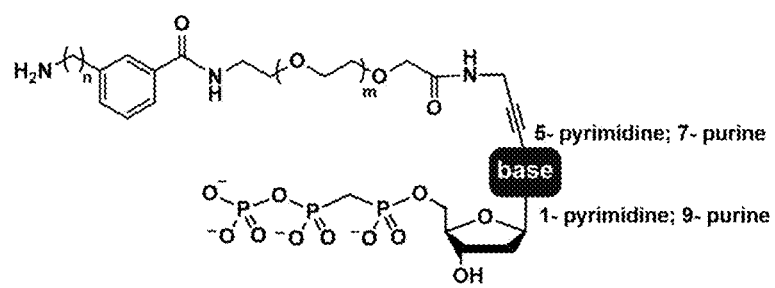
Figure 9C:
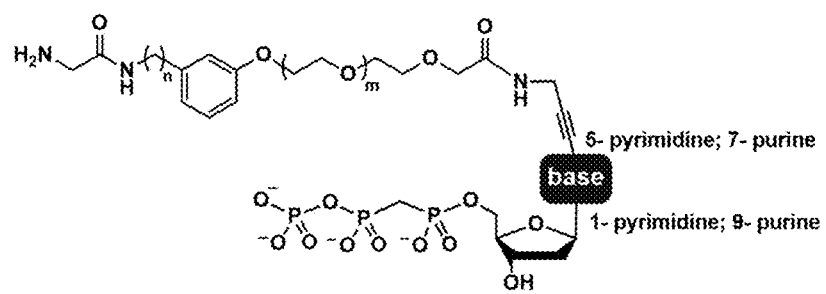
Figure 9D:
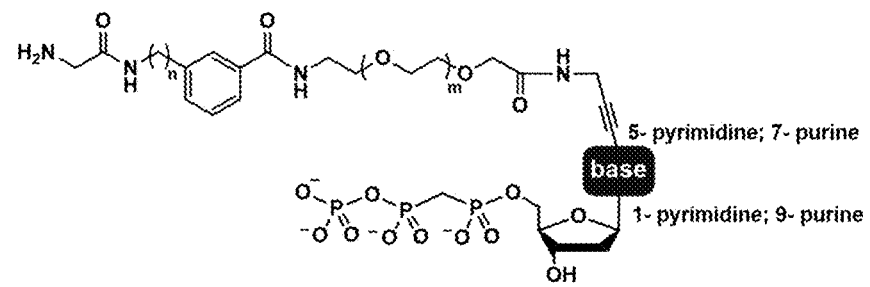
Figure 9D:
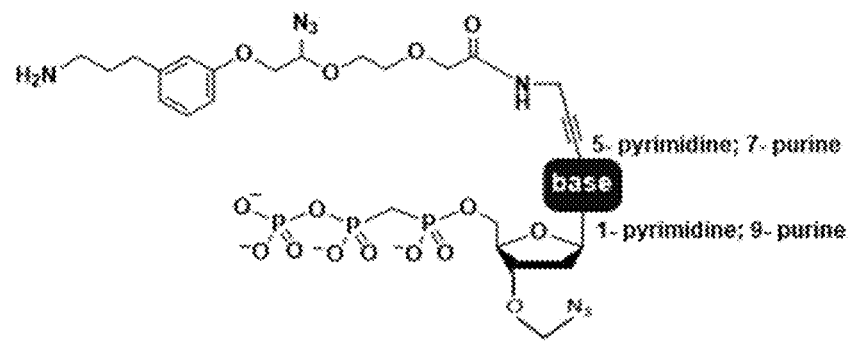
Figure 10:
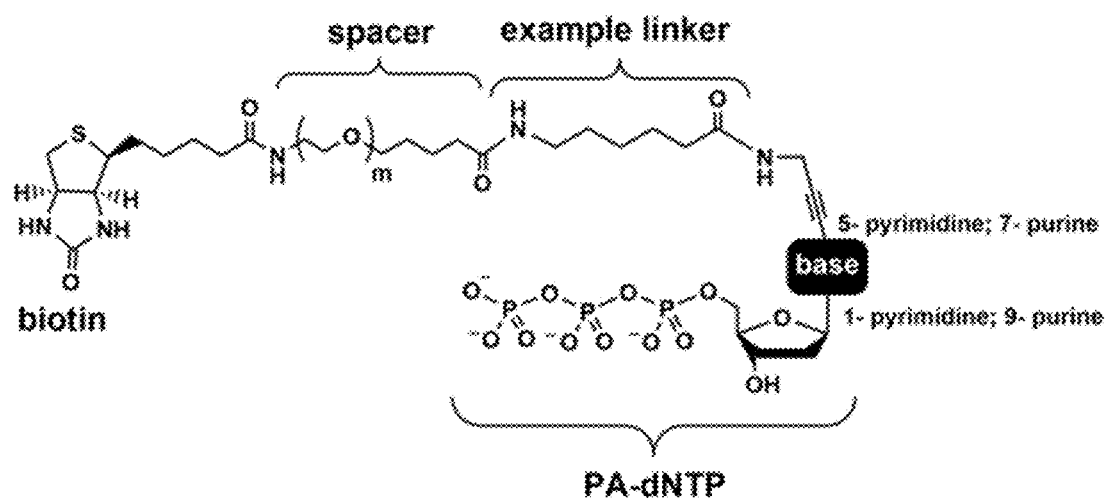
FIG. 10 shows the chemical structure of an exemplary biotinylated nucleotide-arm. In this example, the nucleotide unit is connected to the linker via a propargyl amine attachment at the 5 position of a pyrimidine base or the 7 position of a purine base.

In any of the methods described herein, the sequencing employs at least one multivalent molecule which comprises a plurality of nucleotide arms attached to a core and having any configuration including a starburst, helter skelter, or bottle brush configuration (e.g., FIG. 2). In some embodiments, the multivalent molecule comprises: (1) a core; and (2) a plurality of nucleotide arms which comprise (i) a core attachment moiety, (ii) a spacer comprising a PEG moiety, (iii) a linker, and (iv) a nucleotide unit, wherein the core is attached to the plurality of nucleotide arms, wherein the spacer is attached to the linker, wherein the linker is attached to the nucleotide unit. In some embodiments, the nucleotide unit comprises a base, sugar and at least one phosphate group, and the linker is attached to the nucleotide unit through the base. In some embodiments, the linker comprises an aliphatic chain or an oligo ethylene glycol chain where both linker chains having 2-6 subunits. In some embodiments, the linker also includes an aromatic moiety. An exemplary nucleotide arm is shown in FIG. 6. Exemplary multivalent molecules are shown in FIGS. 2-5. An exemplary spacer is shown in FIG. 7 (top) and exemplary linkers are shown in FIG. 7 (bottom) and FIG. 8. Exemplary nucleotides attached to a linker are shown in FIGS. 9A-9D. An exemplary biotinylated nucleotide arm is shown in FIG. 10.

In some embodiments, a multivalent molecule comprises a core attached to multiple nucleotide arms, and wherein the multiple nucleotide arms have the same type of nucleotide unit which is selected from a group consisting of dATP, dGTP, dCTP, dTTP and dUTP.

In some embodiments, a multivalent molecule comprises a core attached to multiple nucleotide arms, where each arm includes a nucleotide unit. The nucleotide unit comprises an aromatic base, a five carbon sugar (e.g., ribose or deoxyribose), and one or more phosphate groups (e.g., 1-10 phosphate groups). The plurality of multivalent molecules can comprise one type multivalent molecule having one type of nucleotide unit selected from the group consisting of dATP, dGTP, dCTP, dTTP and dUTP. The plurality of multivalent molecules can comprise at a mixture of any combination of two or more types of multivalent molecules, where individual multivalent molecules in the mixture comprise nucleotide units selected from the group consisting of dATP, dGTP, dCTP, dTTP and/or dUTP.

In some embodiments, the nucleotide unit comprises a chain of one, two or three phosphorus atoms where the chain is typically attached to the 5' carbon of the sugar moiety via an ester or phosphoramide linkage. In some embodiments, at least one nucleotide unit is a nucleotide analog having a phosphorus chain in which the phosphorus atoms are linked together with intervening O, S, NH, methylene or ethylene. In some embodiments, the phosphorus atoms in the chain include substituted side groups including O, S or $BH_3$. In some embodiments, the chain includes phosphate groups substituted with analogs including phosphoramidate, phosphorothioate, phosphordithioate, and O-methylphosphoroamidite groups.

In some embodiments, the multivalent molecule comprises a core attached to multiple nucleotide arms, and wherein individual nucleotide arms comprise a nucleotide unit which is a nucleotide analog having a chain terminating moiety (e.g., blocking moiety) at the sugar 2' position, at the sugar 3' position, or at the sugar 2' and 3' position. In some embodiments, the nucleotide unit comprises a chain terminating moiety (e.g., blocking moiety) at the sugar 2' position, at the sugar 3' position, or at the sugar 2' and 3' position. In some embodiments, the chain terminating moiety can inhibit polymerase-catalyzed incorporation of a subsequent nucleotide unit or free nucleotide in a nascent strand during a primer extension reaction. In some embodiments, the chain terminating moiety is attached to the 3' sugar hydroxyl position where the sugar comprises a ribose or deoxyribose sugar moiety. In some embodiments, the chain terminating moiety is removable/cleavable from the 3' sugar hydroxyl position to generate a nucleotide having a 3'OH sugar group which is extendible with a subsequent nucleotide in a polymerase-catalyzed nucleotide incorporation reaction. In some embodiments, the chain terminating moiety comprises an alkyl group, alkenyl group, alkynyl group, allyl group, aryl group, benzyl group, azide group, amine group, amide group, keto group, isocyanate group, phosphate group, thio group, disulfide group, carbonate group, urea group, acetal group or silyl group. In some embodiments, the chain terminating moiety is cleavable/removable from the nucleotide unit, for example by reacting the chain terminating moiety with a chemical agent, pH change, light or heat. In some embodiments, the chain terminating moieties alkyl, alkenyl, alkynyl and allyl are cleavable with tetrakis(triphenylphosphine)palladium(0) $(Pd(PPh_3)_4)$ with piperidine, or with 2,3-Dichloro-5,6-dicyano-1,4-benzo-quinone (DDQ). In some embodiments, the chain terminating moieties aryl and benzyl are cleavable with H2 Pd/C. In some embodiments, the chain terminating moieties amine, amide, keto, isocyanate, phosphate, thio, disulfide are cleavable with phosphine or with a thiol group including beta-mercaptoethanol or dithiothritol (DTT). In some embodiments, the chain terminating moiety carbonate is cleavable with potassium carbonate $(K_2CO_3)$ in MeOH, with triethylamine in pyridine, or with Zn in acetic acid (AcOH). In some embodiments, the chain terminating moieties urea and silyl are cleavable with tetrabutylammonium fluoride, pyridine-HF, with ammonium fluoride, or with triethylamine trihydrofluoride.

In some embodiments, the nucleotide unit comprises a chain terminating moiety (e.g., blocking moiety) at the sugar 2' position, at the sugar 3' position, or at the sugar 2' and 3' position. In some embodiments, the chain terminating moiety comprises an azide, azido or azidomethyl group. In some embodiments, the chain terminating moiety comprises a 3'-O-azido or 3'-O-azidomethyl group. In some embodiments, the chain terminating moieties azide, azido and azidomethyl group are cleavable/removable with a phosphine compound. In some embodiments, the phosphine compound comprises a derivatized tri-alkyl phosphine moiety or a derivatized tri-aryl phosphine moiety. In some embodiments, the phosphine compound comprises Tris(2-carboxyethyl)phosphine (TCEP) or bis-sulfo triphenyl phosphine (BS-TPP) or Tri(hydroxyproyl)phosphine (THPP). In some embodiments, the cleaving agent comprises 4-dimethylaminopyridine (4-DMAP).

In some embodiments, the nucleotide unit comprising a chain terminating moiety which is selected from the group consisting of 3'-deoxy nucleotides, 2',3'-dideoxynucleotides, 3'-methyl, 3'-azido, 3'-azidomethyl, 3'-O-azidoalkyl, 3'-O-ethynyl, 3'-O-aminoalkyl, 3'-O-fluoroalkyl, 3'-fluoromethyl, 3'-difluoromethyl, 3'-trifluoromethyl, 3'-sulfonyl, 3'-malonyl, 3'-amino, 3'-O-amino, 3'-sulfhydral, 3'-aminomethyl, 3'-ethyl, 3'butyl, 3 '-tert butyl, 3'-Fluorenylmethyloxycarbonyl, 3' tert-Butyloxycarbonyl, 3'-O-alkyl hydroxylamino group, 3'-phosphorothioate, and 3-O-benzyl, or derivatives thereof.

In some embodiments, the multivalent molecule comprises a core attached to multiple nucleotide arms, wherein the nucleotide arms comprise a spacer, linker and nucleotide unit, and wherein the core, linker and/or nucleotide unit is labeled with detectable reporter moiety. In some embodiments, the detectable reporter moiety comprises a fluorophore. In some embodiments, a particular detectable reporter moiety (e.g., fluorophore) that is attached to the multivalent molecule can correspond to the base (e.g., dATP, dGTP, dCTP, dTTP or dUTP) of the nucleotide unit to permit detection and identification of the nucleotide base.

In some embodiments, at least one nucleotide arm of a multivalent molecule has a nucleotide unit that is attached to a detectable reporter moiety. In some embodiments, the detectable reporter moiety is attached to the nucleotide base. In some embodiments, the detectable reporter moiety comprises a fluorophore. In some embodiments, a particular detectable reporter moiety (e.g., fluorophore) that is attached to the multivalent molecule can correspond to the base (e.g., dATP, dGTP, dCTP, dTTP or dUTP) of the nucleotide unit to permit detection and identification of the nucleotide base.

In some embodiments, the core of a multivalent molecule comprises an avidin-like or streptavidin-like moiety and the core attachment moiety comprises biotin. In some embodiments, the core comprises an streptavidin-type or avidin-type moiety which includes an avidin protein, as well as any derivatives, analogs and other non-native forms of avidin that can bind to at least one biotin moiety. Other forms of avidin moieties include native and recombinant avidin and streptavidin as well as derivatized molecules, e.g. non-glycosylated avidin and truncated streptavidins. For example, an avidin moiety may includes de-glycosylated forms of avidin, bacterial streptavidin produced by *Streptomyces* (e.g., *Streptomyces avidinii*), as well as derivatized forms, for example, N-acyl avidins, e.g., N-acetyl, N-phthalyl and N-succinyl avidin, and the commercially-available products EXTRAVIDIN™, CAPTAVIDIN™, NEUTRAVIDIN™ and NEUTRALITE AVIDIN™.

In some embodiments, any of the methods for sequencing nucleic acid molecules described herein can include forming a binding complex, where the binding complex comprises (i) a polymerase, a nucleic acid concatemer molecule duplexed with a primer, and a nucleotide, or the binding complex comprises (ii) a polymerase, a nucleic acid concatemer molecule duplexed with a primer, and a nucleotide unit of a multivalent molecule. In some embodiments, the binding complex has a persistence time of greater than about 0.1, 0.2, 0.3, 0.4, 0.5, 0.6, 0.7, 0.8, 0.9 or 1 second. The binding complex has a persistence time of greater than about 0.1-0.25 seconds, or about 0.25-0.5 seconds, or about 0.5-0.75 seconds, or about 0.75-1 second, or about 1-2 seconds, or about 2-3 seconds, or about 3-4 second, or about 4-5 seconds, and/or wherein the method is or may be carried out at a temperature of at or above 15° C., at or above 20° C., at or above 25° C., at or above 35° C., at or above 37° C., at or above 42° C. at or above 55° C. at or above 60° C., or at or above 72° C., or at or above 80° C., or within a range defined by any of the foregoing. The binding complex (e.g., ternary complex) remains stable until subjected to a condition that causes dissociation of interactions between any of the polymerase, template molecule, primer and/or the nucleotide unit or the nucleotide. For example, a dissociating condition comprises contacting the binding complex with any one or any combination of a detergent, EDTA and/or water. In some embodiments, the present disclosure provides said method wherein the binding complex is deposited on, attached to, or hybridized to, a surface showing a contrast to noise ratio in the detecting step of greater than 20. In some embodiments, the present disclosure provides said method wherein the contacting is performed under a condition that stabilizes the binding complex when the nucleotide or nucleotide unit is complementary to a next base of the template nucleic acid, and destabilizes the binding complex when the nucleotide or nucleotide unit is not complementary to the next base of the template nucleic acid.

Automated Mode

In any of the methods described herein, any combination of the steps for preparing spatially resolved nucleic acids can be performed in an automated mode using the fluid dispensing system, including cell seeding, cell fixation, cell permeabilization, reverse transcription reactions, circularization oligonucleotide hybridization, circularization oligonucleotide ligation reaction, rolling circle amplification, and sequencing.

In some embodiments, the cellular sample is deposited on the flowcell (e.g., support). The flowcell can be coated with a reagent that promotes cell adhesion or sticking to the flowcell. The flowcell, having a cell sample adhered thereon, can be placed onto a sequencing apparatus having a flowcell holder/cradle which is fluidically connected to an automated fluid dispensing system and configured on a fluorescent microscope. In some embodiments, the sequencing apparatus can be configured with at least one fluidic delivery device, at least one fluidics device (e.g., microfluidics device), at least one imaging device and/or at least one sensor to detect signals from the sequencing reactions.

In some embodiments, the automated fluid dispensing system can be used to deliver fixation reagents to the cellular sample on the flowcell, and the cellular sample can be incubated under conditions suitable for cell fixation.

In some embodiments, the automated fluid dispensing system can be used to deliver permeabilization reagents to the fixed cellular sample on the flowcell, and the cellular sample can be incubated under conditions suitable for cell permeabilization.

In some embodiments, the automated fluid dispensing system can be used to deliver reagents for conducting reverse transcription of RNA on the flowcell under a condition suitable for generating a plurality of cDNA immobilized to the flowcell.

In some embodiments, the automated fluid dispensing system can be used to deliver reagents for conducting circularization oligonucleotide hybridization and ligation under a condition suitable for generating a plurality of covalently closed circular molecules on the flowcell.

In some embodiments, the automated fluid dispensing system can be used to deliver reagents for conducting rolling circle amplification under a condition suitable for generating a plurality of concatemer molecules immobilized to the flowcell.

In some embodiments, the automated fluid dispensing system can be used to deliver sequencing reagents for conducting sequencing cycles of the concatemer molecules under a condition suitable for generating a plurality of sequencing read products on the flowcell. In some embodiments, individual cycle times can be achieved in less than 30 minutes. In some embodiments, the field of view (FOV) can exceed 1 mm$^2$ and the cycle time for scanning large area (>10 mm$^2$) can be less than 5 minutes.

In some embodiments, the automated fluid dispensing system can be used to deliver reagents for removing the plurality of sequencing read products from the concatemer molecules and retaining the concatemer molecules on the flowcell.

Supports and Low Non-Specific Coatings

In some aspects, the present disclosure provides pairwise sequencing compositions and methods which employ a support comprising a plurality of oligonucleotide surface primers immobilized thereon. In some embodiments, the support is passivated with a low non-specific binding coating. In some embodiments, the surface coatings described herein exhibit very low non-specific binding to reagents typically used for nucleic acid capture, amplification and sequencing workflows, such as dyes, nucleotides, enzymes, and nucleic acid primers. The surface coatings can exhibit low background fluorescence signals or high contrast-to-noise (CNR) ratios compared to conventional surface coatings.

In some embodiments, the low non-specific binding coating comprises one layer or multiple layers (FIG. 1). In some embodiments, the plurality of surface primers are immobilized to the low non-specific binding coating. In some embodiments, at least one surface primer is embedded within the low non-specific binding coating. In some embodiments, the low non-specific binding coating enables improved nucleic acid hybridization and amplification performance. In some embodiments, the supports comprise a substrate (or support structure), one or more layers of a covalently or non-covalently attached low-binding, chemical modification layers, e.g., silane layers, polymer films, and one or more covalently or non-covalently attached surface primers that can be used for tethering single-stranded nucleic acid library molecules to the support. In some embodiments, the formulation of the coating, e.g., the chemical composition of one or more layers, the coupling chemistry used to cross-link the one or more layers to the support and/or to each other, and the total number of layers, may be varied such that non-specific binding of proteins, nucleic acid molecules, and other hybridization and amplification reaction components to the coating is minimized or reduced relative to a comparable monolayer. The formulation of the coating described herein may be varied such that non-specific hybridization on the coating is minimized or reduced relative to a comparable monolayer. The formulation of the coating may be varied such that non-specific amplification on the coating is minimized or reduced relative to a comparable monolayer. The formulation of the coating may be varied such that specific amplification rates and/or yields on the coating are maximized. Amplification levels suitable for detection are achieved in no more than 2, 3, 4, 5, 6, 7, 8, 9, 10, 15, 20, 25, 30, or more than 30 amplification cycles in some cases disclosed herein.

The support structure that comprises the one or more chemically-modified layers, e.g., layers of a low non-specific binding polymer, may be independent or integrated into another structure or assembly. For example, in some embodiments, the support structure may comprise one or more surfaces within an integrated or assembled microfluidic flow cell. The support structure may comprise one or more surfaces within a microplate format, e.g., the bottom surface of the wells in a microplate. In some embodiments, the support structure comprises the interior surface (such as the lumen surface) of a capillary. In some embodiments, the support structure comprises the interior surface (such as the lumen surface) of a capillary etched into a planar chip.

The attachment chemistry used to graft a first chemically-modified layer to the surface of the support will generally be dependent on both the material from which the surface is fabricated and the chemical nature of the layer. In some embodiments, the first layer may be covalently attached to the surface. In some embodiments, the first layer may be non-covalently attached, e.g., adsorbed to the support through non-covalent interactions such as electrostatic interactions, hydrogen bonding, or van der Waals interactions between the support and the molecular components of the first layer. In either case, the support may be treated prior to attachment or deposition of the first layer. Any of a variety of surface preparation techniques known to those of skill in the art may be used to clean or treat the surface. For example, glass or silicon surfaces may be acid-washed using a Piranha solution (a mixture of sulfuric acid ($H_2SO_4$) and hydrogen peroxide ($H_2O_2$)), base treatment in KOH and NaOH, and/or cleaned using an oxygen plasma treatment method.

Silane chemistries constitute non-limiting approaches for covalently modifying the silanol groups on glass or silicon surfaces to attach more reactive functional groups (e.g., amines or carboxyl groups), which may then be used in coupling linker molecules (e.g., linear hydrocarbon molecules of various lengths, such as C6, C12, C18 hydrocarbons, or linear polyethylene glycol (PEG) molecules) or layer molecules (e.g., branched PEG molecules or other polymers) to the surface. Examples of suitable silanes that may be used in creating any of the disclosed low binding coatings include, but are not limited to, (3-Aminopropyl) trimethoxysilane (APTMS), (3-Aminopropyl) triethoxysilane (APTES), any of a variety of PEG-silanes (e.g., comprising molecular weights of 1K, 2K, 5K, 10K, 20K, etc.), amino-PEG silane (i.e., comprising a free amino functional group), maleimide-PEG silane, biotin-PEG silane, and the like.

Any of a variety of molecules known to those of skill in the art including, but not limited to, amino acids, peptides, nucleotides, oligonucleotides, other monomers or polymers, or combinations thereof may be used in creating the one or more chemically-modified layers on the support, where the choice of components used may be varied to alter one or more properties of the layers, e.g., the surface density of functional groups and/or tethered oligonucleotide primers, the hydrophilicity/hydrophobicity of the layers, or the three three-dimensional nature (i.e., "thickness") of the layer. Examples of polymers that may be used to create one or more layers of low non-specific binding material in any of the disclosed coatings include, but are not limited to, polyethylene glycol (PEG) of various molecular weights and branching structures, streptavidin, polyacrylamide, polyester, dextran, poly-lysine, and poly-lysine copolymers, or any combination thereof. Examples of conjugation chemistries that may be used to graft one or more layers of material (e.g. polymer layers) to the surface and/or to cross-link the layers to each other include, but are not limited to, biotin-streptavidin interactions (or variations thereof), his tag—Ni/NTA conjugation chemistries, methoxy ether conjugation chemistries, carboxylate conjugation chemistries, amine conjugation chemistries, NHS esters, maleimides, thiol, epoxy, azide, hydrazide, alkyne, isocyanate, and silane.

The low non-specific binding surface coating may be applied uniformly across the support. Alternatively, the surface coating may be patterned, such that the chemical modification layers are confined to one or more discrete regions of the support. For example, the coating may be patterned using photolithographic techniques to create an ordered array or random pattern of chemically-modified regions on the support. Alternately or in combination, the coating may be patterned using, e.g., contact printing and/or ink-jet printing techniques. In some embodiments, an ordered array or random pattern of chemically-modified regions may comprise at least 1, 5, 10, 20, 30, 40, 50, 60, 70, 80, 90, 100, 200, 300, 400, 500, 600, 700, 800, 900, 1000, 2000, 3000, 4000, 5000, 6000, 7000, 8000, 9000, or 10,000 or more discrete regions.

In some embodiments, the low nonspecific binding coatings comprise hydrophilic polymers that are non-specifically adsorbed or covalently grafted to the support. Typically, passivation is performed utilizing poly(ethylene glycol) (PEG, also known as polyethylene oxide (PEO) or polyoxyethylene) or other hydrophilic polymers with different molecular weights and end groups that are linked to a support using, for example, silane chemistry. The end groups distal from the surface can include, but are not limited to, biotin, methoxy ether, carboxylate, amine, NHS ester, maleimide, and bis-silane. In some embodiments, two or more layers of a hydrophilic polymer, e.g., a linear polymer, branched polymer, or multi-branched polymer, may be deposited on the surface. In some embodiments, two or more layers may be covalently coupled to each other or internally cross-linked to improve the stability of the resulting coating. In some embodiments, surface primers with different nucleotide sequences and/or base modifications (or other biomolecules, e.g., enzymes or antibodies) may be tethered to the resulting layer at various surface densities. In some embodiments, for example, both surface functional group density and surface primer concentration may be varied to attain a desired surface primer density range. Additionally, surface primer density can be controlled by diluting the surface primers with other molecules that carry the same functional group. For example, and without limitation, amine-labeled surface primers can be diluted with amine-labeled polyethylene glycol in a reaction with an NETS-ester coated surface to reduce the final primer density. Surface primers with different lengths of linker between the hybridization region and the surface attachment functional group can also be applied to control surface density. Example of suitable linkers include poly-T and poly-A strands at the 5' end of the primer (e.g., 0 to 20 bases, e.g., 0, 1, 2, 3, 4, 5, 6, 7, 8, 9, 10, 11, 12, 13, 14, 15, 16, 17, 18, 19, or 20), PEG linkers (e.g., 3 to 20 monomer units, e.g., about 3, 4, 5, 6, 7, 8, 9, 10, 11, 12, 13, 14, 15, 16, 17, 18, 19, or 20 monomer units), and carbon-chain (e.g., C6, C12, C18, etc.). To measure the primer density, fluorescently-labeled primers may be tethered to the surface and a fluorescence reading then compared with that for a dye solution of known concentration.

In some embodiments, the low nonspecific binding coatings comprise a functionalized polymer coating layer covalently bound at least to a portion of the support via a chemical group on the support, a primer grafted to the functionalized polymer coating, and a water-soluble protective coating on the primer and the functionalized polymer coating. In some embodiments, the functionalized polymer coating comprises a poly(N-(5-azidoacetamidylpentyl)acrylamide-co-acrylamide (PAZAM).

In order to scale primer surface density and add additional dimensionality to hydrophilic or amphoteric coatings, supports comprising multi-layer coatings of PEG and other hydrophilic polymers have been developed. By using hydrophilic and amphoteric surface layering approaches that include, but are not limited to, the polymer/co-polymer materials described below, it is possible to increase primer loading density on the support significantly. Traditional PEG coating approaches use monolayer primer deposition, which have been generally reported for single molecule applications, but do not yield high copy numbers for nucleic acid amplification applications. As described herein "layering" can be accomplished using traditional crosslinking approaches with any compatible polymer or monomer subunits such that a surface comprising two or more highly crosslinked layers can be built sequentially. Examples of suitable polymers include, but are not limited to, streptavidin, poly acrylamide, polyester, dextran, poly-lysine, and copolymers of poly-lysine and PEG. In some embodiments, the different layers may be attached to each other through any of a variety of conjugation reactions including, but not limited to, biotin-streptavidin binding, azide-alkyne click reaction, amine-NETS ester reaction, thiol-maleimide reaction, and ionic interactions between positively charged polymer and negatively charged polymer. In some embodiments, high primer density materials may be constructed in solution and subsequently layered onto the surface in multiple steps.

Examples of materials from which the support structure may be fabricated include, but are not limited to, glass, fused-silica, silicon, a polymer (e.g., polystyrene (PS), macroporous polystyrene (MPPS), polymethylmethacrylate (PMMA), polycarbonate (PC), polypropylene (PP), polyethylene (PE), high density polyethylene (HDPE), cyclic olefin polymers (COP), cyclic olefin copolymers (COC), polyethylene terephthalate (PET)), or any combination thereof. Various compositions of both glass and plastic support structures are contemplated.

The support structure may be rendered in any of a variety of geometries and dimensions known to those of skill in the art, and may comprise any of a variety of materials known to those of skill in the art. For example, the support structure may be locally planar (e.g., comprising a microscope slide or the surface of a microscope slide). Globally, the support structure may be cylindrical (e.g., comprising a capillary or the interior surface of a capillary), spherical (e.g., comprising the outer surface of a non-porous bead), or irregular (e.g., comprising the outer surface of an irregularly-shaped, non-porous bead or particle). In some embodiments, the surface of the support structure used for nucleic acid hybridization and amplification may be a solid, non-porous surface. In some embodiments, the surface of the support structure used for nucleic acid hybridization and amplification may be porous, such that the coatings described herein penetrate the porous surface, and nucleic acid hybridization and amplification reactions performed thereon may occur within the pores.

The support structure that comprises the one or more chemically-modified layers, e.g., layers of a low non-specific binding polymer, may be independent or integrated into another structure or assembly. For example, the support structure may comprise one or more surfaces within an integrated or assembled microfluidic flow cell. The support structure may comprise one or more surfaces within a microplate format, e.g., the bottom surface of the wells in a microplate. In some embodiments, the support structure comprises the interior surface (such as the lumen surface) of a capillary. In some embodiments the support structure comprises the interior surface (such as the lumen surface) of a capillary etched into a planar chip.

As described herein, the low non-specific binding supports of the present disclosure exhibit reduced non-specific binding of proteins, nucleic acids, and other components of the hybridization and/or amplification formulation used for solid-phase nucleic acid amplification. The degree of non-specific binding exhibited by a given support surface may be assessed either qualitatively or quantitatively. For example, exposure of the surface to fluorescent dyes (e.g., cyanins such as Cy3, or Cy5, etc., fluoresceins, coumarins, rhodamines, etc. or other dyes disclosed herein), fluorescently-labeled nucleotides, fluorescently-labeled oligonucleotides, and/or fluorescently-labeled proteins (e.g. polymerases) under a standardized set of conditions, followed by a specified rinse protocol and fluorescence imaging may be used as a qualitative tool for comparison of non-specific binding on supports comprising different surface formulations. In some embodiments, exposure of the surface to fluorescent dyes, fluorescently-labeled nucleotides, fluorescently-labeled oligonucleotides, and/or fluorescently-labeled proteins (e.g. polymerases) under a standardized set of conditions, followed by a specified rinse protocol and fluorescence imaging may be used as a quantitative tool for comparison of non-specific binding on supports comprising different surface formulations-provided that care has been taken to ensure that the fluorescence imaging is performed under conditions where fluorescence signal is linearly related (or related in a predictable manner) to the number of fluorophores on the support surface (e.g., under conditions where signal saturation and/or self-quenching of the fluorophore is not an issue) and suitable calibration standards are used. In some embodiments, other techniques known to those of skill in the art, for example, radioisotope labeling and counting methods may be used for quantitative assessment of the degree to which non-specific binding is exhibited by the different support surface formulations of the present disclosure.

Some surfaces disclosed herein exhibit a ratio of specific to nonspecific binding of a fluorophore such as Cy3 of at least 2, 3, 4, 5, 6, 7, 8, 9, 10, 11, 12, 13, 14, 15, 16, 17, 18, 19, 20, 25, 30, 35, 40, 50, 75, 100, or greater than 100, or any intermediate value spanned by the range herein. Some surfaces disclosed herein exhibit a ratio of specific to nonspecific fluorescence of a fluorophore such as Cy3 of at least 2, 3, 4, 5, 6, 7, 8, 9, 10, 11, 12, 13, 14, 15, 16, 17, 18, 19, 20, 25, 30, 35, 40, 50, 75, 100, or greater than 100, or any intermediate value spanned by the range herein.

In some embodiments, the degree of non-specific binding exhibited by the disclosed low-binding supports may be assessed using a standardized protocol for contacting the surface with a labeled protein (e.g., bovine serum albumin (BSA), streptavidin, a DNA polymerase, a reverse transcriptase, a helicase, a single-stranded binding protein (SSB), etc., or any combination thereof), a labeled nucleotide, a labeled oligonucleotide, etc., under a standardized set of incubation and rinse conditions, followed be detection of the amount of label remaining on the surface and comparison of the signal resulting therefrom to an appropriate calibration standard. In some embodiments, the label may comprise a fluorescent label. In some embodiments, the label may comprise a radioisotope. In some embodiments, the label may comprise any other detectable label known to one of skill in the art. In some embodiments, the degree of non-specific binding exhibited by a given support surface formulation may thus be assessed in terms of the number of non-specifically bound protein molecules (or nucleic acid molecules or other molecules) per unit area. In some embodiments, the low-binding supports of the present disclosure may exhibit non-specific protein binding (or non-specific binding of other specified molecules, (e.g., cyanins such as Cy3, or Cy5, etc., fluoresceins, coumarins, rhodamines, etc. or other dyes disclosed herein)) of less than 0.001 molecule per $\mu m^2$, less than 0.01 molecule per $\mu m^2$, less than 0.1 molecule per $\mu m^2$, less than 0.25 molecule per $\mu m^2$, less than 0.5 molecule per $\mu m^2$, less than 1 molecule per $\mu m^2$, less than 10 molecules per $\mu m^2$, less than 100 molecules per $\mu m^2$, or less than 1,000 molecules per $\mu m^2$. Those of skill in the art will realize that a given support surface of the present disclosure may exhibit non-specific binding falling anywhere within this range, for example, of less than 86 molecules per $\mu m^2$. For example, some modified surfaces disclosed herein exhibit nonspecific protein binding of less than 0.5 molecule/$\mu m^2$ following contact with a 1 $\mu M$ solution of Cy3 labeled streptavidin (GE Amersham) in phosphate buffered saline (PBS) buffer for 15 minutes, followed by 3 rinses with deionized water. Some modified surfaces disclosed herein exhibit nonspecific binding of Cy3 dye molecules of less than 0.25 molecules per $\mu m^2$. In independent nonspecific binding assays, 1 $\mu M$ labeled Cy3 SA (ThermoFisher), 1 $\mu M$ Cy5 SA dye (ThermoFisher), 10 $\mu M$ Aminoallyl-dUTP-ATTO-647N (Jena Biosciences), 10 $\mu M$ Aminoallyl-dUTP-ATTO-Rhol 1 (Jena Biosciences), 10 $\mu M$ Aminoallyl-dUTP-ATTO-Rhol 1 (Jena Biosciences), 10 $\mu M$ 7-Propargylamino-7-deaza-dGTP-Cy5 (Jena Biosciences, and 10 $\mu M$ 7-Propargylamino-7-deaza-dGTP-Cy3 (Jena Biosciences) were incubated on the low binding coated supports at 37° C. for 15 minutes in a 384 well plate format. Each well was rinsed 2-3× with 50 uL deionized RNase/DNase Free water and 2-3× with 25 mM ACES buffer pH 7.4. The 384 well plates were imaged on a GE Typhoon instrument using the Cy3, AF555, or Cy5 filter sets (according to dye test performed) as specified by the manufacturer at a PMT gain setting of 800 and resolution of 50-100 µm. For higher resolution imaging, images were collected on an Olympus IX83 microscope (e.g., inverted fluorescence microscope) (Olympus Corp., Center Valley, Pa.) with a total internal reflectance fluorescence (TIRF) objective (100×, 1.5 NA, Olympus), a CCD camera (e.g., an Olympus EM-CCD monochrome camera, Olympus XM-10 monochrome camera, or an Olympus DP80 color and monochrome camera), an illumination source (e.g., an Olympus 100 W Hg lamp, an Olympus 75 W Xe lamp, or an Olympus U-HGLGPS fluorescence light source), and excitation wavelengths of 532 nm or 635 nm. Dichroic mirrors were purchased from Semrock (IDEX Health & Science, LLC, Rochester, N.Y.), e.g., 405, 488, 532, or 633 nm dichroic reflectors/beamsplitters, and band pass filters were chosen as 532 LP or 645 LP concordant with the appropriate excitation wavelength. Some modified surfaces disclosed herein exhibit nonspecific binding of dye molecules of less than 0.25 molecules per $\mu m^2$. In some embodiments, the coated support was immersed in a buffer (e.g., 25 mM ACES, pH 7.4) while the image was acquired.

In some embodiments, the surfaces disclosed herein exhibit a ratio of specific to nonspecific binding of a fluorophore such as Cy3 of at least 2, 3, 4, 5, 6, 7, 8, 9, 10, 11, 12, 13, 14, 15, 16, 17, 18, 19, 20, 25, 30, 35, 40, 50, 75, 100, or greater than 100, or any intermediate value spanned by the range herein. In some embodiments, the surfaces disclosed herein exhibit a ratio of specific to nonspecific fluorescence signals for a fluorophore such as Cy3 of at least 2, 3, 4, 5, 6, 7, 8, 9, 10, 11, 12, 13, 14, 15, 16, 17, 18, 19, 20, 25, 30, 35, 40, 50, 75, 100, or greater than 100, or any intermediate value spanned by the range herein.

The low-background surfaces consistent with the disclosure herein may exhibit specific dye attachment (e.g., Cy3 attachment) to non-specific dye adsorption (e.g., Cy3 dye adsorption) ratios of at least 4:1, 5:1, 6:1, 7:1, 8:1, 9:1, 10:1, 15:1, 20:1, 30:1, 40:1, 50:1, or more than 50 specific dye molecules attached per molecule nonspecifically adsorbed. Similarly, when subjected to an excitation energy, low-background surfaces consistent with the disclosure herein to which fluorophores, e.g., Cy3, have been attached may exhibit ratios of specific fluorescence signal (e.g., arising from Cy3-labeled oligonucleotides attached to the surface) to non-specific adsorbed dye fluorescence signals of at least 4:1, 5:1, 6:1, 7:1, 8:1, 9:1, 10:1, 15:1, 20:1, 30:1, 40:1, 50:1, or more than 50:1.

In some embodiments, the degree of hydrophilicity (or "wettability" with aqueous solutions) of the disclosed support surfaces may be assessed, for example, through the measurement of water contact angles in which a small droplet of water is placed on the surface and its angle of contact with the surface is measured using, e.g., an optical tensiometer. In some embodiments, a static contact angle may be determined. In some embodiments, an advancing or receding contact angle may be determined. In some embodiments, the water contact angle for the hydrophilic, low-binding support surfaced disclosed herein may range from about 0 degrees to about 30 degrees. In some embodiments, the water contact angle for the hydrophilic, low-binding support surfaced disclosed herein may no more than 50 degrees, 40 degrees, 30 degrees, 25 degrees, 20 degrees, 18 degrees, 16 degrees, 14 degrees, 12 degrees, 10 degrees, 8 degrees, 6 degrees, 4 degrees, 2 degrees, or 1 degree. In many cases the contact angle is no more than 40 degrees. Those of skill in the art will realize that a given hydrophilic, low-binding support surface of the present disclosure may exhibit a water contact angle having a value of anywhere within this range.

In some embodiments, the hydrophilic surfaces disclosed herein facilitate reduced wash times for bioassays, often due to reduced nonspecific binding of biomolecules to the low-binding surfaces. In some embodiments, adequate wash steps may be performed in less than 60, 50, 40, 30, 20, 15, 10, or less than 10 seconds. For example, adequate wash steps may be performed in less than 30 seconds.

Some low-binding surfaces of the present disclosure may exhibit significant improvement in stability or durability to prolonged exposure to solvents and elevated temperatures, or to repeated cycles of solvent exposure or changes in temperature. For example, the stability of the disclosed surfaces may be tested by fluorescently labeling a functional group on the surface, or a tethered biomolecule (e.g., an oligonucleotide primer) on the surface, and monitoring fluorescence signal before, during, and after prolonged exposure to solvents and elevated temperatures, or to repeated cycles of solvent exposure or changes in temperature. In some embodiments, the degree of change in the fluorescence used to assess the quality of the surface may be less than 1%, 2%, 3%, 4%, 5%, 10%, 15%, 20%, or 25% over a time period of 1 minute, 2 minutes, 3 minutes, 4 minutes, 5 minutes, 10 minutes, 20 minutes, 30 minutes, 40 minutes, 50 minutes, 60 minutes, 2 hours, 3 hours, 4 hours, 5 hours, 6 hours, 7 hours, 8 hours, 9 hours, 10 hours, 15 hours, 20 hours, 25 hours, 30 hours, 35 hours, 40 hours, 45 hours, 50 hours, or 100 hours of exposure to solvents and/or elevated temperatures (or any combination of these percentages as measured over these time periods). In some embodiments, the degree of change in the fluorescence used to assess the quality of the surface may be less than 1%, 2%, 3%, 4%, 5%, 10%, 15%, 20%, or 25% over 5 cycles, 10 cycles, 20 cycles, 30 cycles, 40 cycles, 50 cycles, 60 cycles, 70 cycles, 80 cycles, 90 cycles, 100 cycles, 200 cycles, 300 cycles, 400 cycles, 500 cycles, 600 cycles, 700 cycles, 800 cycles, 900 cycles, or 1,000 cycles of repeated exposure to solvent changes and/or changes in temperature (or any combination of these percentages as measured over this range of cycles).

In some embodiments, the surfaces disclosed herein may exhibit a high ratio of specific signal to nonspecific signal or other background. For example, when used for nucleic acid amplification, some surfaces may exhibit an amplification signal that is at least 4, 5, 6, 7, 8, 9, 10, 15, 20, 30, 40, 50, 75, 100, or greater than 100 fold greater than a signal of an adjacent unpopulated region of the surface. Similarly, some surfaces exhibit an amplification signal that is at least 4, 5, 6, 7, 8, 9, 10, 15, 20, 30, 40, 50, 75, 100, or greater than 100 fold greater than a signal of an adjacent amplified nucleic acid population region of the surface.

In some embodiments, fluorescence images of the disclosed low background surfaces when used in nucleic acid hybridization or amplification applications to create polonies of hybridized or clonally-amplified nucleic acid molecules (e.g., that have been directly or indirectly labeled with a fluorophore) exhibit contrast-to-noise ratios (CNRs) of at least 10, 20, 30, 40, 50, 60, 70, 80, 90, 100, 110, 120, 130, 140, 150, 160, 170, 180, 190, 20, 210, 220, 230, 240, 250, or greater than 250.

One or more types of primer may be attached or tethered to the support surface. In some embodiments, the one or more types of adaptors or primers may comprise spacer sequences, adaptor sequences for hybridization to adaptor-ligated target library nucleic acid sequences, forward amplification primers, reverse amplification primers, sequencing primers, and/or molecular barcoding sequences, or any combination thereof. In some embodiments, 1 primer or adaptor sequence may be tethered to at least one layer of the surface. In some embodiments, at least 2, 3, 4, 5, 6, 7, 8, 9, 10, or more than 10 different primer or adaptor sequences may be tethered to at least one layer of the surface.

In some embodiments, the tethered adaptor and/or primer sequences may range in length from about 10 nucleotides to about 100 nucleotides. In some embodiments, the tethered adaptor and/or primer sequences may be at least 10, at least 20, at least 30, at least 40, at least 50, at least 60, at least 70, at least 80, at least 90, or at least 100 nucleotides in length. In some embodiments, the tethered adaptor and/or primer sequences may be at most 100, at most 90, at most 80, at most 70, at most 60, at most 50, at most 40, at most 30, at most 20, or at most 10 nucleotides in length. Any of the lower and upper values described in this paragraph may be combined to form a range included within the present disclosure, for example, in some embodiments the length of the tethered adaptor and/or primer sequences may range from about 20 nucleotides to about 80 nucleotides. Those of skill in the art will recognize that the length of the tethered adaptor and/or primer sequences may have any value within this range, e.g., about 24 nucleotides.

In some embodiments, the resultant surface density of primers (e.g., capture primers) on the low binding support surfaces of the present disclosure may range from about 100 primer molecules per $\mu m^2$ to about 100,000 primer molecules per $\mu m^2$. In some embodiments, the resultant surface density of primers on the low binding support surfaces of the present disclosure may range from about 1,000 primer molecules per $\mu m^2$ to about 1,000,000 primer molecules per $\mu m^2$. In some embodiments, the surface density of primers may be at least 1,000, at least 10,000, at least 100,000, or at least 1,000,000 molecules per $\mu m^2$. In some embodiments, the surface density of primers may be at most 1,000,000, at most 100,000, at most 10,000, or at most 1,000 molecules per $\mu m^2$. Any of the lower and upper values described in this paragraph may be combined to form a range included within the present disclosure, for example, in some embodiments the surface density of primers may range from about 10,000 molecules per $\mu m^2$ to about 100,000 molecules per $\mu m^2$. Those of skill in the art will recognize that the surface density of primer molecules may have any value within this range, e.g., about 455,000 molecules per $\mu m^2$. In some embodiments, the surface density of target library nucleic acid sequences initially hybridized to adaptor or primer sequences on the support surface may be less than or equal to that indicated for the surface density of tethered primers. In some embodiments, the surface density of clonally-amplified target library nucleic acid sequences hybridized to adaptor or primer sequences on the support surface may span the same range as that indicated for the surface density of tethered primers.

Local densities as listed above do not preclude variation in density across a surface, such that a surface may comprise a region having an oligo density of, for example, 500,000/$\mu m^2$, while also comprising at least a second region having a substantially different local density.

In some embodiments, the performance of nucleic acid hybridization and/or amplification reactions using the disclosed reaction formulations and low-binding supports may be assessed using fluorescence imaging techniques, where the contrast-to-noise ratio (CNR) of the images provides a key metric in assessing amplification specificity and non-specific binding on the support. CNR is commonly defined as: CNR=(Signal-Background)/Noise. The background term is commonly taken to be the signal measured for the interstitial regions surrounding a particular feature (diffraction limited spot, DLS) in a specified region of interest (ROI). While signal-to-noise ratio (SNR) is often considered to be a benchmark of overall signal quality, it can be shown that improved CNR can provide a significant advantage over SNR as a benchmark for signal quality in applications that require rapid image capture (e.g., sequencing applications for which cycle times must be minimized), as shown in the example below. At high CNR the imaging time required to reach accurate discrimination (and thus accurate base-calling in the case of sequencing applications) can be drastically reduced even with moderate improvements in CNR. Improved CNR in imaging data on the imaging integration time provides a method for more accurately detecting features such as clonally-amplified nucleic acid colonies on the support surface.

In most ensemble-based sequencing approaches, the background term is typically measured as the signal associated with 'interstitial' regions. In addition to "interstitial" background ($B_{inter}$), "intrastitial" background ($B_{intra}$) exists within the region occupied by an amplified DNA colony. The combination of these two background signals dictates the achievable CNR, and subsequently directly impacts the optical instrument requirements, architecture costs, reagent costs, run-times, cost/genome, and ultimately the accuracy and data quality for cyclic array-based sequencing applications. The $B_{inter}$ background signal arises from a variety of sources; a few examples include auto-fluorescence from consumable flow cells, non-specific adsorption of detection molecules that yield spurious fluorescence signals that may obscure the signal from the ROI, the presence of non-specific DNA amplification products (e.g., those arising from primer dimers). In typical next generation sequencing (NGS) applications, this background signal in the current field-of-view (FOV) is averaged over time and subtracted. The signal arising from individual DNA colonies (i.e., (Signal)-B(interstial) in the FOV) yields a discernable feature that can be classified. In some embodiments, the intrastitial background (B(intrastitial)) can contribute a confounding fluorescence signal that is not specific to the target of interest, but is present in the same ROI thus making it far more difficult to average and subtract.

Nucleic acid amplification on the low-binding coated supports described herein may decrease the B(interstitial) background signal by reducing non-specific binding, may lead to improvements in specific nucleic acid amplification, and may lead to a decrease in non-specific amplification that can impact the background signal arising from both the interstitial and intrastitial regions. In some embodiments, the disclosed low-binding coated supports, optionally used in combination with the disclosed hybridization and/or amplification reaction formulations, may lead to improvements in CNR by a factor of 2, 5, 10, 100, 250, 500 or 1000-fold over those achieved using conventional supports and hybridization, amplification, and/or sequencing protocols. Although described here in the context of using fluorescence imaging as the read-out or detection mode, the same principles apply to the use of the disclosed low-binding coated supports and nucleic acid hybridization and amplification formulations for other detection modes as well, including both optical and non-optical detection modes.

INCORPORATION BY REFERENCE

Throughout this application various publications, patents, and/or patent applications are referenced. The disclosures of the publications, patents and/or patent applications are hereby incorporated by reference in their entireties into this application in order to more fully describe the state of the art to which this disclosure pertains.

EQUIVALENTS

The details of one or more embodiments of the disclosure are set forth in the accompanying description above. Although any methods and materials similar or equivalent to those described herein can be used in the practice or testing of the present disclosure, the preferred methods and materials are now described. Other features, objects, and advantages of the disclosure will be apparent from the description and from the claims. In the specification and the appended claims, the singular forms include plural referents unless the context clearly dictates otherwise. Unless defined otherwise, all technical and scientific terms used herein have the same meaning as commonly understood by one of ordinary skill in the art to which this disclosure belongs. All patents and publications cited in this specification are incorporated by reference.

The foregoing description has been presented only for the purposes of illustration and is not intended to limit the disclosure to the precise form disclosed, but by the claims appended hereto.

What is claimed is:

1. A method for preparing spatially resolved nucleic acids, comprising:
   a) providing a coated support comprising
   (i) a low non-specific binding coating comprising at least one hydrophilic polymer, wherein the low non-specific binding coating has a water contact angle of no more than 45 degrees, and
   (ii) a plurality of immobilized surface capture primers covalently tethered to the low non-specific binding coating wherein individual immobilized surface capture primers comprise a universal surface capture primer sequence (110), a universal binding site for a reverse sequencing primer (120), and an RNA capture sequence;
   b) positioning a cellular sample on the coated support under a condition suitable for the cellular sample to remain in a fixed position on the coated support, disrupting the cellular sample, and releasing a plurality of RNA molecules of the cellular sample under a condition that is suitable for preserving spatial location information of the RNA molecules from the cellular sample;
c) hybridizing individual RNA molecules to individual immobilized surface capture primers to generate a plurality of capture primer-RNA duplexes,
   wherein individual capture primer-RNA duplexes comprise an immobilized surface capture primer hybridized to an RNA molecule;
d) conducting a reverse transcription reaction on the coated support hereby 3' ends of the immobilized surface capture primers are extended using the NA molecules as template strands,
   thereby producing immobilized surface capture primers comprising extended 3' ends, and
generating non-template polyC tails at the extended 3' ends, thereby generating a plurality of first strand cDNA molecules comprising 3' non-template polyC tails,
   wherein the reverse transcription reaction comprises a plurality of template switching oligonucleotides;
e) conducting a primer extension reaction using the template switching oligonucleotides as template strands and extending the 3' non-template polyC tails of the plurality of first strand cDNA molecules,
   thereby generating a plurality of immobilized full length first strand cDNAs,
   wherein individual template switching oligonucleotides comprise a polyG region that is capable of hybridizing to the 3' non-template polyC tail of an individual first strand cDNA molecule, a universal binding site for a forward sequencing primer (130), and a universal binding site for a surface pinning primer (140), and wherein individual immobilized full length first strand cDNAs comprise
      the universal surface capture primer sequence (110);
      the universal binding site for the reverse sequencing primer (120);
      the RNA capture sequence;
      a cDNA insert region corresponding to an individual RNA molecule from the cellular sample;
      the non-template polyC tail;
      the universal binding site for the forward sequencing primer (130); and
      the universal binding site for the surface pinning primer (140);
f) removing the plurality of RNA molecules while retaining the plurality of immobilized full length first strand cDNAs;
g) contacting the plurality of immobilized full length first strand cDNAs with a plurality of single stranded circularization oligonucleotides under a condition suitable for hybridizing individual single stranded circularization oligonucleotides with individual immobilized full length first strand cDNAs,
   thereby forming a plurality of single stranded circular molecules with gaps,
      wherein individual single stranded circularization oligonucleotides comprise:
         (i) a sequence that is complementary to the universal binding site for the reverse sequencing primer (120),
         (ii) a sequence that is complementary to the universal surface capture primer sequence (110),
         (iii) a linker region,
         (iv) a sequence that is complementary to the universal binding site for the surface pinning primer (140),
         (v) and a sequence that is complementary to the universal binding site for the forward sequencing primer (130);
h) conducting a polymerase-catalyzed extension reaction to fill in the gaps in the single stranded circular molecules, using the polyC tail regions, the cDNA insert regions and the RNA capture sequences of the immobilized full length first strand cDNAs as template strands, thereby forming single stranded circularized molecules comprising sequences complementary to the cDNA insert regions of the immobilized full length first strand cDNAs and nicks;
i) closing the nicks by conducting an enzymatic ligation reaction to generate single stranded covalently closed circular molecules hybridized to the immobilized full length first strand cDNAs;
j) conducting a rolling circle amplification reaction,
   wherein the immobilized full length first strand cDNAs comprise terminal 3' ends are used as initiation sites and
   wherein the single stranded covalently closed circular molecules are used as template strands,
   thereby generating a plurality of immobilized nucleic acid concatemers that are spatially resolved on the coated support;
k) sequencing the plurality of immobilized nucleic acid concatemers,
   wherein sequencing the plurality of immobilized nucleic acid concatemers comprises sequencing at least a portion of the cDNA insert regions of individual immobilized nucleic acid concatemers; and
l) determining the location of individual immobilized nucleic acid concatemers on the coated support, which correspond to the spatial location of the individual RNA molecules.

2. The method of claim 1, wherein the cellular sample of step b) comprises a single cell, a plurality of cells, a tissue, an organ, an organism, or a sectioned cellular sample.

3. The method of claim 1, wherein the cellular sample of step b) comprises a fresh sample, a frozen sample, a fresh frozen sample, or a formalin-fixed paraffin-embedded sample.

4. The method of claim 1, wherein the plurality of template switching oligonucleotides of step d) comprises chimeric DNA and/or RNA oligonucleotides.

5. The method of claim 1, wherein the linker region of the single stranded circularization oligonucleotides of step g) comprise at least one sample index sequence for multiplexing, at least one unique molecular index (UMI) sequence for molecular tagging and/or at least one universal binding site for a compaction oligonucleotide.

6. The method of claim 1, wherein the rolling circle amplification reaction of step j) is conducted in the presence of a plurality of compaction oligonucleotides, wherein the plurality of compaction oligonucleotides comprise single stranded oligonucleotides each having a first region at a first distal end that hybridizes to a first portion of an individual immobilized nucleic acid concatemer and a second region at a second distal end that hybridizes to a second portion of the same individual immobilized nucleic acid concatemer, wherein the first portion of the immobilized nucleic acid concatemer and the second portion of the immobilized nucleic acid concatemer are brought in proximity, thereby causing compaction of the immobilized nucleic acid concatemer to form a DNA nanoball.

7. The method of claim 1, wherein the sequencing of step k) comprises:

a. contacting the plurality of immobilized nucleic acid concatemers with a plurality of sequencing polymerases and a plurality of nucleic acid sequencing primers, wherein the contacting is conducted under a condition suitable to form a plurality of complexed sequencing polymerases, wherein each complexed sequencing polymerase in the plurality comprises a sequencing polymerase bound to a nucleic acid duplex, and wherein the nucleic acid duplex comprises a portion of an immobilized nucleic acid concatemer hybridized to the nucleic acid sequencing primer;

b. contacting the plurality of complexed sequencing polymerases with a plurality of detectably labeled nucleotides comprising a blocking moiety at the 2' or 3' sugar position, wherein the contacting is conducted under a condition suitable for binding at least one nucleotide to at least one of the complexed sequencing polymerases, and wherein the condition is suitable for promoting polymerase-catalyzed nucleotide incorporation;

c. incorporating a nucleotide into the 3' end of a sequencing primer of at least one complexed sequencing polymerase;

d. detecting the incorporated nucleotide and identifying the incorporated nucleotide;

e. removing the blocking moiety from the incorporated nucleotide; and f. repeating steps b. to e. at least once.

8. The method of claim 1, wherein the sequencing of step k) comprises:

a. contacting the plurality of immobilized nucleic acid concatemers with a plurality of sequencing polymerases and a plurality of nucleic acid sequencing primers, wherein the contacting is conducted under a condition suitable to form a plurality of complexed sequencing polymerases, wherein each complexed sequencing polymerase in the plurality comprises a sequencing polymerase bound to a nucleic acid duplex, and wherein the nucleic acid duplex comprises a portion of an immobilized nucleic acid concatemer hybridized to the nucleic acid sequencing primer;

b. contacting the plurality of complexed sequencing polymerases with a plurality of nucleotides each comprising a detectable label attached to a phosphate moiety of a phosphate chain within each nucleotide of the plurality, wherein the contacting is conducted under a condition suitable for binding at least one nucleotide to at least one of the complexed sequencing polymerases, and wherein the condition is suitable for promoting polymerase-catalyzed nucleotide incorporation;

c. incorporating a nucleotide into the 3' end of a sequencing primer of at least one complexed sequencing polymerase;

d. detecting the incorporated nucleotide and identifying the incorporated nucleotide; and e. repeating steps b. to d. at least once.

9. The method of claim 1, wherein the sequencing of step k) comprises:

a. contacting the plurality of immobilized nucleic acid concatemers with a plurality of first polymerases and a plurality of nucleic acid sequencing primers, wherein the contacting is conducted under a condition suitable to bind the plurality of first polymerases to the plurality of immobilized nucleic acid concatemers and the plurality of nucleic acid sequencing primers, thereby forming a plurality of first complexed polymerases, wherein individual first complexed polymerases comprise a first polymerase bound to a nucleic acid duplex, wherein the nucleic acid duplex comprises an immobilized nucleic acid concatemer hybridized to a nucleic acid sequencing primer;

b. contacting the plurality of first complexed polymerases with a plurality of detectably labeled multivalent molecules to form a plurality of multivalent-binding complexes, wherein individual detectably labeled multivalent molecules in the plurality comprise a core attached to multiple nucleotide arms, and wherein each nucleotide arm is attached to a nucleotide unit, wherein the contacting is conducted under a condition suitable for binding complementary nucleotide units of individual multivalent molecules to at least two of the plurality of first complexed polymerases thereby forming a plurality of multivalent-binding complexes, and wherein the condition is suitable for inhibiting incorporation of the complementary nucleotide units into the primers of the plurality of multivalent-binding complexes;

c. detecting the plurality of multivalent-binding complexes; and d. identifying the complementary nucleotide units in the plurality of multivalent-binding complexes, thereby determining the sequence of the at least the portion of the cDNA insert regions of the individual immobilized nucleic acid concatemers.

10. The method of claim 9, wherein the sequencing of step k further comprises:

a. dissociating the plurality of multivalent-binding complexes, by removing the plurality of first sequencing polymerases and their bound multivalent molecules, and retaining the plurality of nucleic acid duplexes;

b. contacting the plurality of the retained nucleic acid duplexes of step f) with a plurality of second sequencing polymerases under a condition suitable for binding the plurality of second polymerases to the plurality of the retained nucleic acid duplexes, thereby forming a plurality of second complexed polymerases each comprising a second polymerase bound to a nucleic acid duplex; and c. contacting the plurality of second complexed polymerases with a plurality of nucleotides, wherein the contacting is conducted under a condition suitable for binding complementary nucleotides from the plurality of nucleotides to at least two of the second complexed polymerases, thereby forming a plurality of nucleotide-binding complexes, wherein the condition is suitable for promoting nucleotide incorporation of the bound complementary nucleotides into the primers of the nucleotide-binding complexes.

11. The method of claim 10, further comprising:

d. detecting the complementary nucleotides which are incorporated into the primers of the nucleotide-complexed polymerases.

12. The method of claim 10, further comprising:

d. detecting the complementary nucleotides which are incorporated into the primers of the nucleotide-complexed polymerases; and e. identifying the nucleo-bases of the complementary nucleotides which are incorporated into the primers of the nucleotide-complexed polymerases.

13. The method of claim 9, wherein the contacting the plurality of first complexed polymerases with the plurality of multivalent molecules of step b. is conducted in the presence of a non-catalytic divalent cation that inhibits polymerase-catalyzed nucleotide incorporation, wherein the non-catalytic divalent cation comprises strontium, barium or calcium.

14. The method of claim 9, wherein individual multivalent molecules in the plurality of multivalent molecules comprise: (a) a core; and (b) a plurality of nucleotide arms which comprise: (i) a core attachment moiety, (ii) a spacer, (iii) a linker, and (iv) a nucleotide unit, wherein the core is attached to the plurality of nucleotide arms via their core attachment moiety, wherein the spacer is attached to the linker, and wherein the linker is attached to the nucleotide unit.

15. The method of claim 14, wherein the plurality of nucleotide arms attached to a given core have the same type of nucleotide units, and wherein the type of nucleotide units comprises dATP, dGTP, dCTP, dTTP or dUTP.

16. The method of claim 9, wherein the plurality of multivalent molecules comprises one type of a multivalent molecule, wherein individual multivalent molecules in the plurality comprises i) the same type of nucleotide unit, wherein the type of nucleotide unit is selected from the group consisting of dATP, dGTP, dCTP, dTTP and dUTP; or ii) comprises a mixture of any combination of two or more types of multivalent molecules, each type having nucleotide units selected from the group consisting of dATP, dGTP, dCTP, dTTP and dUTP.

17. The method of claim 9, further comprising forming a plurality of binding complexes, comprising the steps of:
a) binding a first nucleic acid sequencing primer, a first sequencing polymerase, and a first multivalent molecule to a first portion of an immobilized nucleic acid concatemer, thereby forming a first binding complex, wherein a first nucleotide unit of the first multivalent molecule binds to the first polymerase; and
b) binding a second nucleic acid sequencing primer, a second sequencing polymerase, and the first multivalent molecule to a second portion of the same immobilized nucleic acid concatemer, thereby forming a second binding complex, wherein a second nucleotide unit of the first multivalent molecule binds to the second polymerase,
wherein the first and the second binding complexes form an avidity complex.

18. The method of claim 9, further comprising forming an avidity complex, comprising the steps of:
a) contacting the plurality of the first sequencing polymerase and the plurality of nucleic acid sequencing primers with different portions of an immobilized nucleic acid concatemer to form at least first complexed polymerase and a second complexed polymerase on the same immobilized nucleic acid concatemer; and
b) contacting a plurality of detectably labeled multivalent molecules with the at least first complexed polymerase and the second complexed polymerase on the same immobilized nucleic acid concatemer, under conditions suitable to bind a single multivalent molecule from the plurality to the first complexed polymerase and the second complexed polymerase, wherein at least a first nucleotide unit of the single multivalent molecule is bound to the first complexed polymerase, which comprises a first primer hybridized to a first portion of the immobilized nucleic acid concatemer, thereby forming a first binding complex, and wherein at least a second nucleotide unit of the single multivalent molecule is bound to the second complexed polymerase which comprises a second primer hybridized to a second portion of the immobilized nucleic acid concatemer, thereby forming a second binding complex,
wherein the contacting is conducted under a condition suitable to inhibit polymerase-catalyzed incorporation of the bound first and second nucleotide units in the first and second binding complexes, and
wherein the first and second binding complexes which are bound to the same multivalent molecule form an avidity complex;
c) detecting the first and second binding complexes on the same immobilized nucleic acid concatemer; and
d) identifying the first nucleotide unit in the first binding complex, thereby determining the sequence of the first portion of the immobilized nucleic acid concatemer, and identifying the second nucleotide unit in the second binding complex, thereby determining the sequence of the second portion of the immobilized nucleic acid concatemer.

19. The method of claim 10, wherein the contacting the plurality of second complexed polymerases with the plurality of nucleotides of step c. is conducted in the presence of a catalytic divalent cation that promotes polymerase-catalyzed nucleotide incorporation, wherein the catalytic divalent cation comprises magnesium or manganese.

20. The method of claim 10, wherein individual nucleotides in the plurality of nucleotides in step c. comprise:
i) an aromatic base, a five-carbon sugar, and 1-10 phosphate groups;
ii) one type of nucleotide selected from the group consisting of dATP, dGTP, dCTP, dTTP and dUTP, or comprise a mixture of any combination of two or more types of nucleotides selected from the group consisting of dATP, dGTP, dCTP, dTTP and dUTP;
iii) at least one of the nucleotides in the plurality of nucleotides in step c. is labeled with a fluorophore;
iv) a lack of a fluorophore label; and/or
v) at least one of the nucleotides in the plurality of nucleotides of step c. comprises a removable chain terminating moiety attached to the 3' carbon position of the sugar group, wherein the removable chain terminating moiety comprises an alkyl group, alkenyl group, alkynyl group, allyl group, aryl group, benzyl group, azide group, azido group, O-azidomethyl group, amine group, amide group, keto group, isocyanate group, phosphate group, thio group, disulfide group, carbonate group, urea group, or silyl group, and wherein the removable chain terminating moiety is cleavable with a chemical compound to generate an extendible 3'OH moiety on the sugar group.

* * * * *